US012777768B2

(12) United States Patent
Saito et al.

(10) Patent No.: US 12,777,768 B2
(45) Date of Patent: Oct. 27, 2026

(54) PHOTOELECTRIC CONVERSION DEVICE AND IMAGING MACHINE

(71) Applicants: SONY SEMICONDUCTOR SOLUTIONS CORPORATION, Kanagawa (JP); SONY GROUP CORPORATION, Tokyo (JP)

(72) Inventors: Yosuke Saito, Kanagawa (JP); Yushiro Nakagome, Kanagawa (JP); Masato Kanno, Tokyo (JP)

(73) Assignees: SONY SEMICONDUCTOR SOLUTIONS CORPORATION, Kanagawa (JP); SONY GROUP CORPORATION, Tokyo (JP)

( * ) Notice: Subject to any disclaimer, the term of this patent is extended or adjusted under 35 U.S.C. 154(b) by 382 days.

(21) Appl. No.: 18/559,178

(22) PCT Filed: Feb. 22, 2022

(86) PCT No.: PCT/JP2022/007406

§ 371 (c)(1),
(2) Date: Nov. 6, 2023

(87) PCT Pub. No.: WO2022/249595

PCT Pub. Date: Dec. 1, 2022

(65) Prior Publication Data

US 2024/0260284 A1 Aug. 1, 2024

(30) Foreign Application Priority Data

May 26, 2021 (JP) ................................ 2021-088808

(51) Int. Cl.

| | |
|---|---|
| ***H10K 30/00*** | (2023.01) |
| ***H10K 30/30*** | (2023.01) |
| ***H10K 30/86*** | (2023.01) |
| ***H10K 39/32*** | (2023.01) |
| ***H10K 85/20*** | (2023.01) |
| *H10K 101/30* | (2023.01) |
| *H10K 102/00* | (2023.01) |

(52) U.S. Cl.

CPC ............. *H10K 30/00* (2023.02); *H10K 30/30* (2023.02); *H10K 30/353* (2023.02); *H10K 30/86* (2023.02);

(Continued)

(58) Field of Classification Search

CPC ....... H10K 30/353; H10K 30/20; H10K 30/81

See application file for complete search history.

(56) References Cited

U.S. PATENT DOCUMENTS

| | | | | |
|---|---|---|---|---|
| 2015/0060775 A1 | 3/2015 | Liang et al. | | |
| 2015/0060839 A1* | 3/2015 | Suzuki | ................. | H10K 30/353 257/40 |

(Continued)

FOREIGN PATENT DOCUMENTS

| | | |
|---|---|---|
| JP | 2009-231610 A | 10/2009 |
| JP | 2013-236008 A | 11/2013 |

(Continued)

OTHER PUBLICATIONS

International Search Report and Written Opinion of PCT Application No. PCT/JP2022/007406, issued on May 10, 2022, 10 pages of ISRWO.

*Primary Examiner* — Yu-Hsi D Sun

(74) *Attorney, Agent, or Firm* — CHIP LAW GROUP

(57) ABSTRACT

A photoelectric conversion device including a first electrode, a second electrode.
a photoelectric conversion layer, a first electric charge block layer, and a second electric charge block layer is provided. The second electrode faces the first electrode. The photoelectric conversion layer is between the first electrode and the second electrode. The first electric charge block layer is between the first electrode and the photoelectric conversion layer. The first electric charge block layer includes an organic material having an HOMO level that is deeper by 1 eV or higher and an LUMO level ranging from 3.7 eV to 4.8

(Continued)

eV inclusive, with respect to a work function of the first electrode. The second electric charge block layer is between the first electric charge block layer and the photoelectric conversion layer. Each of the photoelectric conversion layer and the second electric charge block layer include fullerenes or fullerene derivatives.

17 Claims, 27 Drawing Sheets

(52) U.S. Cl.
CPC ........... *H10K 39/32* (2023.02); *H10K 85/211* (2023.02); *H10K 2101/30* (2023.02); *H10K 2102/351* (2023.02)

(56) References Cited

U.S. PATENT DOCUMENTS

| | | | | |
|---|---|---|---|---|
| 2016/0056212 | A1* | 2/2016 | Liang | H10K 30/87<br>438/66 |
| 2020/0251521 | A1* | 8/2020 | Lee | H10F 39/182 |

FOREIGN PATENT DOCUMENTS

| | | | |
|---|---|---|---|
| JP | 2018-113489 | A | 7/2018 |
| WO | 2020/027081 | A1 | 2/2020 |

* cited by examiner

[FIG. 1]
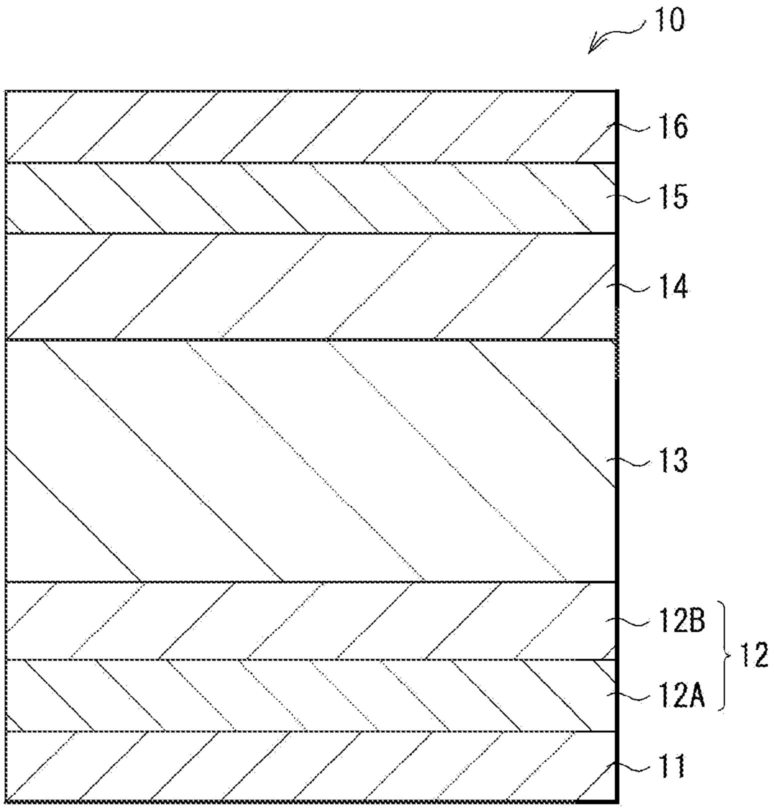

[FIG. 2]
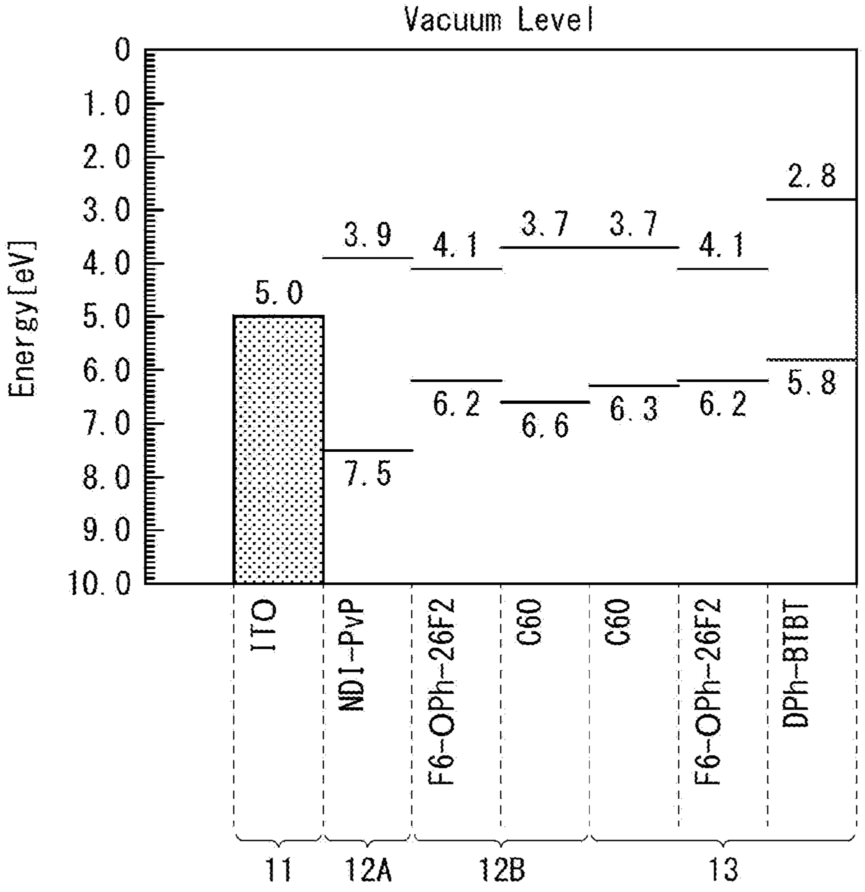

[FIG. 3]
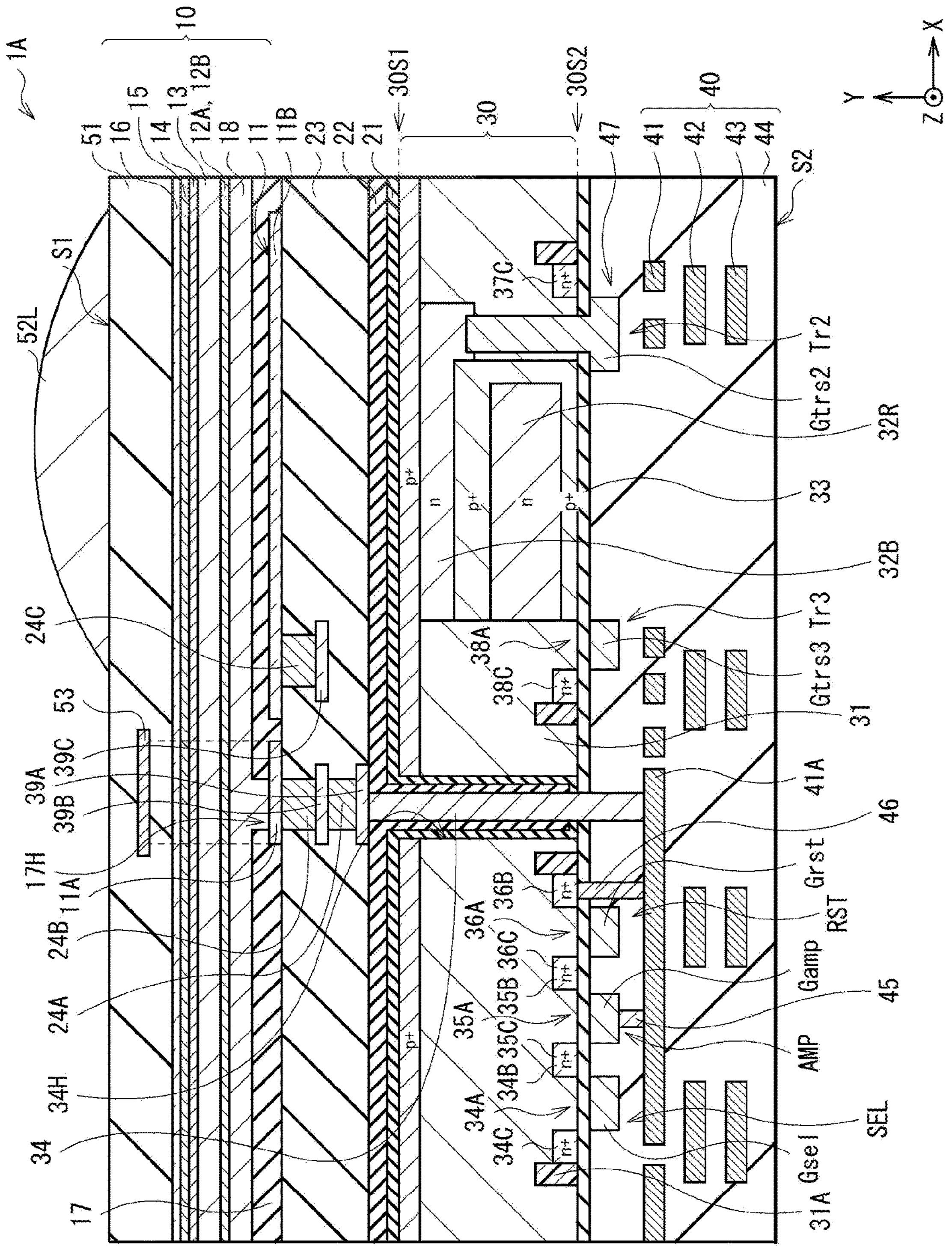

[FIG. 4]
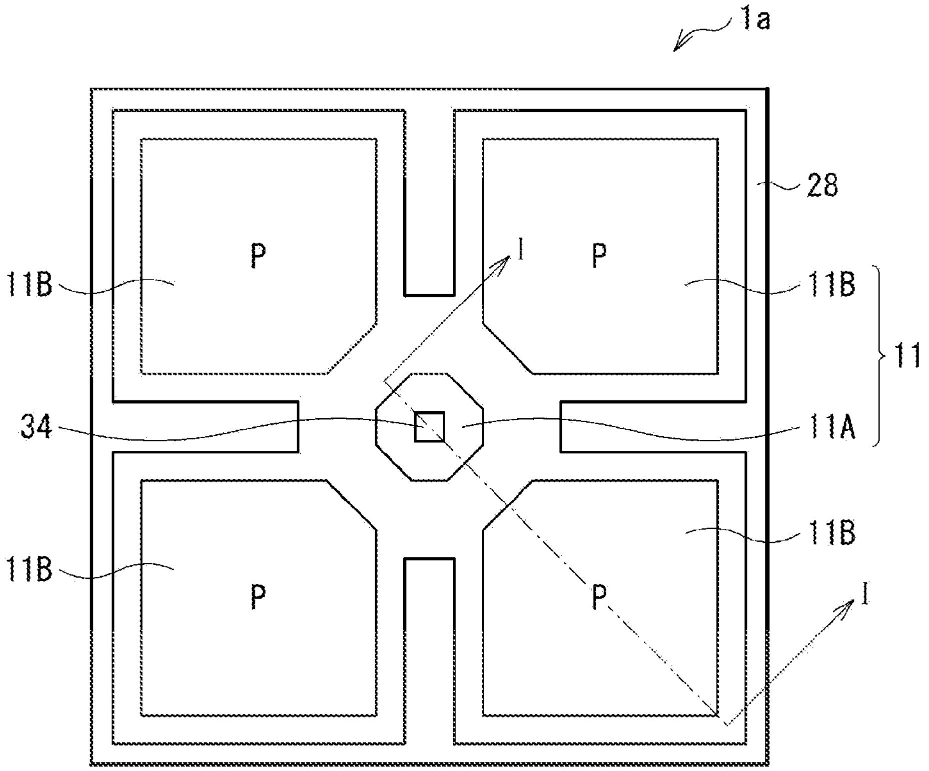

[FIG. 5]
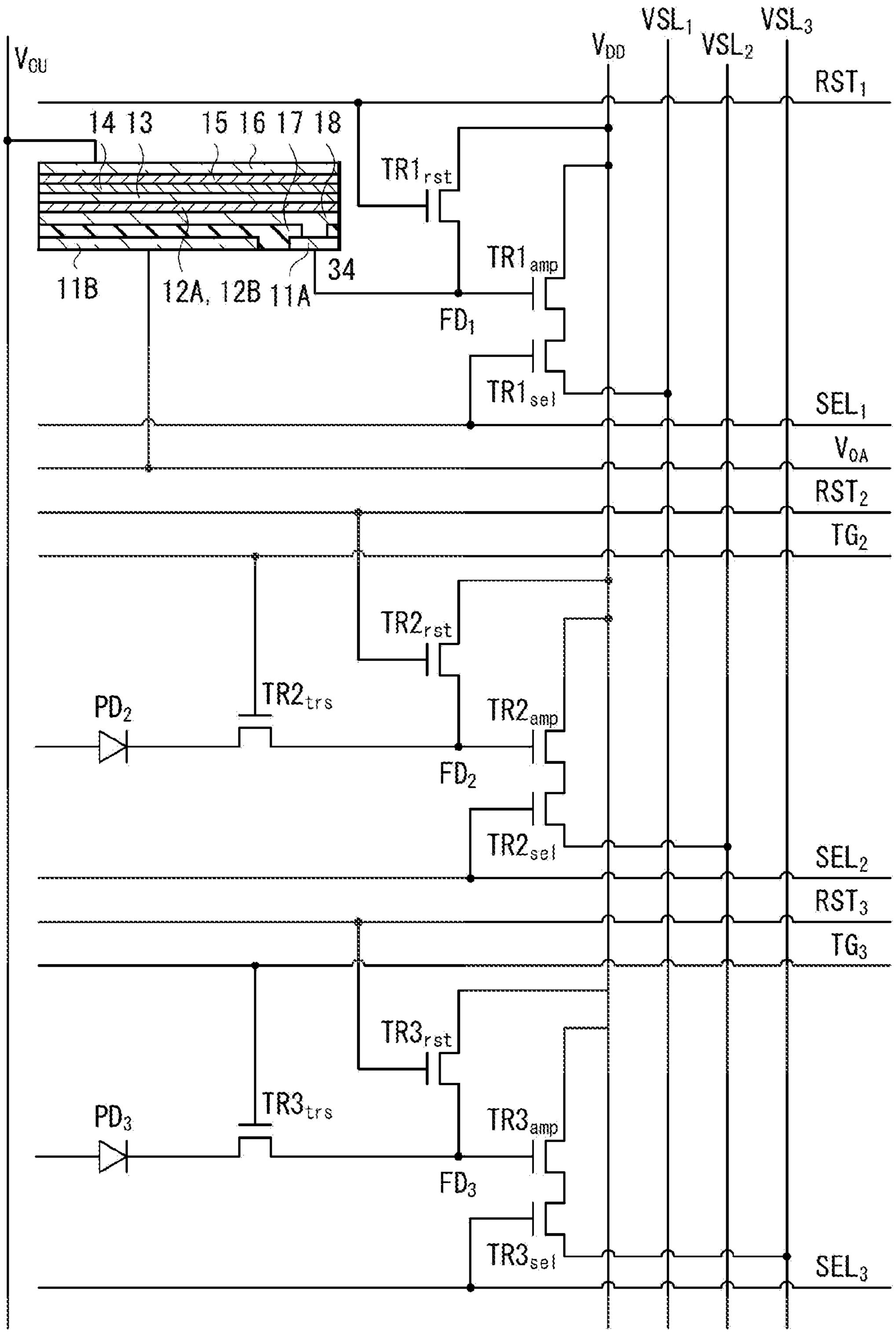

[FIG. 6]
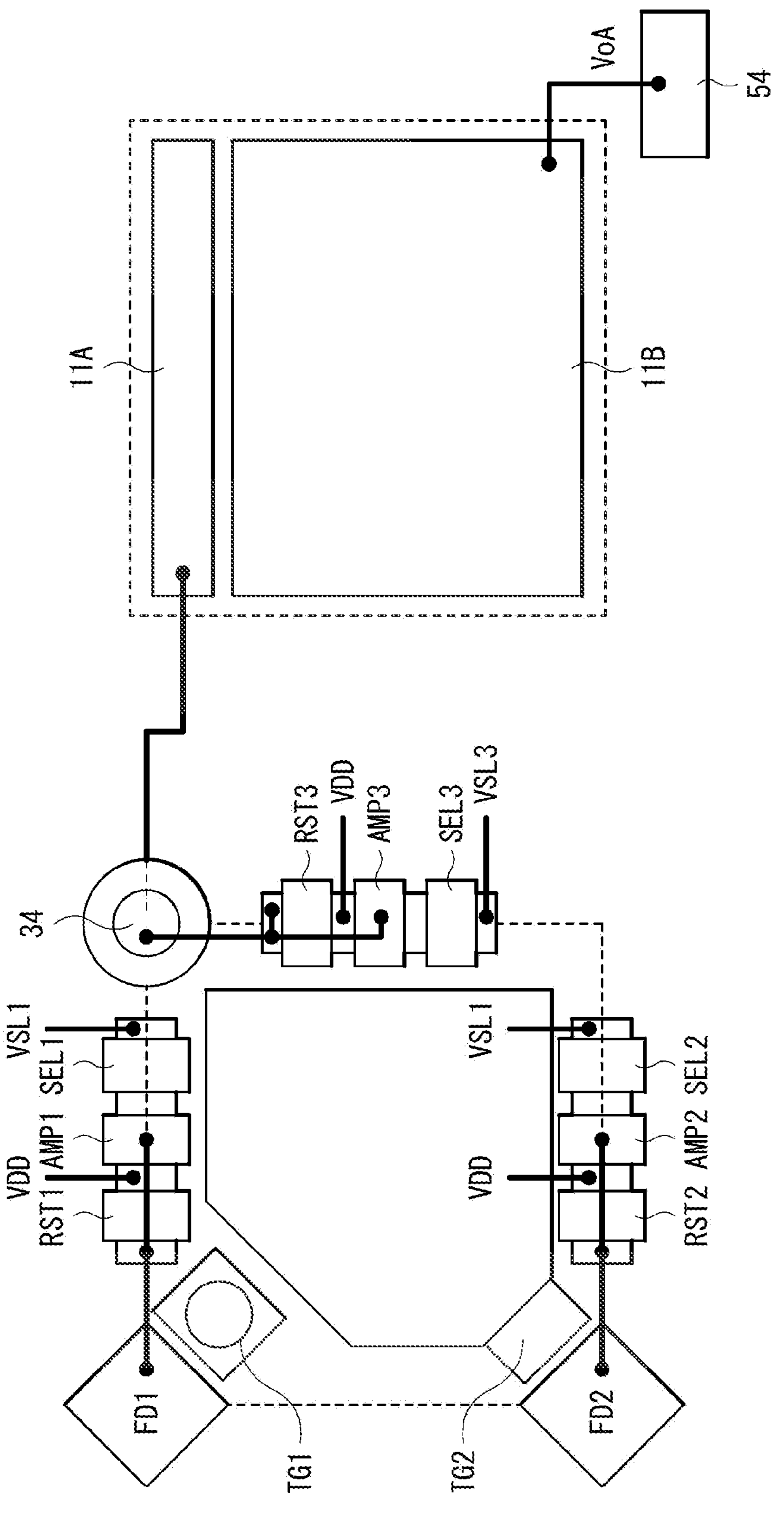

[FIG. 7]
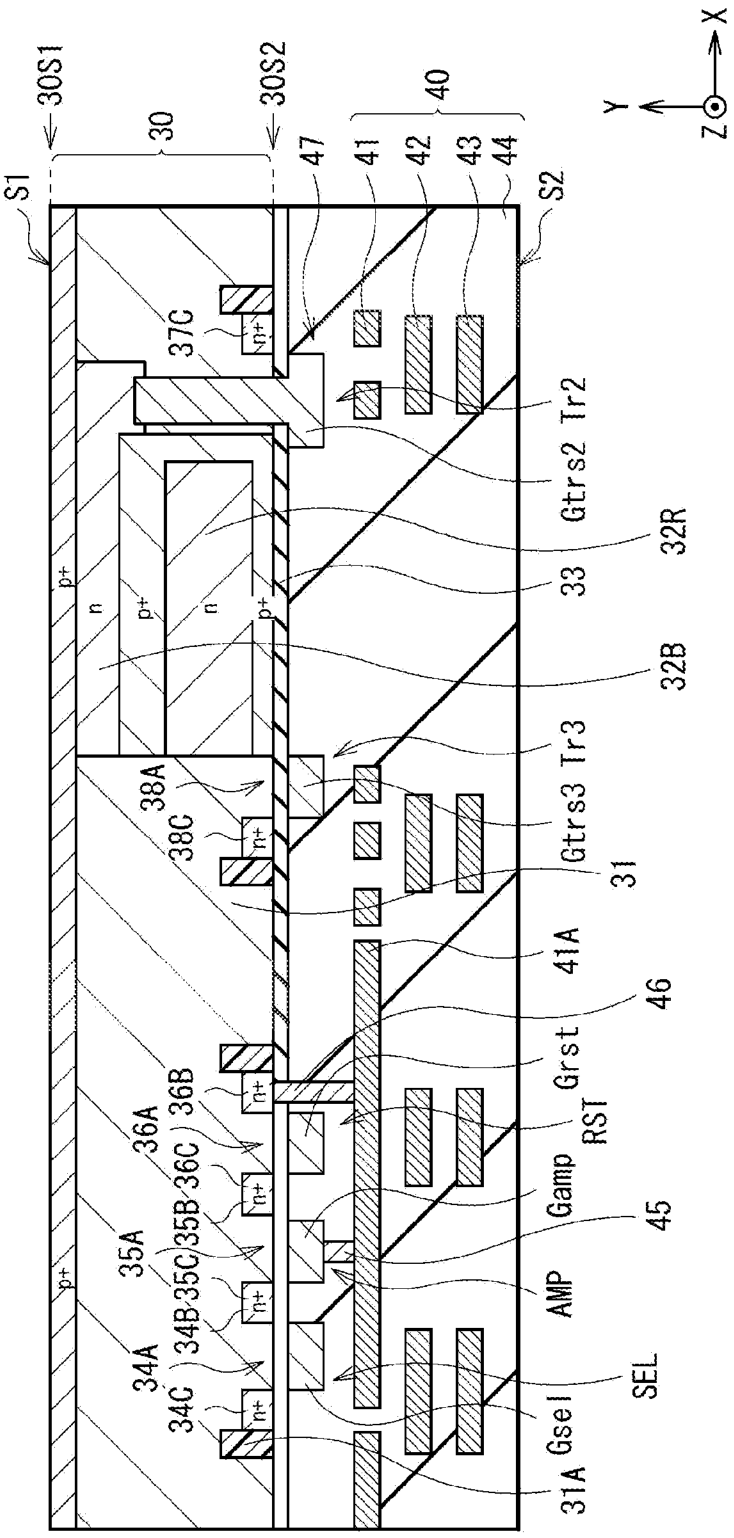

[FIG. 8]
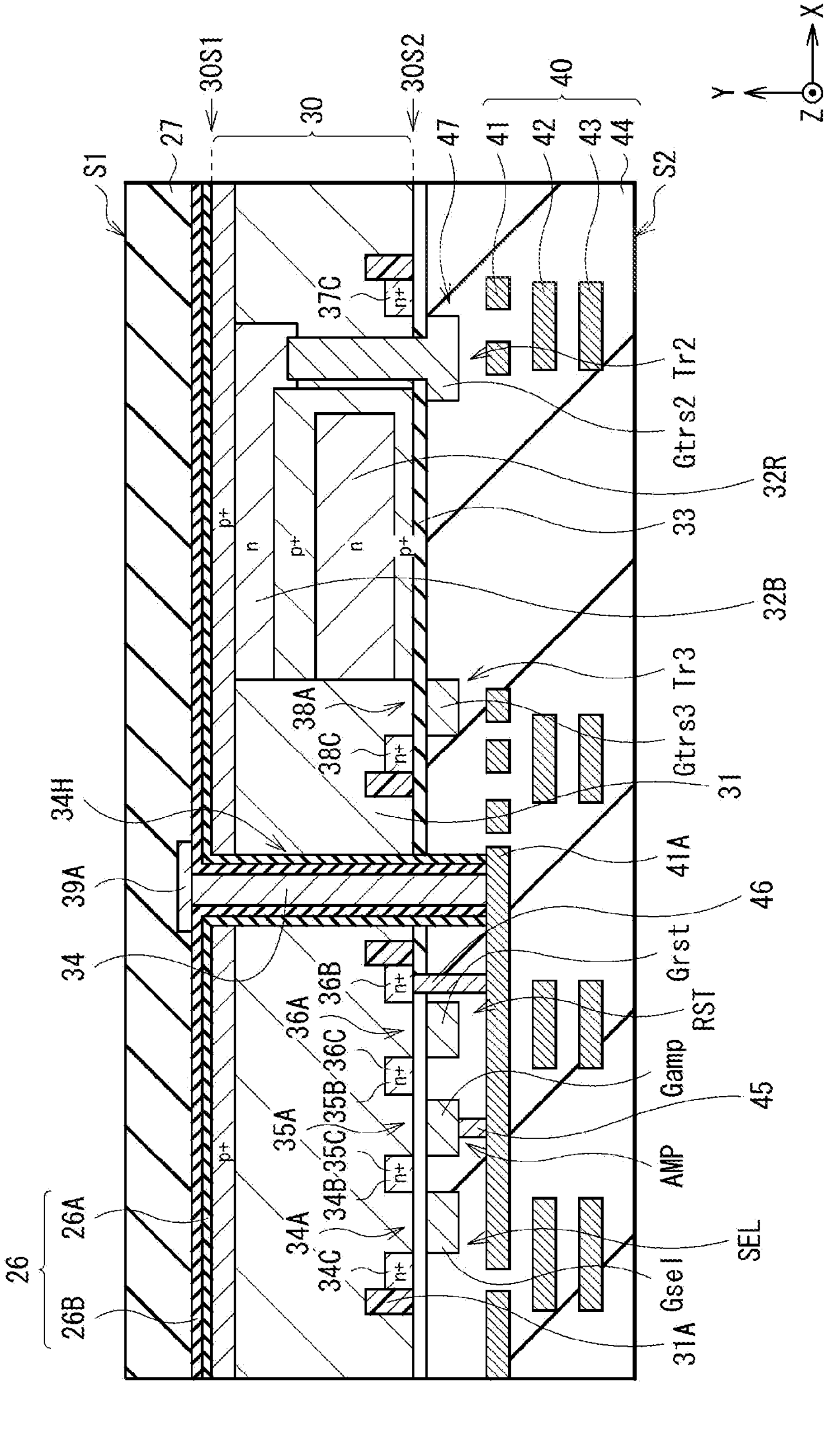

[FIG. 9]
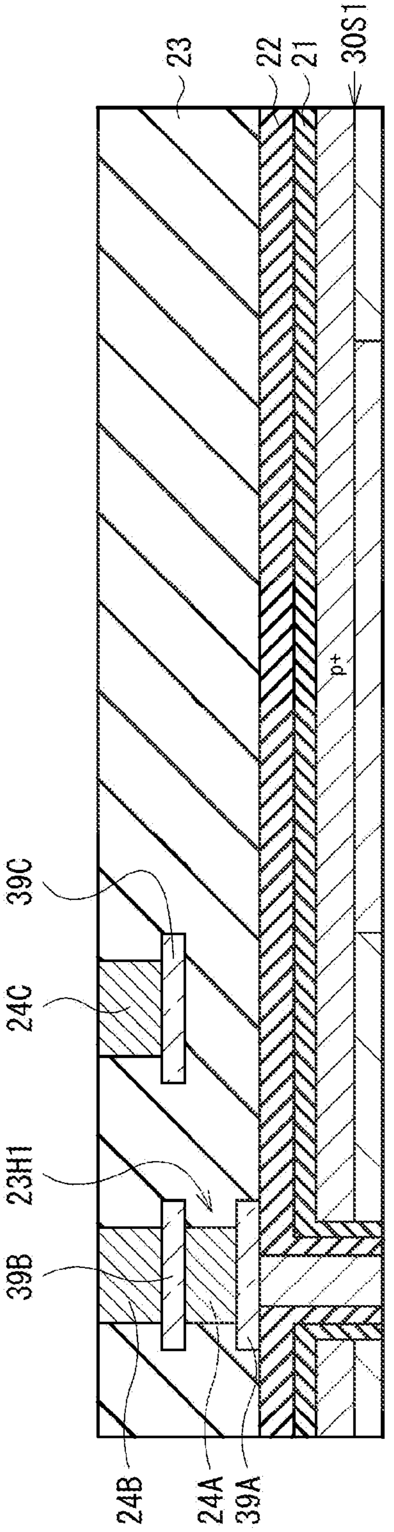

[FIG. 10]
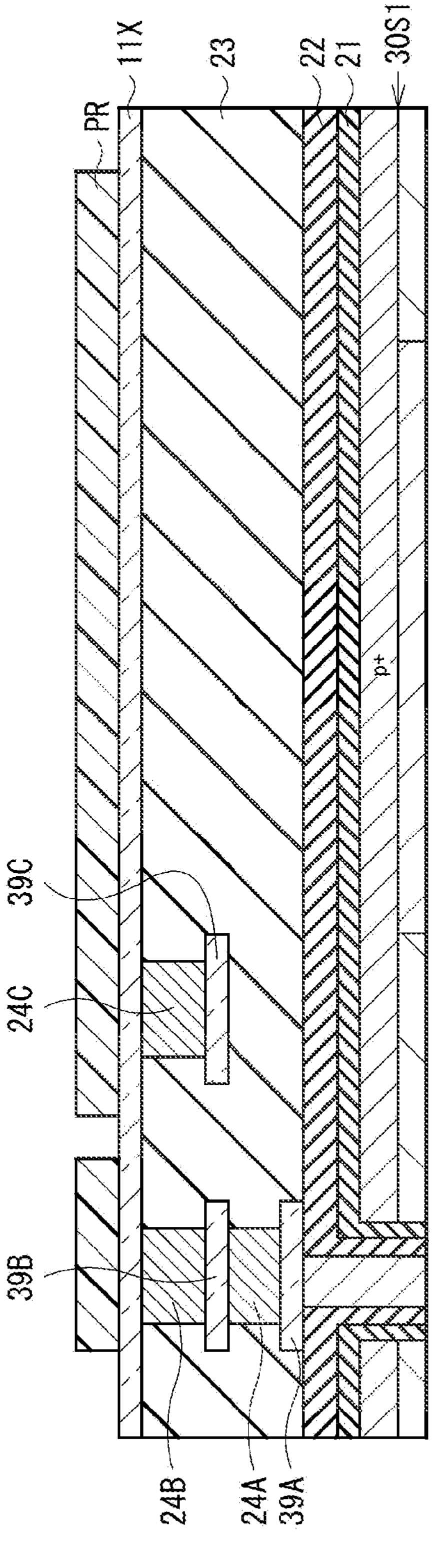

[FIG. 11]
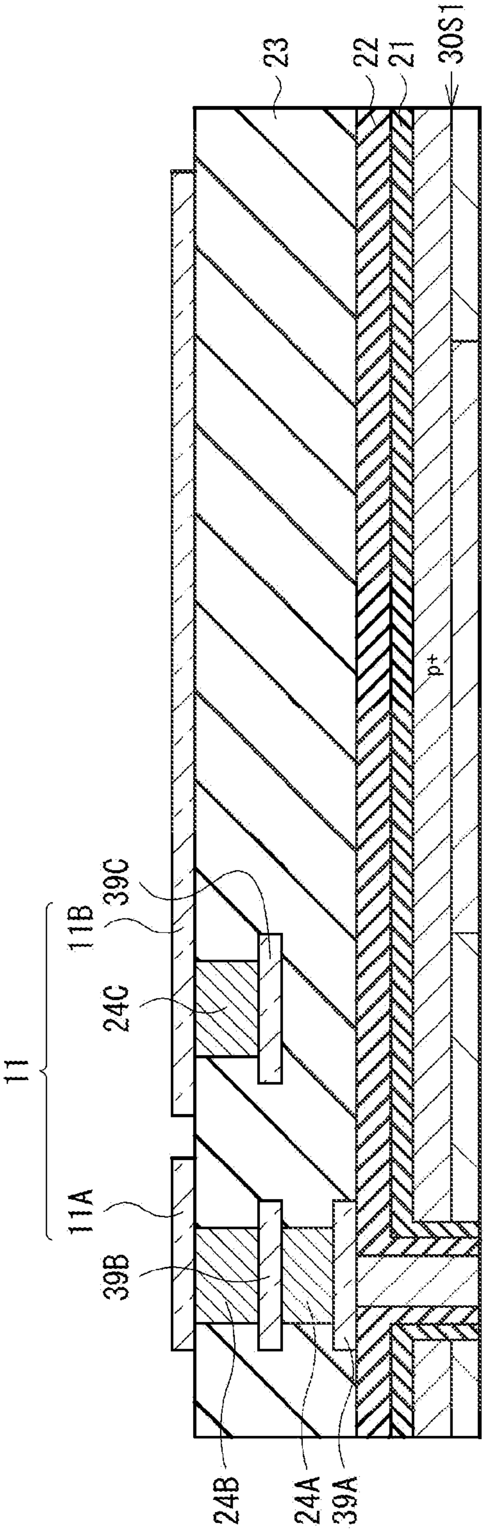

[FIG. 12]
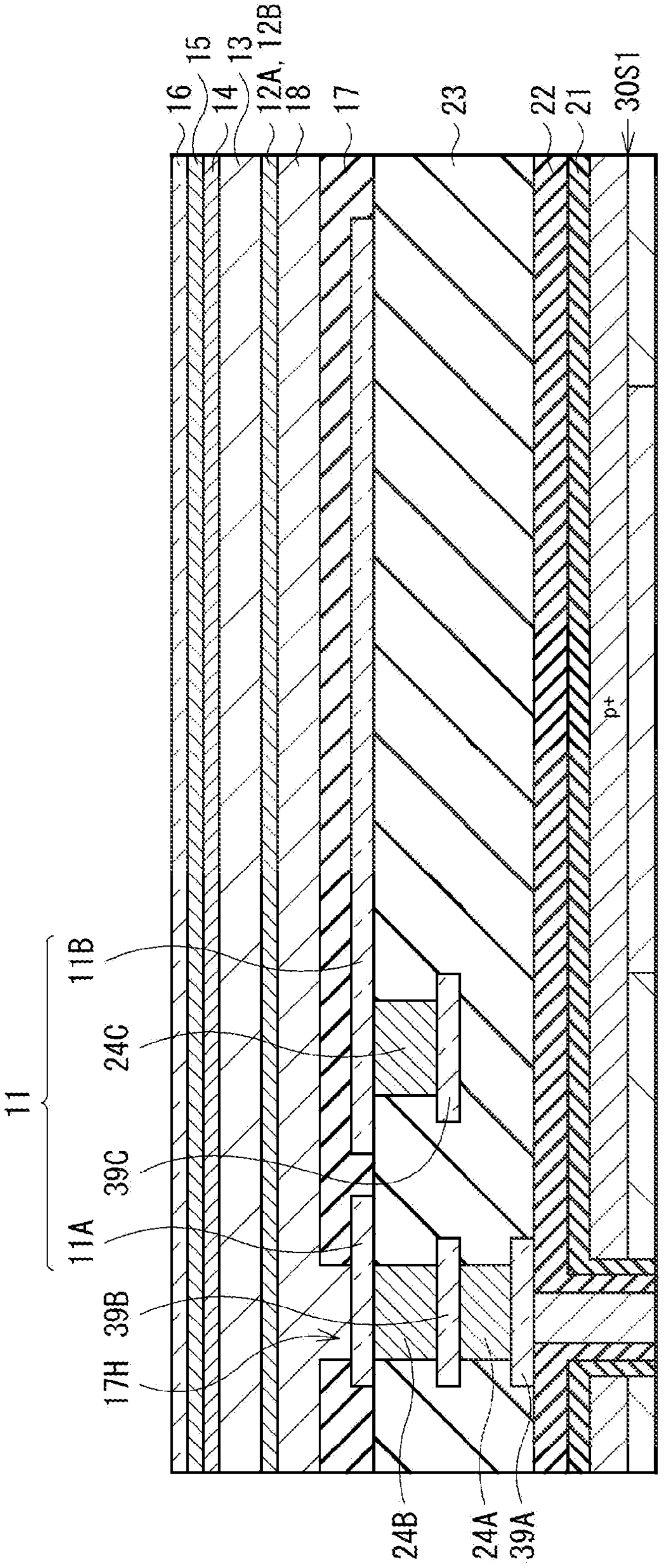

[FIG. 13]
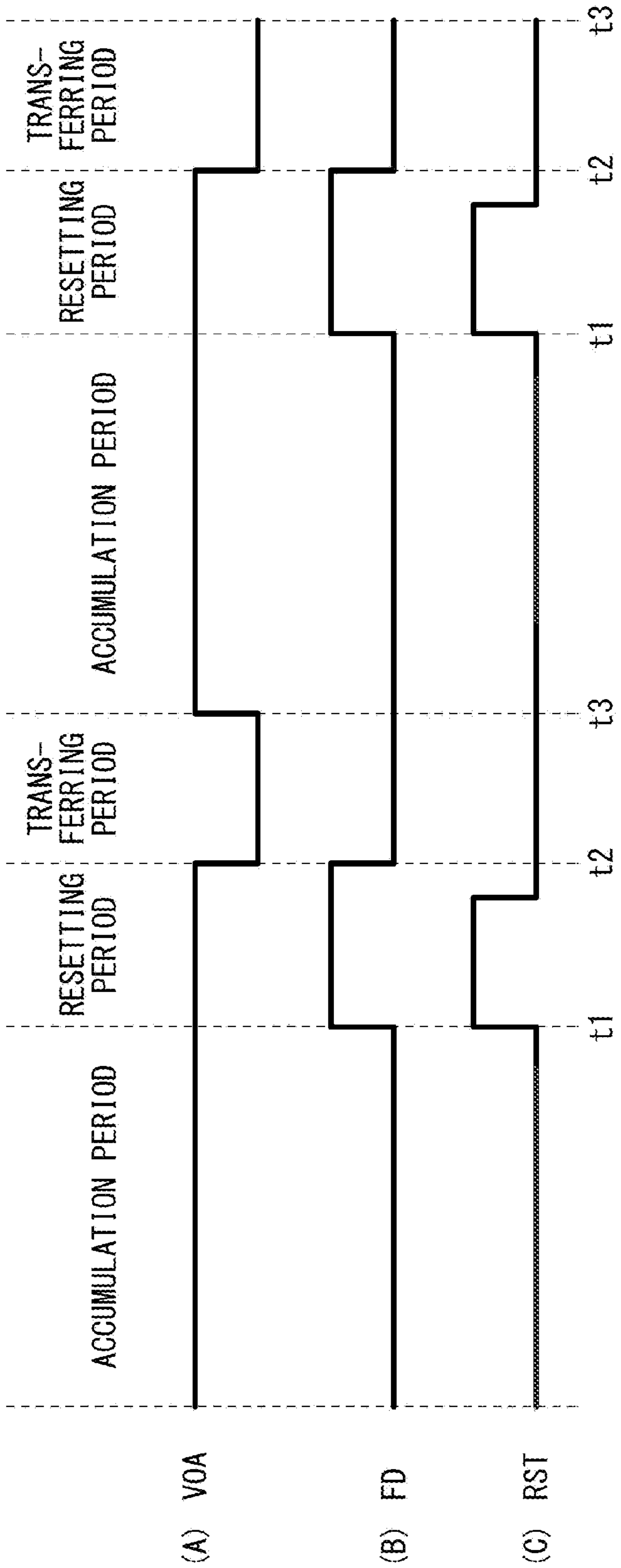

[FIG. 14]
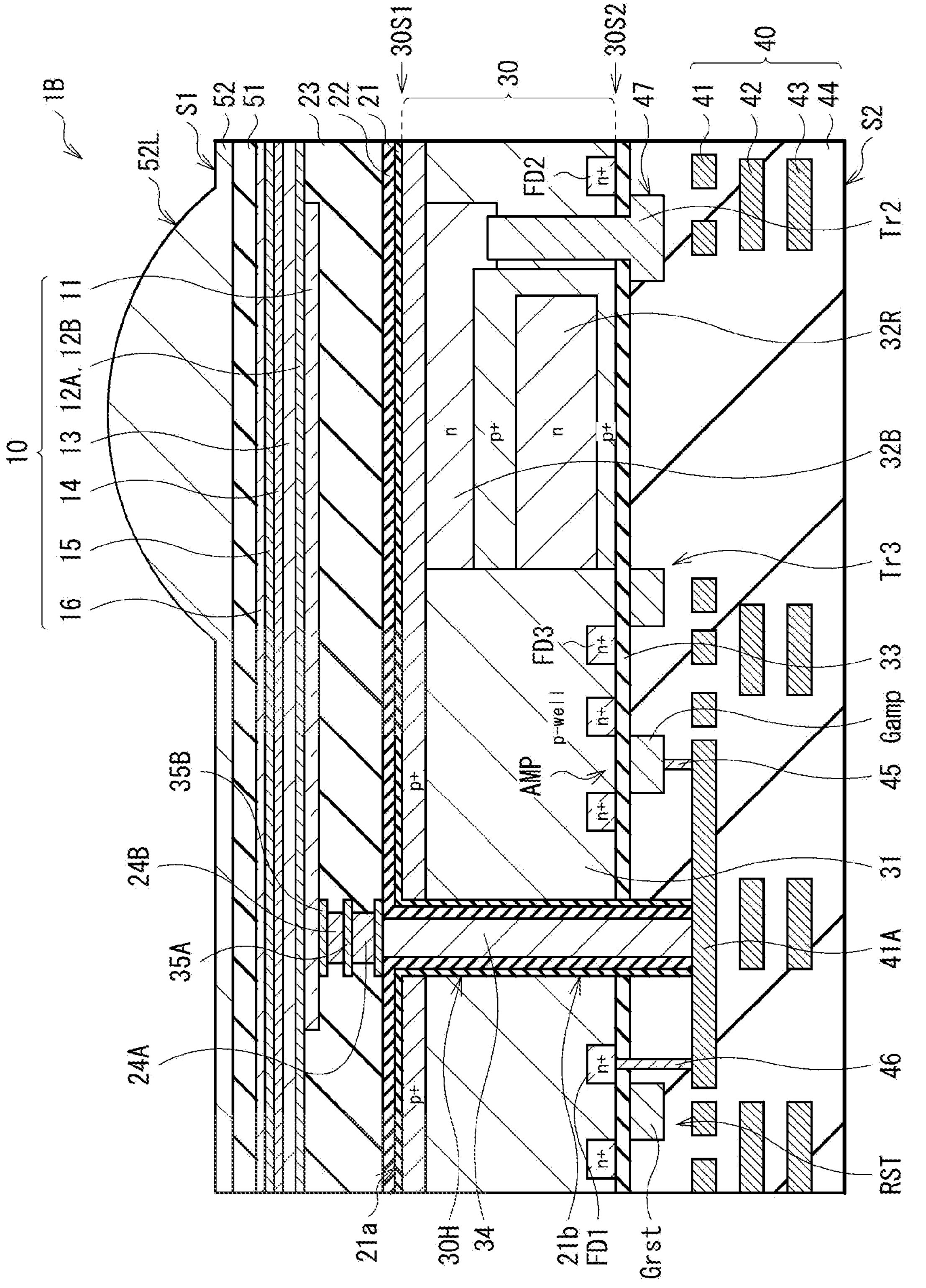

[FIG. 15]
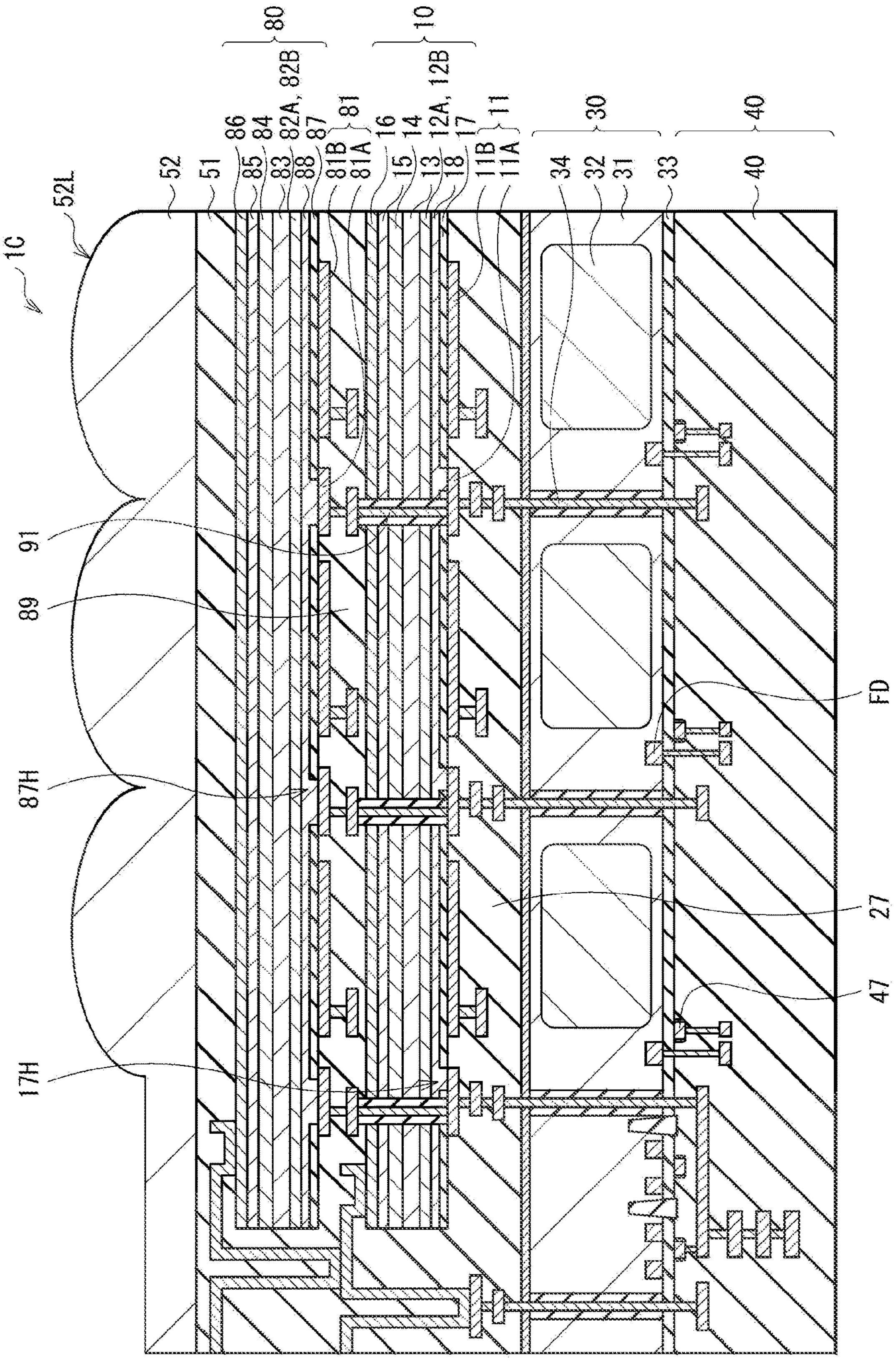

[FIG. 16A]
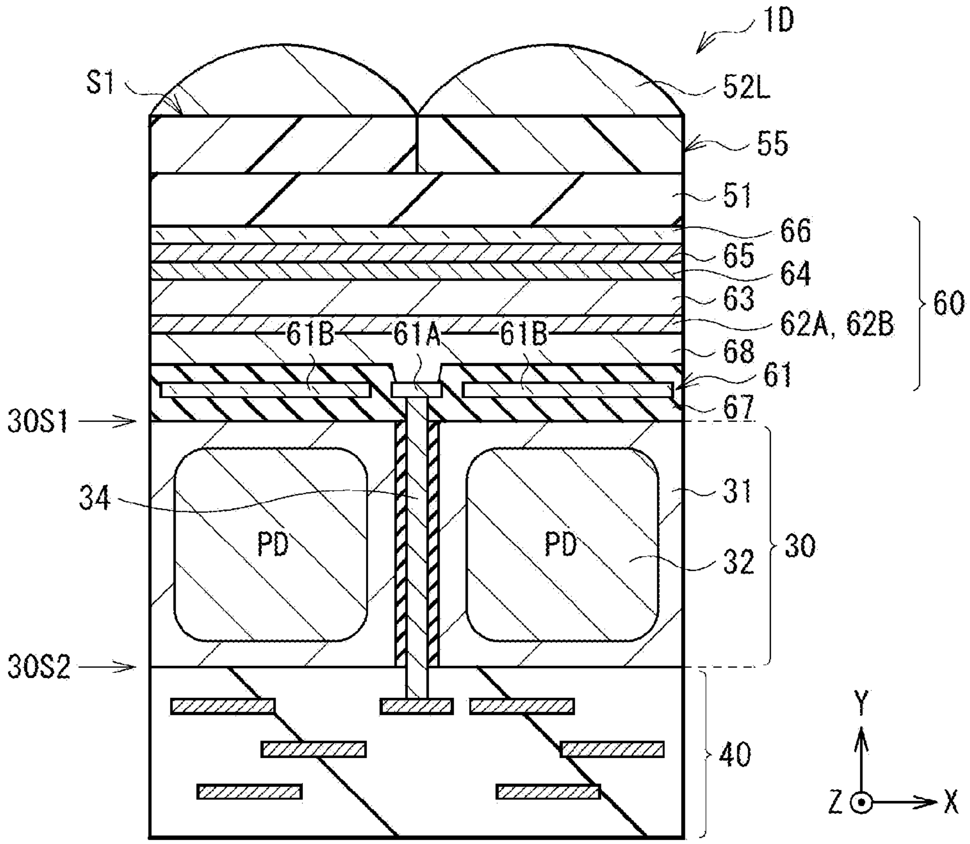
[FIG. 16B]
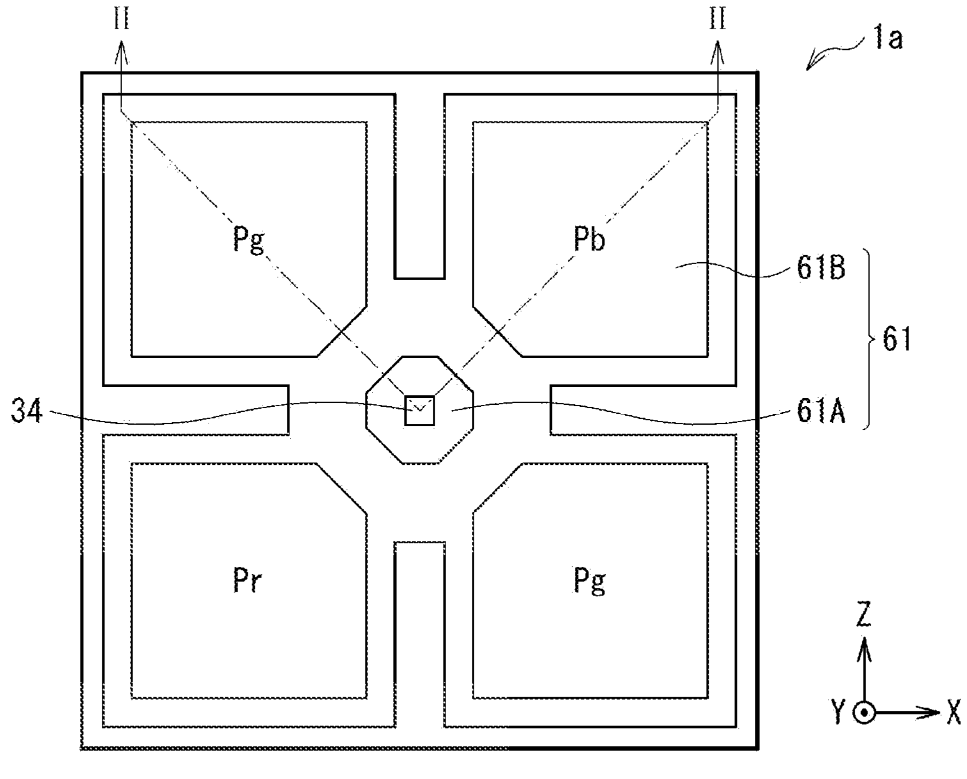

[FIG. 17A]
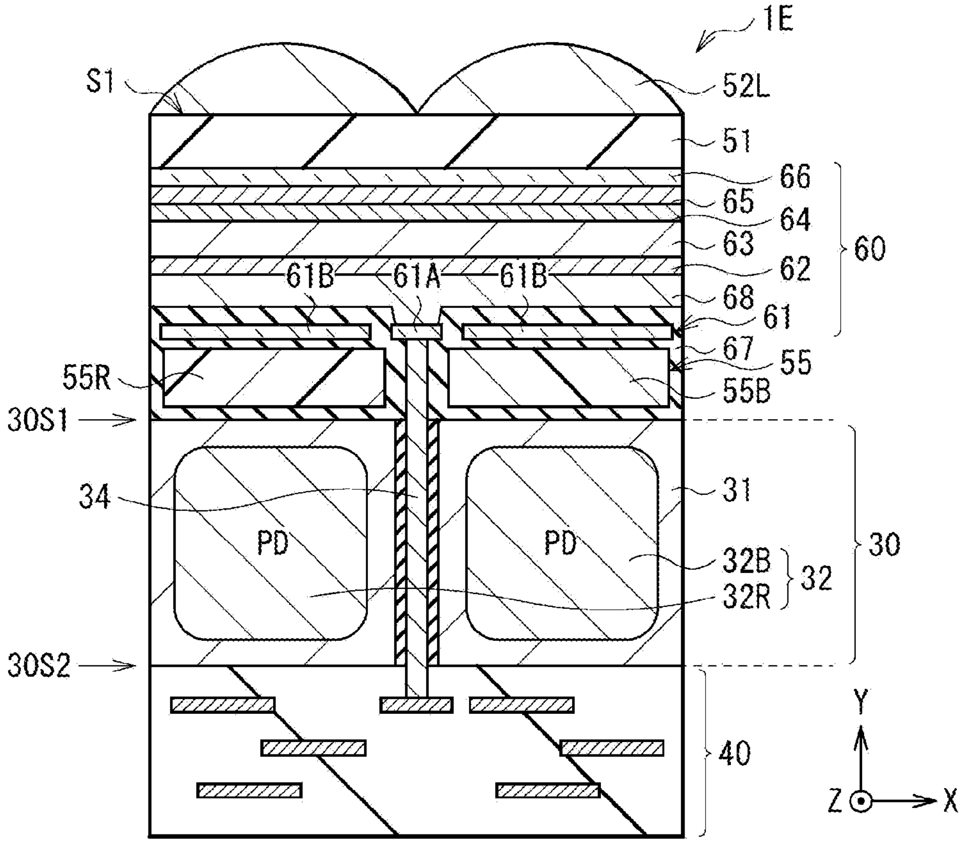
[FIG. 17B]
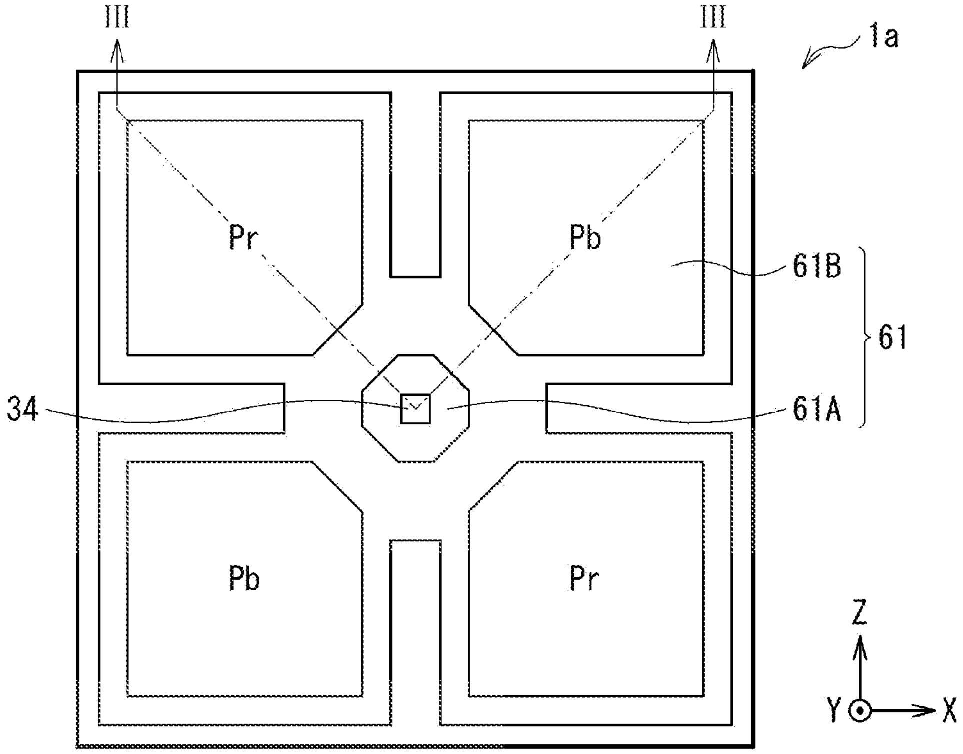

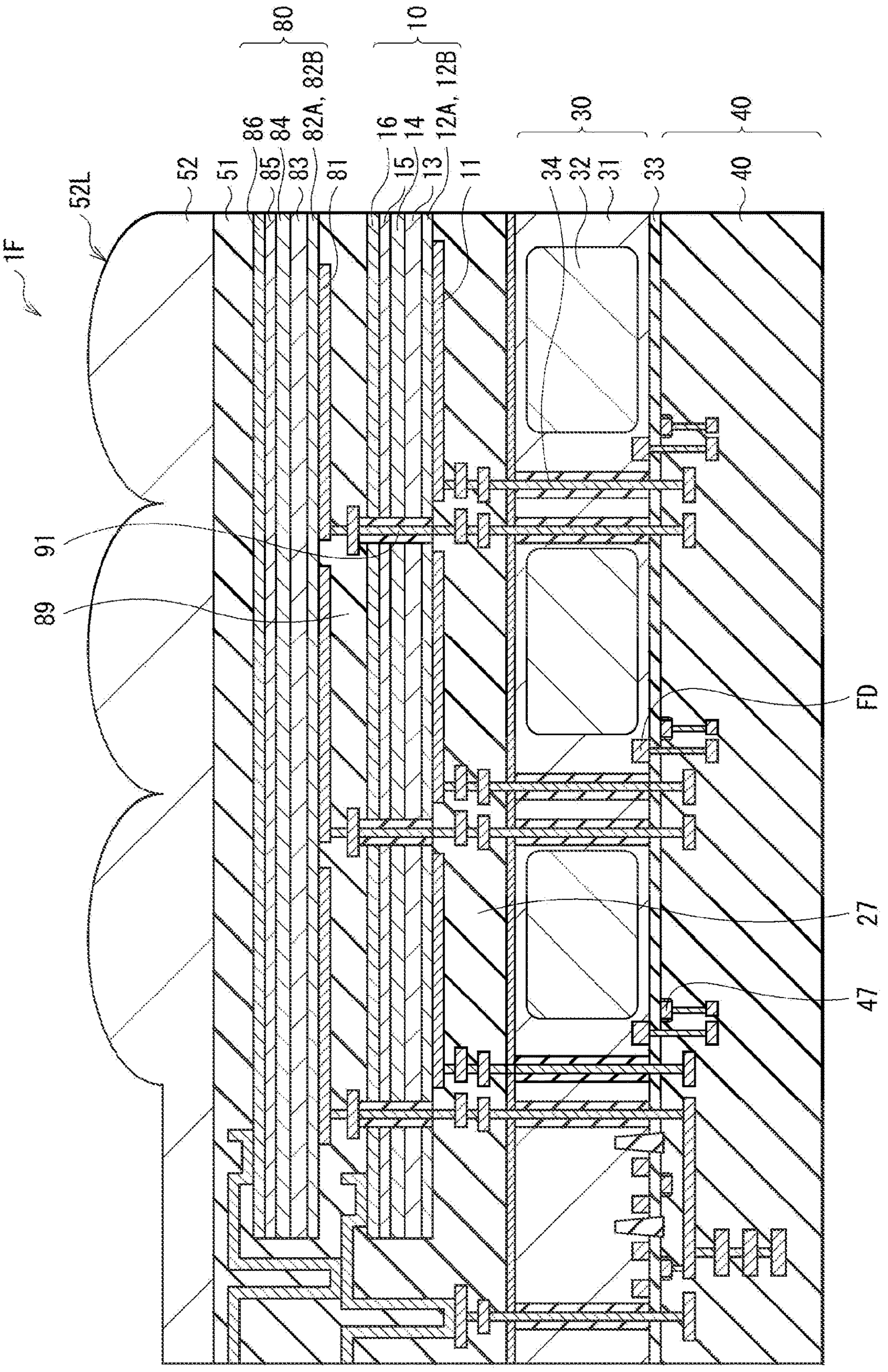
[FIG. 18]

[FIG. 19A]
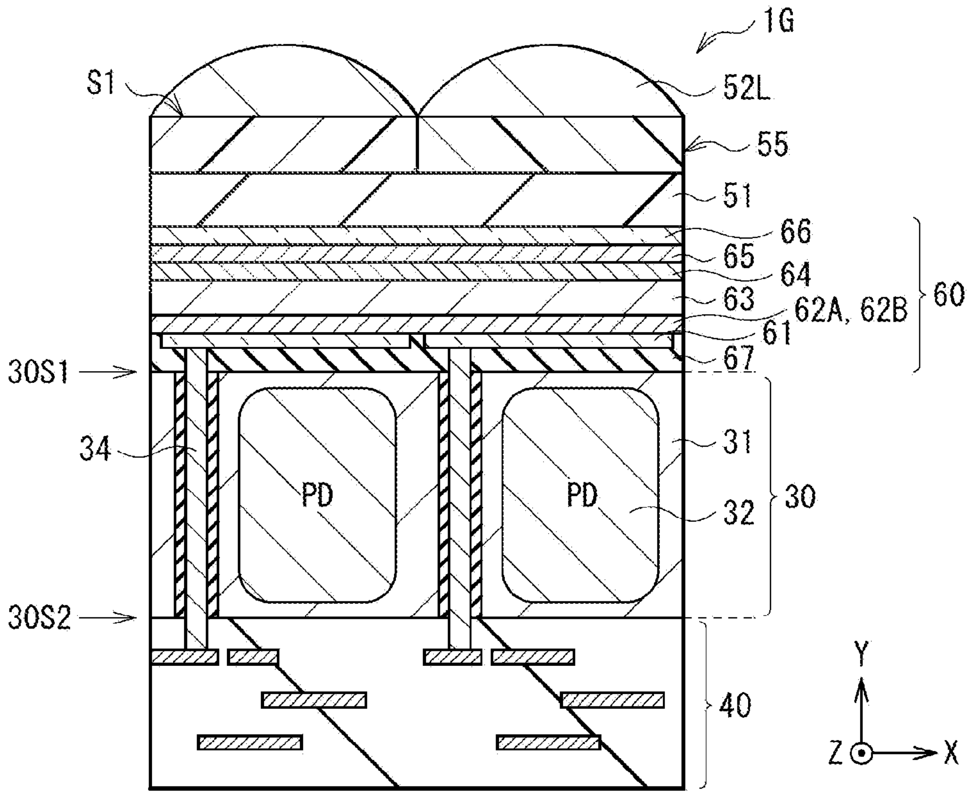
[FIG. 19B]
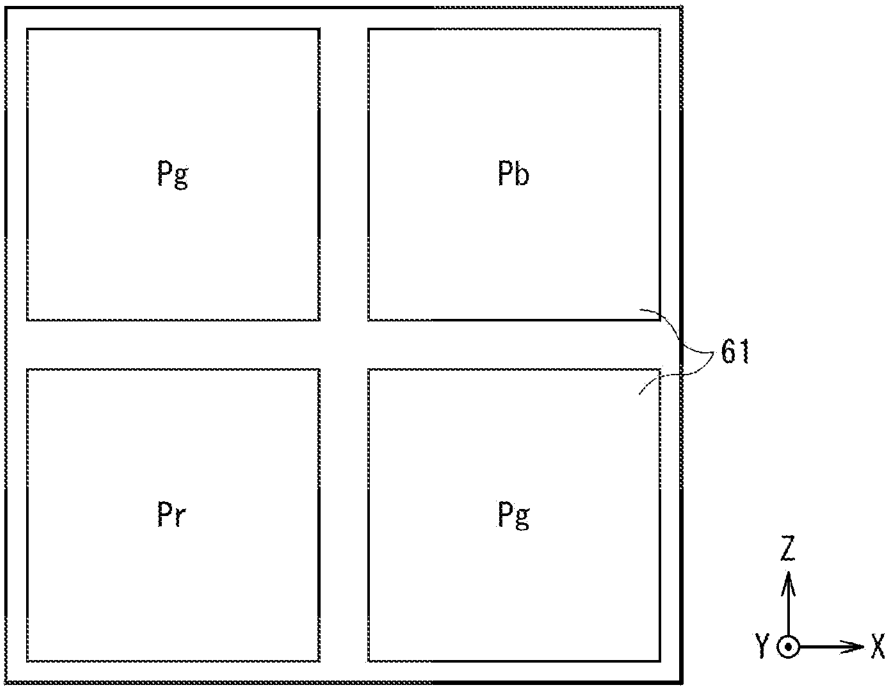

[FIG. 20A]
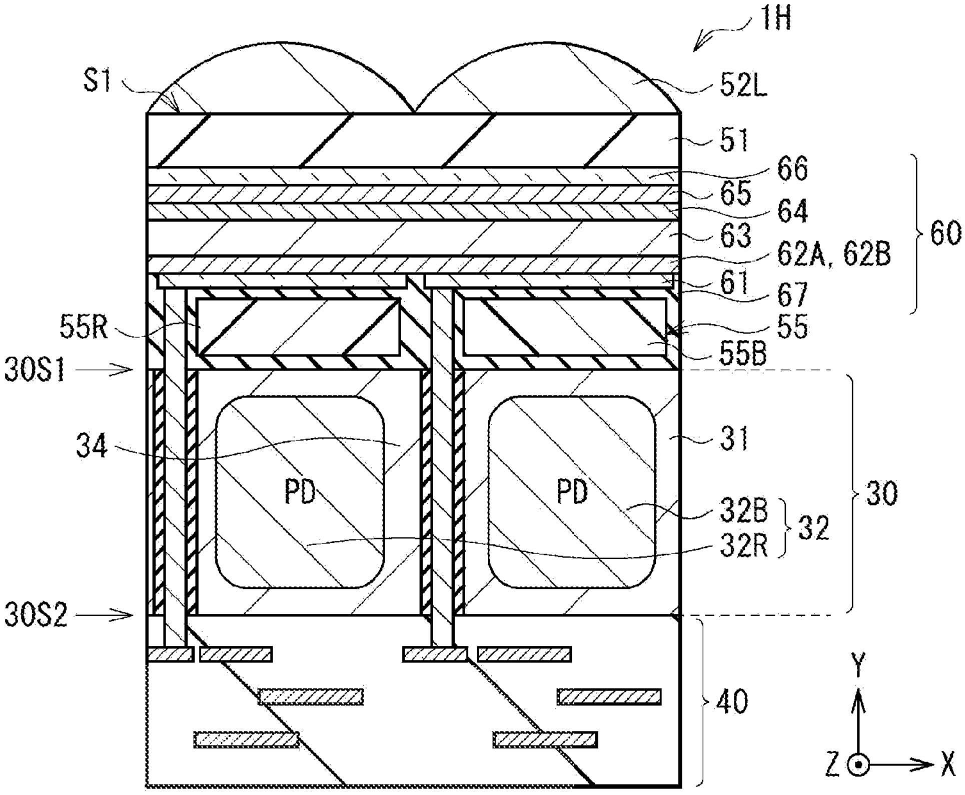
[FIG. 20B]
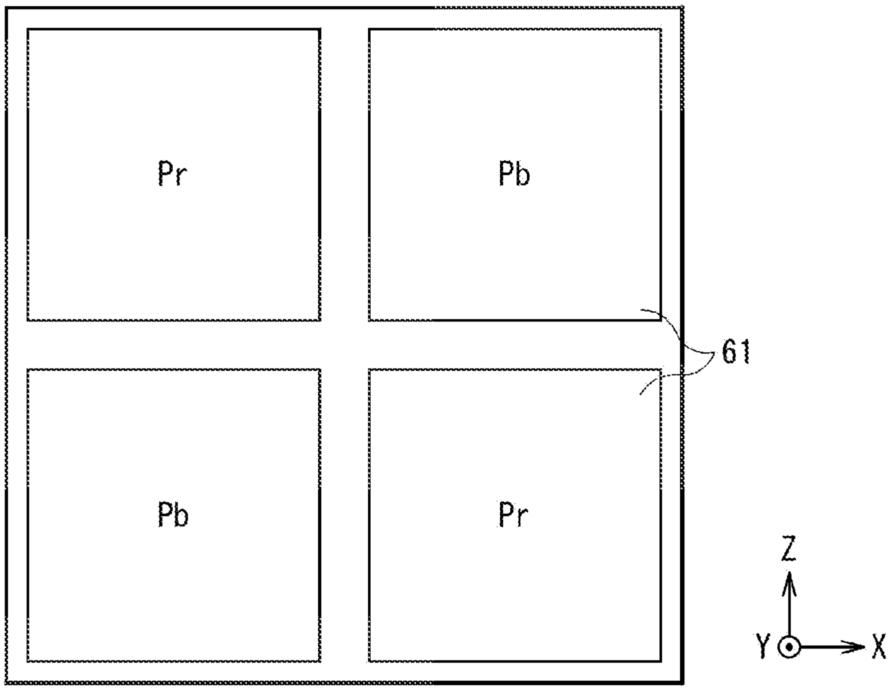

[FIG. 21]
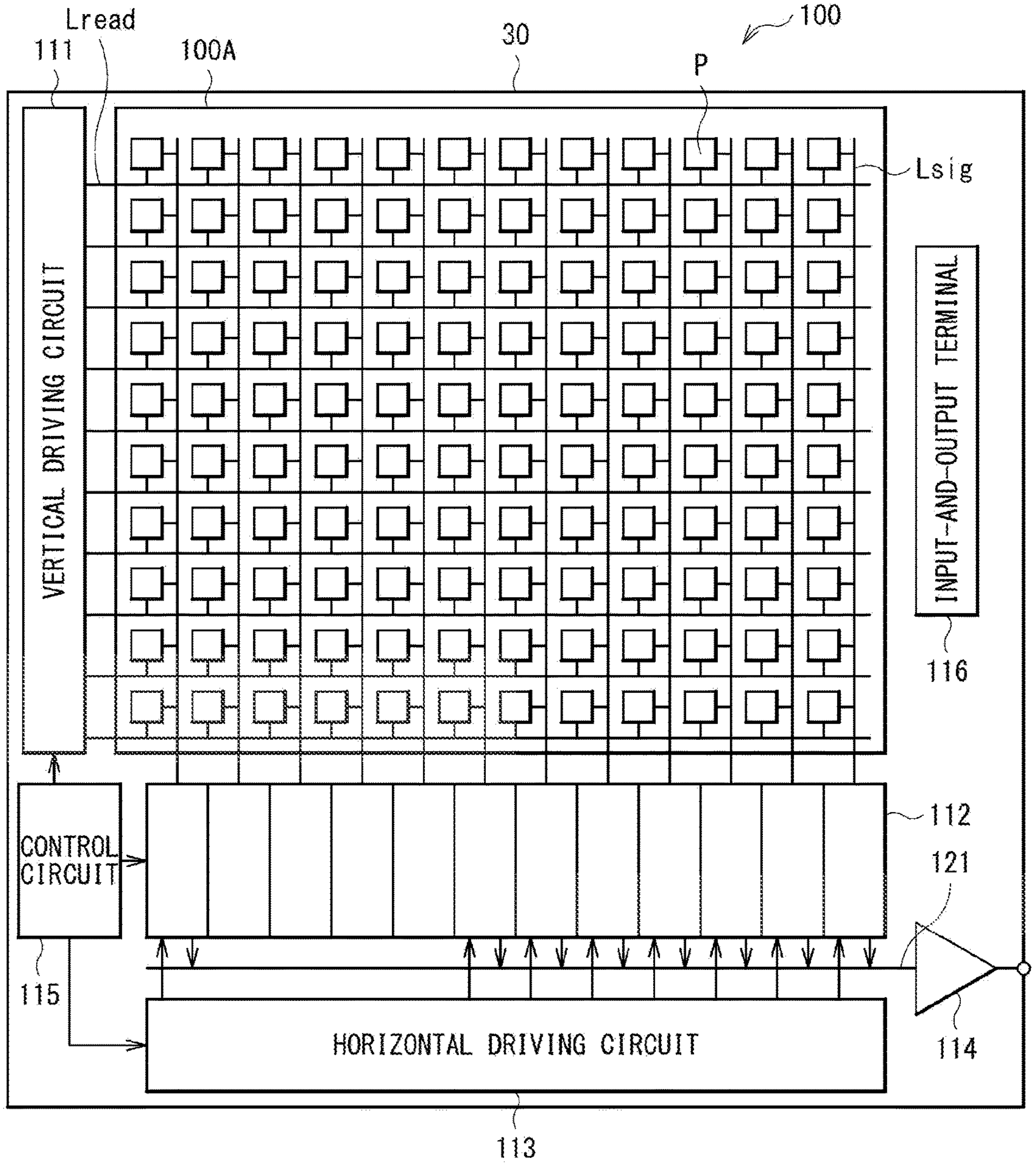

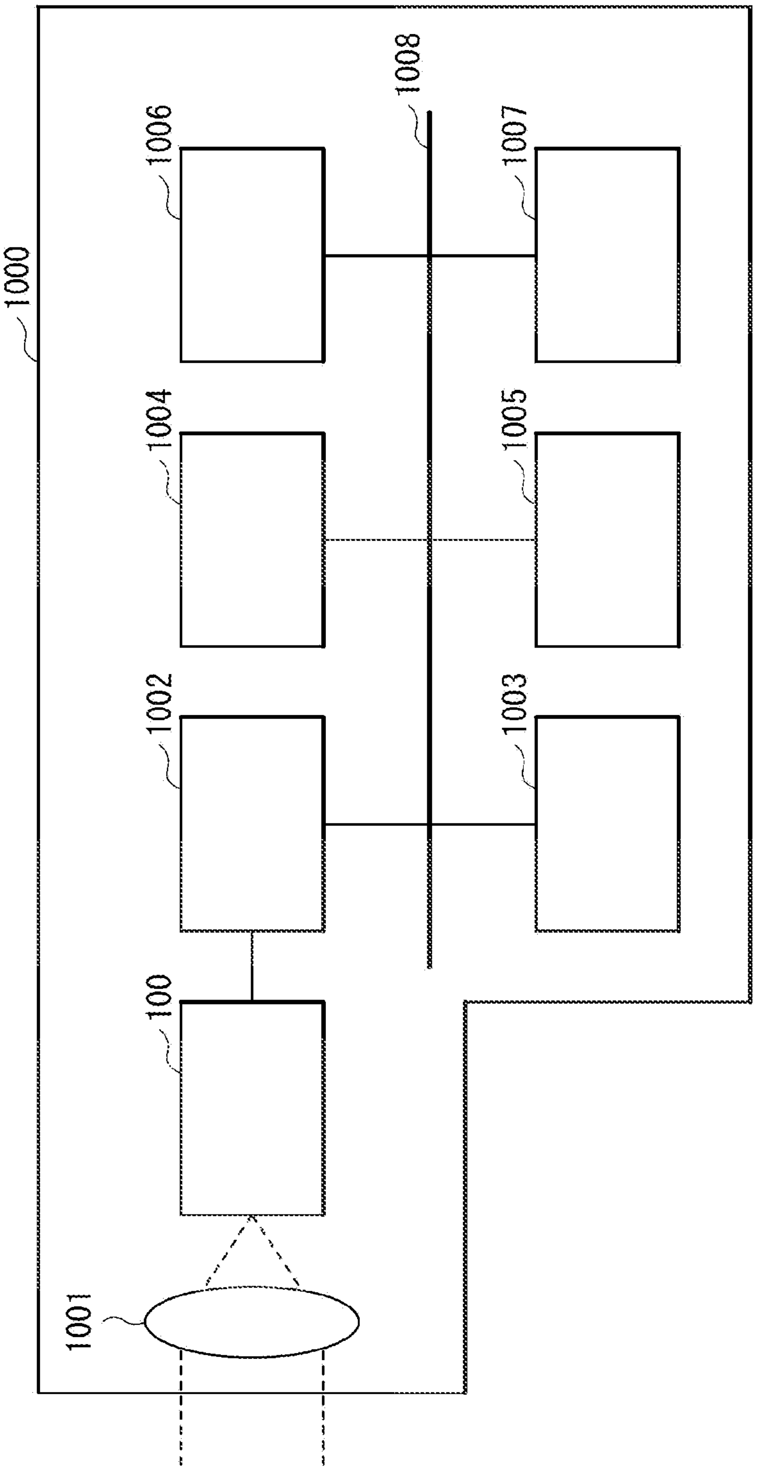
[FIG. 22]

[FIG. 23A]
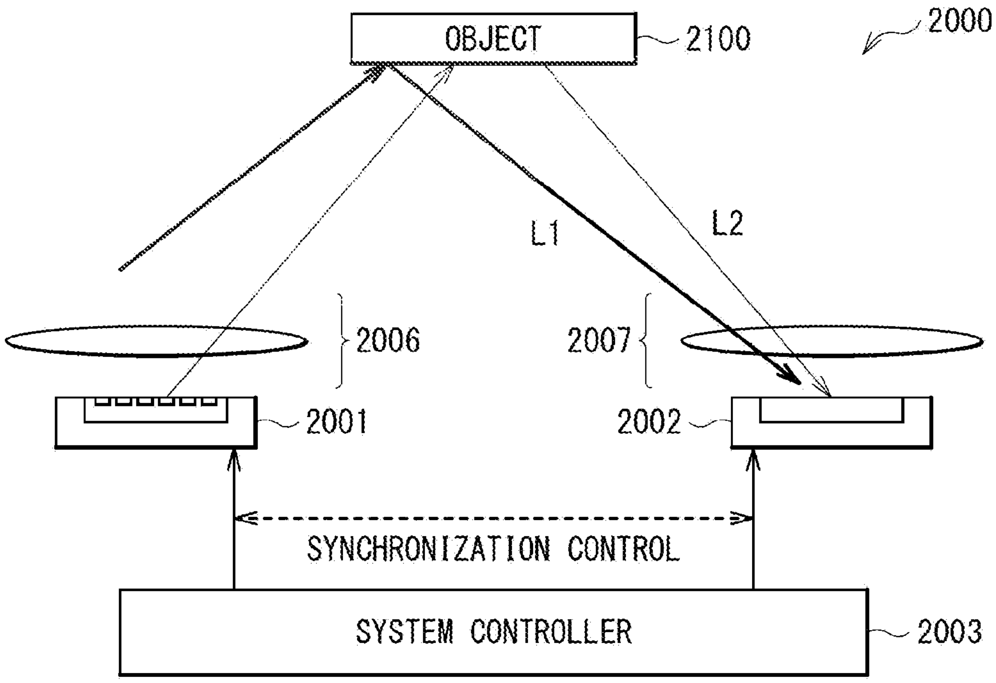
[FIG. 23B]
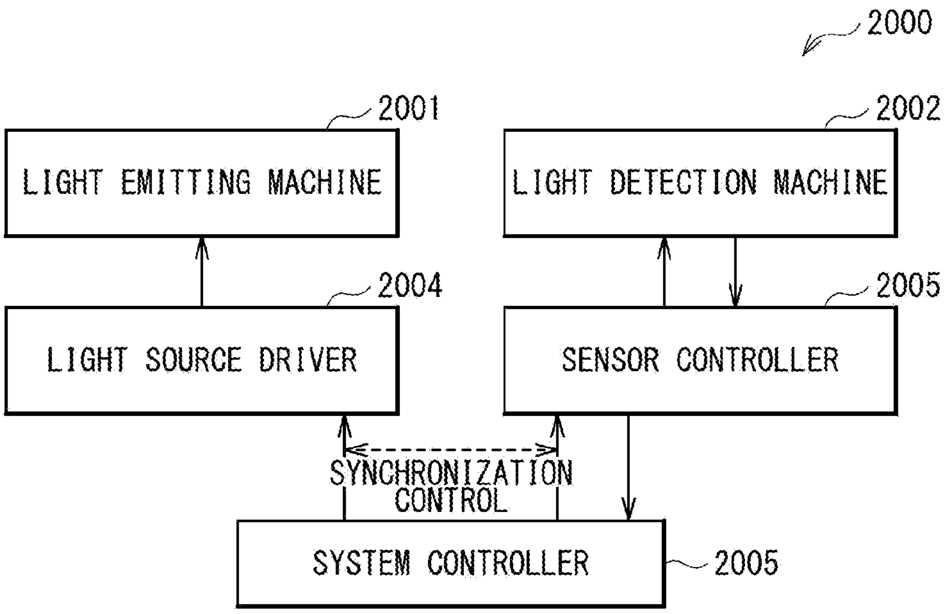

[FIG. 24]
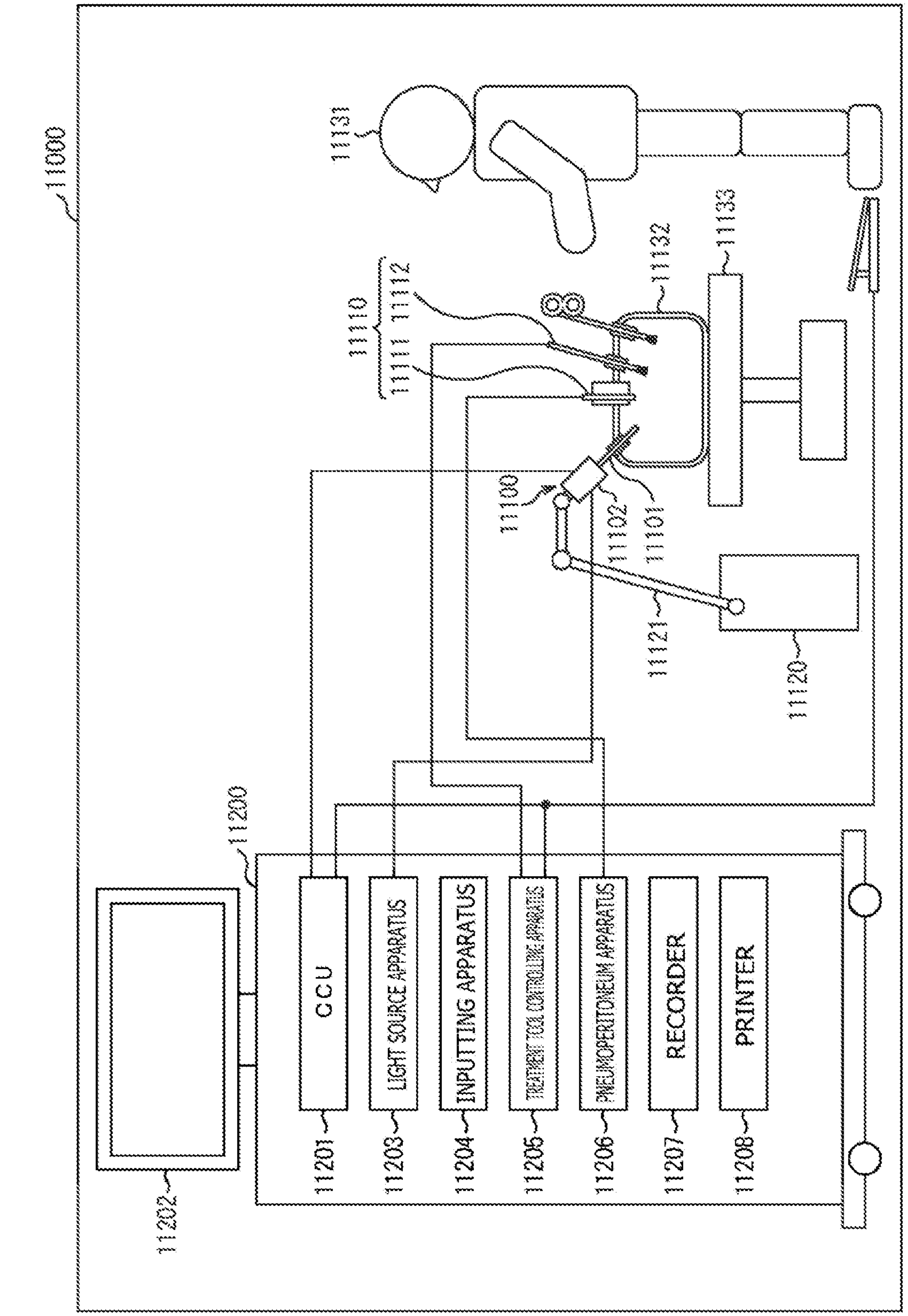

[FIG. 25]
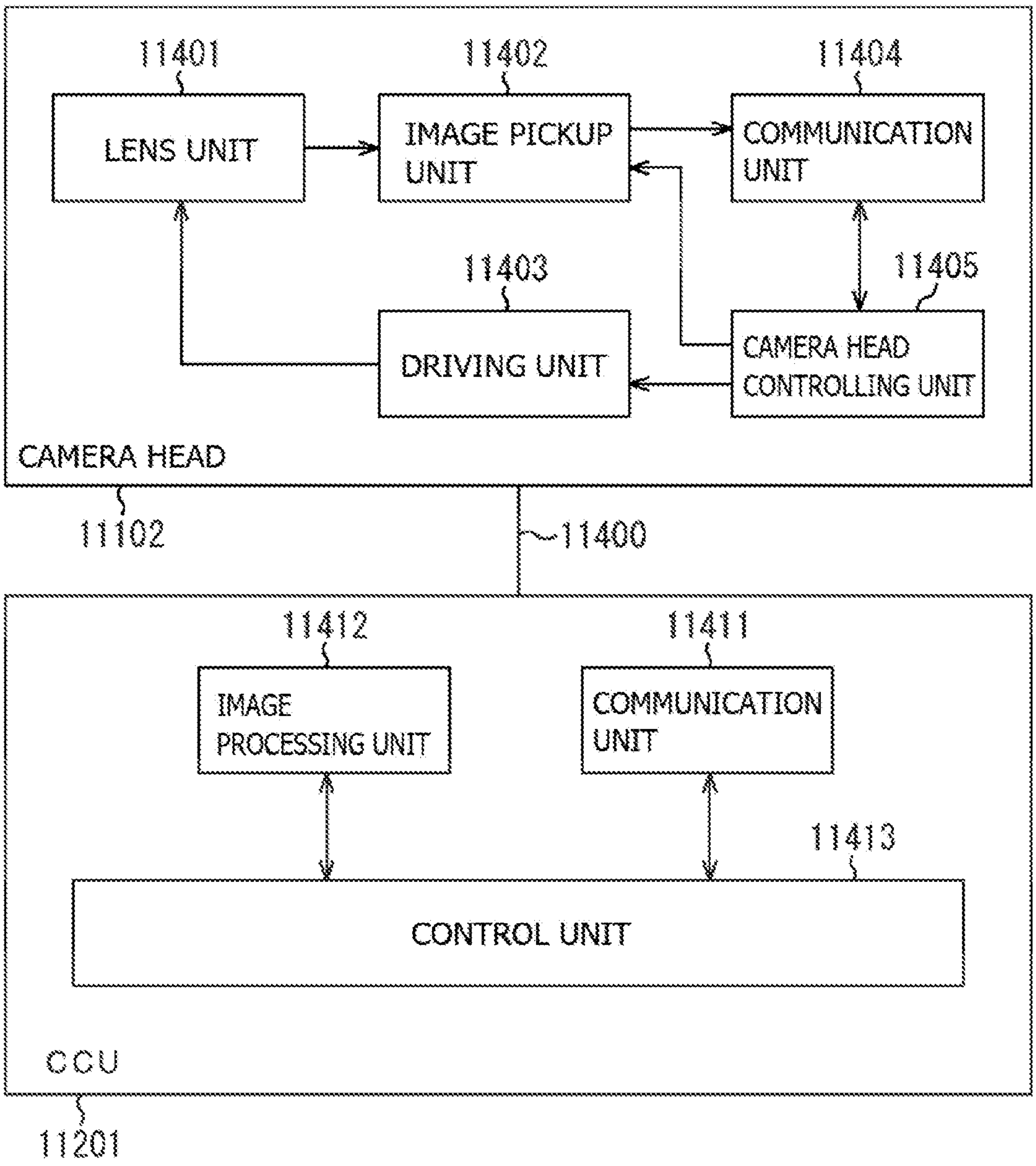

[FIG. 26]
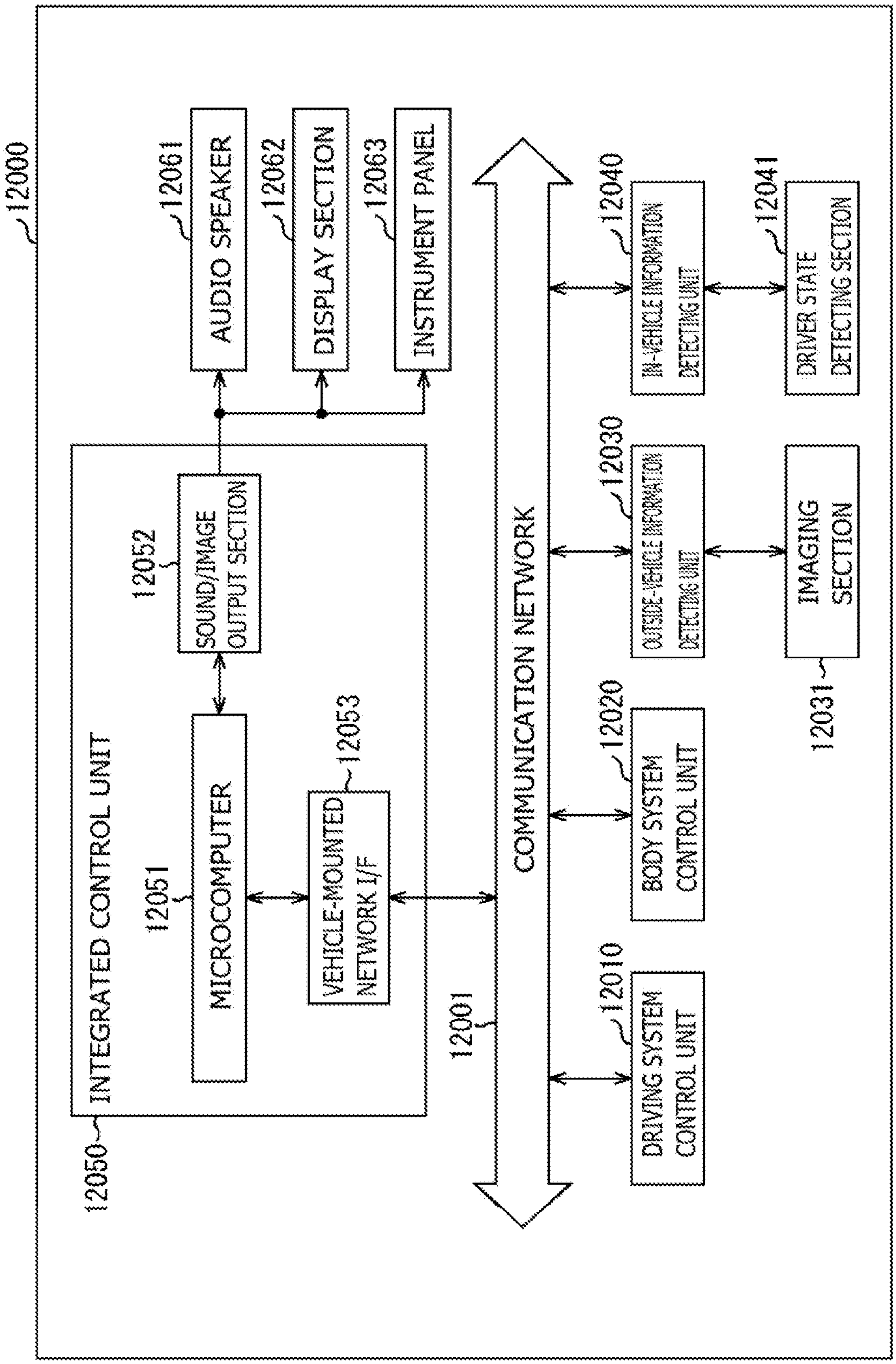

[FIG. 27]
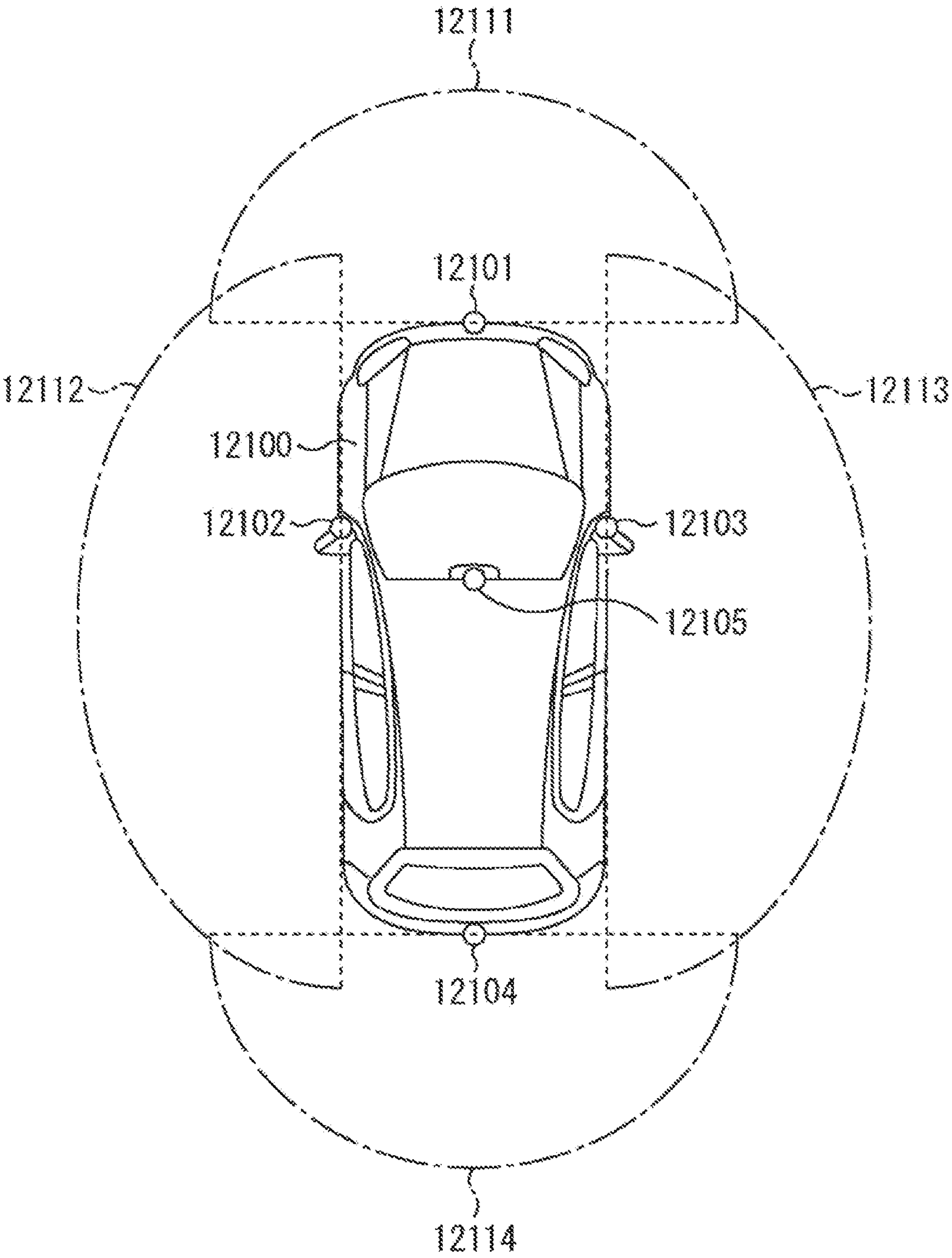

PHOTOELECTRIC CONVERSION DEVICE AND IMAGING MACHINE

CROSS REFERENCE TO RELATED APPLICATIONS

This application is a U.S. National Phase of International Patent Application No. PCT/JP2022/007406 filed on Feb. 22, 2022, which claims priority benefit of Japanese Patent Application No. JP 2021-088808 filed in the Japan Patent Office on May 26, 2021. Each of the above-referenced applications is hereby incorporated herein by reference in its entirety.

TECHNICAL FIELD

The present disclosure relates to a photoelectric conversion device using organic semiconductor and an imaging machine including the photoelectric conversion device.

BACKGROUND ART

PTL 1, for example, discloses a photoelectric conversion device provided, between a photoelectric conversion layer and an electrode, with a hole blocking layer including fullerenes and/or fullerene derivatives and a transparent hole transporting material having an ionization potential that is equal to or higher than 5.5 eV.

CITATION LIST

Patent Literature

PTL 1: Japanese Unexamined Patent Application Publication (Published Japanese Translation of PCT Application) No. JP 2013-236008

SUMMARY OF THE INVENTION

By the way, what is demanded is a photoelectric conversion device used in an imaging machine with improved device characteristics including, for example, reduced dark current, improved external quantum efficiency, and improved photo-responsiveness.

It is desirable to provide a photoelectric conversion device and an imaging machine that make it possible to improve the device characteristics.

A photoelectric conversion device according to an embodiment of the present disclosure includes: a first electrode; a second electrode disposed to face the first electrode; a photoelectric conversion layer provided between the first electrode and the second electrode, the photoelectric conversion layer including fullerenes or fullerene derivatives; a first electric charge block layer provided between the first electrode and the photoelectric conversion layer, the first electric charge block layer including an organic material having a highest occupied molecular orbital (HOMO) level that is deeper by 1 eV or higher and a lowest unoccupied molecular orbital (LUMO) level ranging from 3.7 eV to 4.8 eV inclusive, with respect to a work function of the first electrode; and a second electric charge block layer provided between the first electric charge block layer and the photoelectric conversion layer, the second electric charge block layer including the fullerenes or the fullerene derivatives.

An imaging machine according to the embodiment of the present disclosure includes a plurality of pixels each provided with an imaging device including one or a plurality of photoelectric converters, and includes, as one or a plurality of photoelectric converters, the photoelectric conversion device according to the embodiment of the present disclosure described above.

In the photoelectric conversion device according to the embodiment and the imaging machine according to the embodiment of the present disclosure, the first electric charge block layer including an organic material having the HOMO level that is deeper by 1 eV or higher and the LUMO level ranging from 3.7 eV to 4.8 eV inclusive, with respect to the work function of the first electrode, and the second electric charge block layer including the fullerenes or the fullerene derivatives are provided between the first electrode and the photoelectric conversion layer in this order from the side of the first electrode. Thereby, entry of electrical charges from the first electrode is to be suppressed, and an electron barrier at an interface with the first electrode is to be reduced. Furthermore, occurrence of a dark current at an interface with the photoelectric conversion layer is suppressed, and occurrence of a trap at the interface with the photoelectric conversion layer is reduced.

BRIEF DESCRIPTION OF DRAWING

FIG. 1 is a schematic cross-sectional diagram illustrating an example of a configuration of a photoelectric conversion device according to an embodiment of the present disclosure.

FIG. 2 is a diagram illustrating an example of energy levels of materials forming layers of the photoelectric conversion device illustrated in FIG. 1.

FIG. 3 is a schematic cross-sectional diagram illustrating an example of a configuration of an imaging device using the photoelectric conversion device illustrated in FIG. 1.

FIG. 4 is a schematic plan diagram illustrating an example of a pixel configuration in an imaging machine including the imaging devices illustrated in FIG. 3.

FIG. 5 is an equivalent circuit view of the imaging device illustrated in FIG. 3.

FIG. 6 is a schematic diagram illustrating the disposition of a lower electrode and transistors forming a controller in the imaging device illustrated in FIG. 3.

FIG. 7 is a cross-sectional view for describing a manufacturing method of the imaging device illustrated in FIG. 3.

FIG. 8 is a cross-sectional diagram illustrating a step subsequent to that illustrated in FIG. 7.

FIG. 9 is a cross-sectional diagram illustrating a step subsequent to that illustrated in FIG. 8.

FIG. 10 is a cross-sectional diagram illustrating a step subsequent to that illustrated in FIG. 9.

FIG. 11 is a cross-sectional diagram illustrating a step subsequent to that illustrated in FIG. 10.

FIG. 12 is a cross-sectional diagram illustrating a step subsequent to that illustrated in FIG. 11.

FIG. 13 is a timing chart illustrating an operation example of the imaging device illustrated in FIG. 3.

FIG. 14 is a schematic cross-sectional diagram illustrating an example of a configuration of an imaging device according to Modification Example 1 of the present disclosure.

FIG. 15 is a schematic cross-sectional diagram illustrating an example of a configuration of an imaging device according to Modification Example 2 of the present disclosure.

FIG. 16A is a schematic cross-sectional diagram illustrating an example of a configuration of an imaging device according to Modification Example 3 of the present disclosure.

FIG. 16B is a schematic diagram illustrating a plan configuration of the imaging device illustrated in FIG. 16A.

FIG. 17A is a schematic cross-sectional diagram illustrating an example of a configuration of an imaging device according to Modification Example 4 of the present disclosure.

FIG. 17B is a schematic diagram illustrating a plan configuration of the imaging device illustrated in FIG. 17A.

FIG. 18 is a schematic cross-sectional diagram illustrating another example of the configuration of the imaging device according to Modification Example 2, according to another modification example of the present disclosure.

FIG. 19A is a schematic cross-sectional diagram illustrating another example of the configuration of the imaging device according to Modification Example 3, according to another modification example of the present disclosure.

FIG. 19B is a schematic diagram illustrating a plan configuration of the imaging device illustrated in FIG. 19A.

FIG. 20A is a schematic cross-sectional diagram illustrating another example of the configuration of the imaging device according to Modification Example 4, according to another modification example of the present disclosure.

FIG. 20B is a schematic diagram illustrating a plan configuration of the imaging device illustrated in FIG. 20A.

FIG. 21 is a block diagram illustrating an entire configuration of an imaging machine including the imaging devices illustrated in FIG. 3 and other drawings.

FIG. 22 is a block diagram illustrating an example of a configuration of an electronic apparatus using the imaging machine illustrated in FIG. 21.

FIG. 23A is a schematic diagram illustrating an example of an entire configuration of an optical detection system using the imaging machine illustrated in FIG. 21.

FIG. 23B is a diagram illustrating an example of a circuit configuration of the optical detection system illustrated in FIG. 23A.

FIG. 24 is a view depicting an example of a schematic configuration of an endoscopic surgery system.

FIG. 25 is a block diagram depicting an example of a functional configuration of a camera head and a camera control unit (CCU).

FIG. 26 is a block diagram depicting an example of schematic configuration of a vehicle control system.

FIG. 27 is a diagram of assistance in explaining an example of installation positions of an outside-vehicle information detecting section and an imaging section.

MODES FOR CARRYING OUT THE INVENTION

In the following, some embodiments of the present disclosure will be described in detail with reference to the drawings. It is to be noted that the embodiments described below are specific examples of the present disclosure, and the present disclosure is not limited to the following embodiments. In addition, the arrangement, dimensions, dimension ratios, and the like of components in the present disclosure are not limited to the embodiment illustrated in each drawing. It is to be noted that the description will be given in the following order.

1. Embodiment (example of photoelectric conversion device including hole block layer including layer having predetermined HOMO and LUMO levels and layer including fullerenes or fullerene derivatives)

1-1. Configuration of Photoelectric Conversion Device 1-2. Configuration of Imaging Device 1-3. Manufacturing Method of Imaging Device 1-4. Signal Acquisition Operation of Imaging Device 1-5. Workings and Effects 2. Modification Examples 2-1. Modification Example 1 (another example of configuration of imaging device)

2-2. Modification Example 2 (another example of configuration of imaging device)

2-3. Modification Example 3 (another example of configuration of imaging device)

2-4. Modification Example 4 (another example of configuration of imaging device)

2-5. Modification Example 5 (another modification example of imaging device)

3. Application Examples

4. Practical Examples

5. Implementation Examples

1. Embodiment

FIG. 1 schematically illustrates an example of a cross-sectional configuration of a photoelectric conversion device (a photoelectric conversion device 10) according to an embodiment of the present disclosure. The photoelectric conversion device 10 is used, for example, as an imaging device (an imaging device 1A, see FIG. 3, for example) forming one pixel (a unit pixel P) in an imaging machine (an imaging machine 100, see FIG. 21, for example) such as a complementary metal oxide semiconductor (CMOS) image sensor used in an electronic apparatus such as a digital still camera or a video camera. The photoelectric conversion device 10 has a configuration where a lower electrode 11, a hole block layer 12, a photoelectric conversion layer 13, an electron block layer 14, a work function adjustment layer 15, and an upper electrode 16 are laminated with each other in this order. In the hole block layer 12 according to the present embodiment, a first layer 12A including an organic material having a highest occupied molecular orbital (HOMO) level that is deeper by 1 eV or higher and a lowest unoccupied molecular orbital (LUMO) level ranging from 3.7 eV to 4.8 eV inclusive, with respect to a work function of the lower electrode 11, and a second layer 12B including fullerenes or fullerene derivatives are laminated with each other, from a side of the lower electrode 11.

1-1. Configuration of Photoelectric Conversion Device

The photoelectric conversion device 10 absorbs light corresponding to all or a part of wavelengths falling within selective wavelength regions (for example, a visible light region ranging from 400 nm or higher to below 1300 nm and a near infrared light region) and generates excitors (electron-hole pairs). In the photoelectric conversion device 10, in a case of an imaging device (for example, the imaging device 1A) described later, electrons among the electron-hole pairs generated through photoelectric conversion are read from the side of the lower electrode 11 as signal electric charges, for example. The configuration, the materials, and others of the components will be described below with reference to an example case where electrons are read from the side of the lower electrode 11 as signal electric charges.

The lower electrode 11 (a negative electrode) is, for example, formed into an electrically-conductive film having optical transparency. It is preferable that the lower electrode 11 have the work function ranging from 4.0 eV to 5.5 eV inclusive, and have the LUMO level deeper than the LUMO level of the organic material forming the first layer 12A described later. One example of the configuration material of the lower electrode 11 as described above is indium tin oxide (ITO) such as $In_2O_3$ with tin (Sn) added as a dopant. As to the crystallinity of the thin film of ITO, the crystallinity may be higher or lower (the film comes close to be an amorphous film). In addition to the material described above, other examples of the configuration material of the lower electrode 11 include tin oxide ($SnO_2$) based materials with a dopant added, including ATO with Sb added as a dopant and FTO with fluorine added as a dopant. Furthermore, zinc oxide (ZnO) or a zinc oxide based material with a dopant added may be used. Examples of the ZnO based material include aluminum zinc oxide (AZO) with aluminum (Al) added as a dopant, gallium zinc oxide (GZO) with gallium (Ga) added as a dopant, boron zinc oxide with boron (B) added as a dopant, and indium zinc oxide (IZO) with indium (In) added as a dopant. Furthermore, zinc oxide (IGZO, In—$GaZnO_4$) with indium and gallium added as dopants may be used. In addition, as the configuration material of the lower electrode 11, for example, CuI, $InSbO_4$, ZnMgO, $CuInO_2$, $MgIN_2O_4$, CdO, $ZnSnO_3$, or $TiO_2$ may be used, or spinel type oxide or oxide having an $YbFe_2O_4$ structure may be used.

Furthermore, in a case where optical transparency is not necessary for the lower electrode 11 (for example, in a case where light enters a side of the upper electrode 16), it is possible to use monometal or metal alloy having a lower work function (for example, φ=3.5 eV to 4.5 eV). Specifically, examples include alkali metal (for example, lithium (Li), sodium (Na), and potassium (K)) and fluoride or oxide of such alkali metal and alkali earth metal (for example, magnesium (Mg) and calcium (Ca)) and fluoride or oxide of such alkali earth metal. Other examples include aluminum (Al), Al—Si—Cu metal alloy, zinc (Zn), tin (Sn), thallium (TI), Na—K metal alloy, Al—Li metal alloy, Mg—Ag metal alloy, In, and rare earth metal such as ytterbium (Yb), and metal alloy of such a material.

Furthermore, other examples of the material forming the lower electrode 11 include electrically conductive substances including metal including platinum (Pt), gold (Au), palladium (Pd), chromium (Cr), nickel (Ni), aluminum (Al), silver (Ag), tantalum (Ta), tungsten (W), copper (Cu), titanium (Ti), indium (In), tin (Sn), iron (Fe), cobalt (Co), and molybdenum (Mo), metal alloy containing such a metallic element, electrically conductive particles of such metal, electrically conductive particles of metal alloy containing such metal, polysilicon containing impurities, carbon based materials, oxide semiconductor, carbon nano-tubes, and graphene. Other examples of the material forming the lower electrode 11 include organic materials (electrically conductive high polymer) such as poly-(3,4-ethylenedioxythiophene)/polystyrene sulfonic acid [PEDOT/PSS]. Furthermore, one that such a material as described above and a binder (high polymer) are mixed into the form of paste or ink and then cured may be used as an electrode.

It is possible to form the lower electrode 11 as a single layer film or a laminated film including such a material as described above. A film thickness (hereinafter simply referred to as a thickness) in lamination directions of the lower electrode 11 ranges, for example, from 20 nm to 200 nm inclusive, and preferably ranges from 30 nm to 150 nm inclusive.

The hole block layer 12 selectively transports electrons to the lower electrode 11 and prevents entry of holes from the side of the lower electrode 11, among electric charges generated in the photoelectric conversion layer 13. The hole block layer 12 according to the present embodiment includes two layers of the first layer 12A and the second layer 12B.

The first layer 12A selectively transports electrons to the lower electrode 11 and prevents entry of holes from the lower electrode 11. It is possible to form the first layer 12A by using, for example, an organic material having the HOMO level that is deeper by 1 eV or higher and the LUMO level ranging from 3.7 eV to 4.8 eV inclusive, with respect to the work function of the lower electrode 11. Furthermore, it is preferable that the organic material described above have a band gap that is equal to or higher than 2.6 eV. Furthermore, it is preferable that the organic material described above further have the HOMO level deeper than 6.3 eV. Examples of the organic material described above include chemical compounds expressed by Chemical Formulas (1-1) to (1-27) illustrated below.

[Chemical Formula 1]

(1-1)

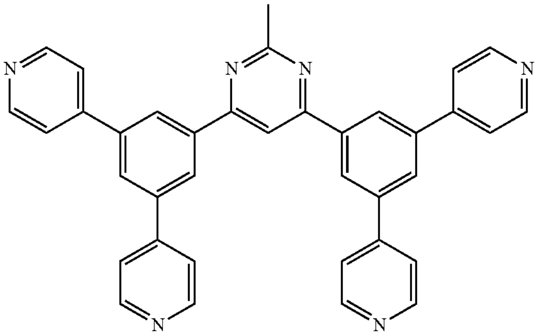

(1-2)

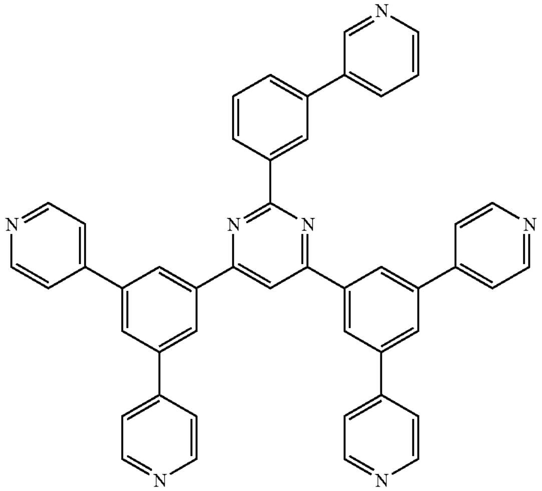

-continued
(1-3)
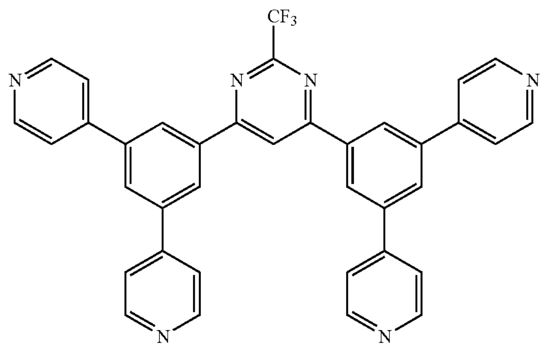
(1-4
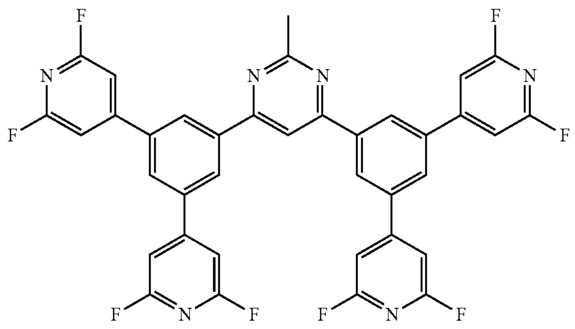
(1-5)
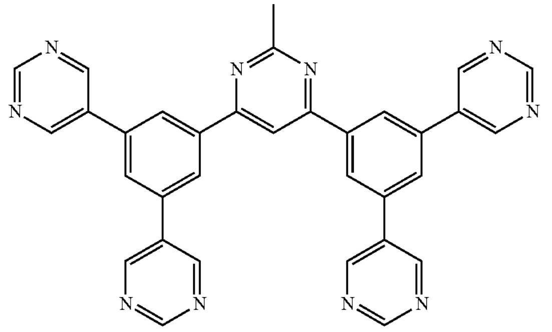
(1-6)
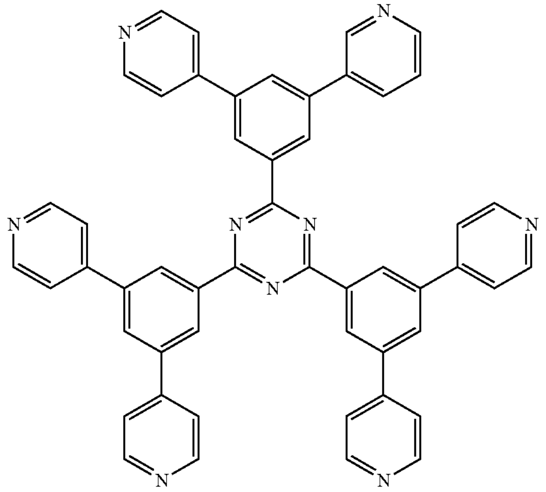
(1-7)
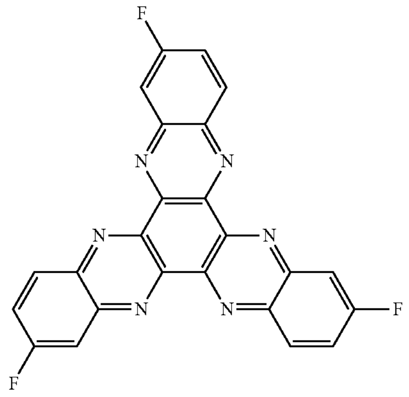
(1-8)
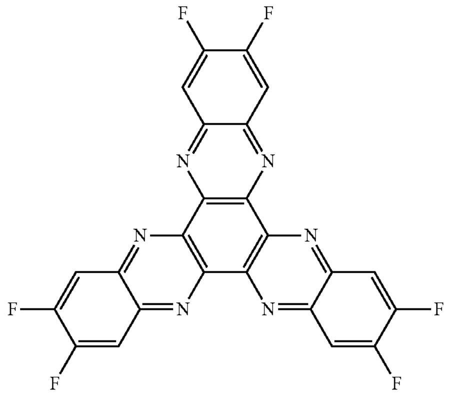
(1-9)
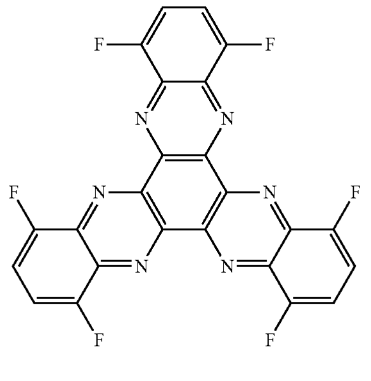
(1-10)
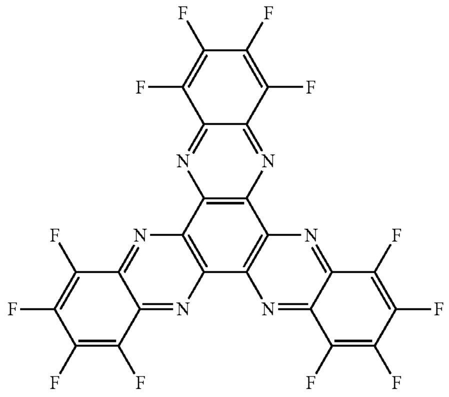

-continued
[Chemical Formula 2]
(1-11)
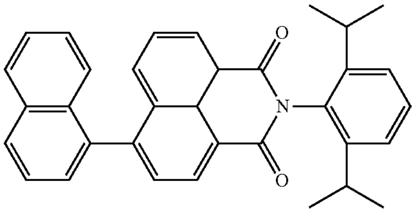
(1-12)
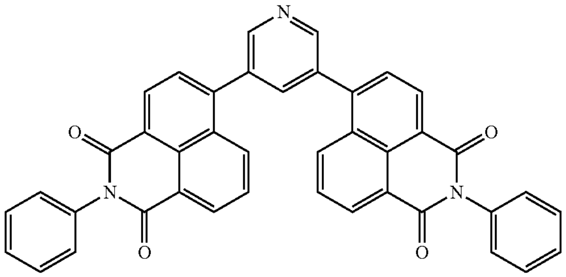
(1-13)
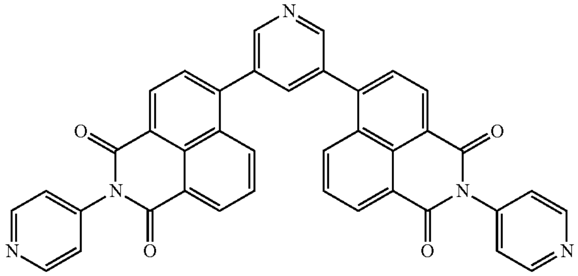
(1-14)
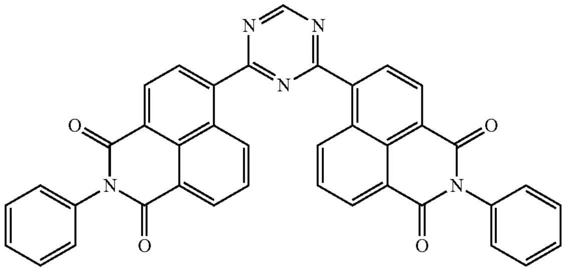
(1-15)
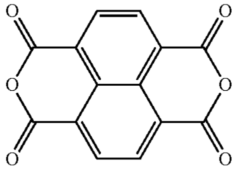
(1-16)
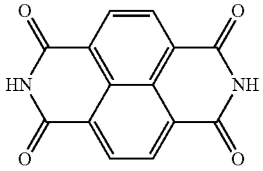
(1-17)
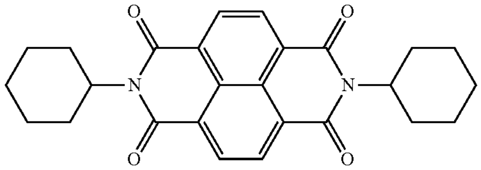
(1-18)
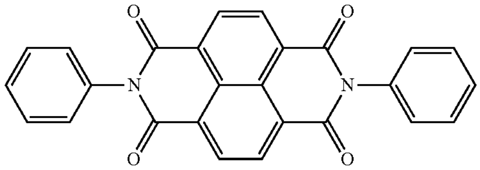
(1-19)
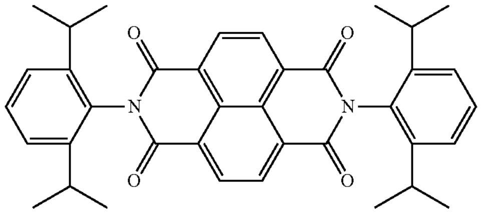

-continued
(1-20)
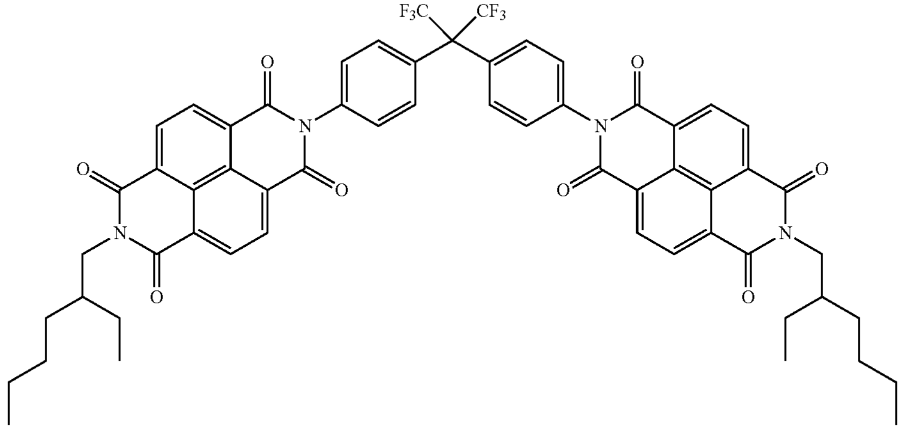
[Chemical Formula 3]
(1-21)
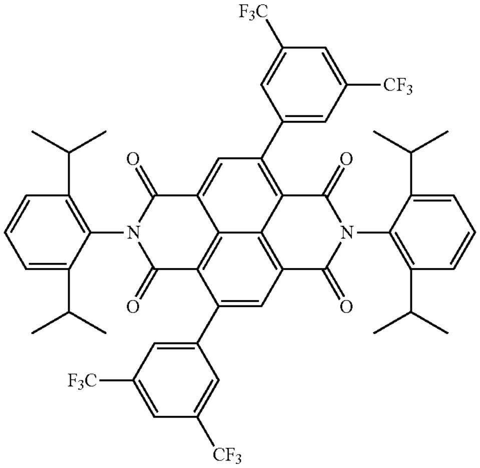
(1-22)
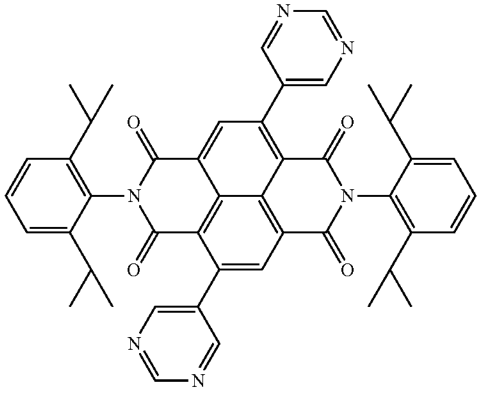
(1-23)
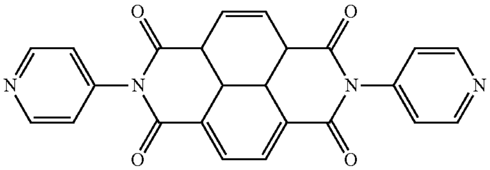
(1-24)
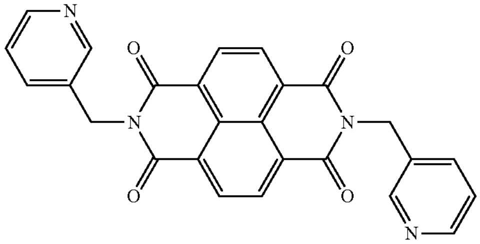
(1-25)
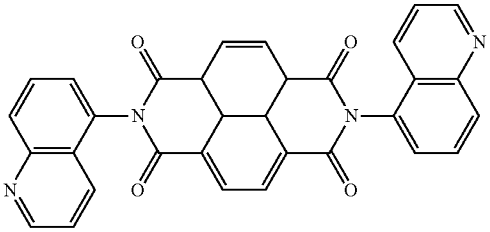
(1-26)
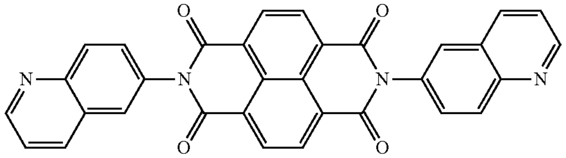
(1-27)
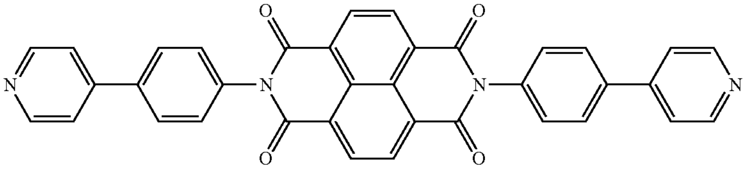

The second layer 12B selectively extracts electrons among electron-hole pairs generated in the photoelectric conversion layer 13 and transports the electrons to the lower electrode 11. It is preferable that, in the second layer 12B, a total state density at or below a level within a gap at an interface with the photoelectric conversion layer 13 be smaller than a total state density at or below a level within a gap in the photoelectric conversion layer 13. It is possible to form the second layer 12B described above by using, for example, an electron transporting material that functions as an electron receptor in the photoelectric conversion layer 13. Specifically, the second layer 12B is formed by using, for example, fullerenes and derivatives of the fullerenes represented by higher fullerenes including fullerenes $C_{60}$, fullerenes $C_{70}$, and fullerenes $C_{74}$, and doped fullerenes, expressed by Chemical Formula (2) illustrated below.

[Chemical Formula 4]

(2)

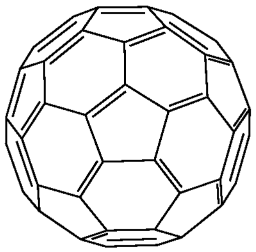

The second layer 12B may further include another material. Other example materials include the chemical compounds expressed by Chemical Formulas (1-1) to (1-27) illustrated above forming the first layer 12A. Furthermore, another example material is a pigment material used in the photoelectric conversion layer 13. Examples of the pigment material include subphthalocyanine derivatives expressed by Chemical Formulas (3-1) to (3-8) illustrated below. Other examples of the pigment material include subphthalocyanine, porphyrin, phthalocyanine, dipyrromethane, azadipyrromethane, dipyridyl, azadipyridyl, cumarin, perylene, perylenediimide, pyrene, naphthalenediimide, quinacridone, xanthene, xanthenoxanthene, phenoxazine, indigo, azo, oxazine, benzodithiophene, naphthodithiophene, anthradithiophene, rubicene, anthracene, tetracene, pentacene, anthraquinone, tetraquinone, pentaquinone, dinaphthothienothiophene, diketopyrrolopyrrole, oligothiopbene, cyanine, merocyanine, squalium, croconium, and boron-dipyromethene (BODIPY) and derivatives of such a material.

[Chemical Formula 5]

(3-1)

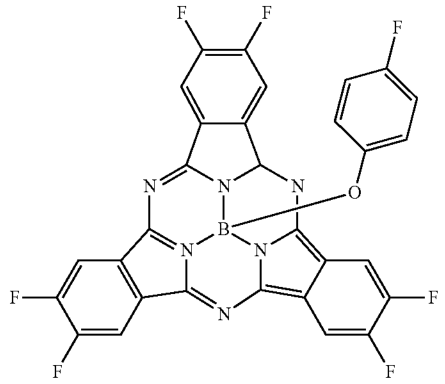

(3-2)

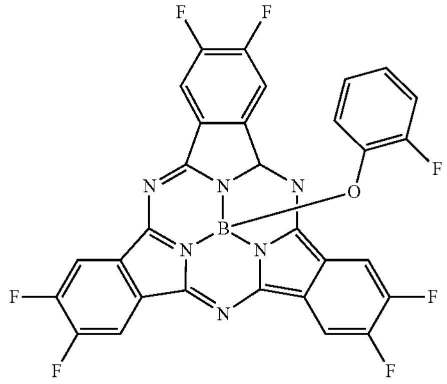

(3-3)

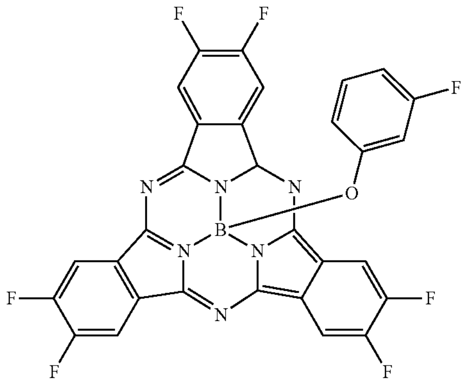

(3-4)

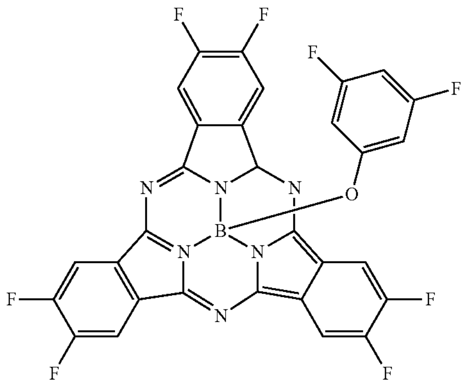

-continued (3-5)

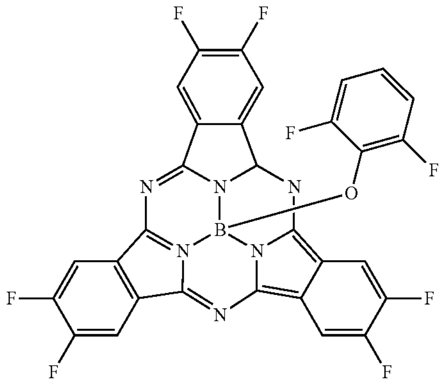

(3-6)

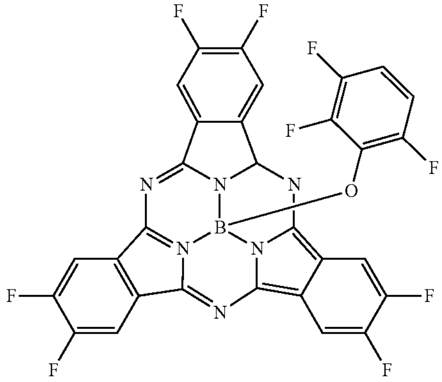

The first layer 12A and the second layer 12B each have a thickness ranging from 1 nm to 30 nm inclusive, for example.

The photoelectric conversion layer 13 absorbs at least 60% or more of predetermined wavelengths falling within the visible light region and the near infrared region, for example, to perform electric charge separation. The photoelectric conversion layer 13 absorbs light corresponding to all or a part of wavelengths falling within the visible light region ranging from 400 nm or higher to below 1300 nm and the near infrared light region, for example. The photoelectric conversion layer 13 includes two or more types of organic materials that each function as a p-type semiconductor or an n-type semiconductor, for example, and has, within the layer, a junction surface (a p/n junction surface) between the p-type semiconductor and the n-type semiconductor. In addition, the photoelectric conversion layer 13 may have a laminated structure of a layer including p-type semiconductor (a p-type semiconductor layer) and a layer including n-type semiconductor (an n-type semiconductor layer) (the p-type semiconductor layer/the n-type semiconductor layer), a laminated structure of a p-type semiconductor layer and a mixed layer (a bulk hetero layer) of p-type semiconductor and n-type semiconductor (the p-type semiconductor layer/the bulk hetero layer), or a laminated structure of an n-type semiconductor layer and a bulk hetero layer (the n-type semiconductor layer/the bulk hetero layer). Furthermore, it may be formed only with a mixed layer (a bulk hetero layer) of p-type semiconductor and n-type semiconductor.

The p-type semiconductor serves as a hole transporting material that relatively functions as an electron donor. The n-type semiconductor serves as an electron transporting material that relatively functions as an electron receptor. The photoelectric conversion layer 13 provides a place where excitors (electron-hole pairs) generated as light is absorbed are separated into electrons and holes. Specifically, electron-hole pairs are separated into electrons and holes at an interface (the p/n junction surface) between the electron donor and the electron receptor.

Example materials of the p-type semiconductor include thienoacene based materials represented by, for example, naphthalene derivatives, anthracene derivatives, phenanthrene derivatives, pyrene derivatives, perylene derivatives, tetracene derivatives, pentacene derivatives, quinacridone derivatives, thiophene derivatives, thienothiophene derivatives, benzothiophene derivatives, benzothienobenzothiophene (BTBT) derivatives, dinaphthothienothiophene (DNTT) derivatives, dianthracenothienothiophene (DATT) derivatives, benzobisbenzothiophene (BBBT) derivatives, thienobisbenzothiophene (TBBT) derivatives, dibenzothienobisbenzothiophene (DBTBT) derivatives, dithienobenzodithiophene (DTBDT) derivatives, dibenzothienodithiophene (DBTDT) derivatives, benzodithiophene (BDT) derivatives, naphthodithiophene (NDT) derivatives, anthracenodithiophene (ADT) derivatives, tetracenodithiophene (TDT) derivatives, and pentacenodithiophene (PDT) derivatives. Other examples of the p-type semiconductor include triphenylamine derivatives, carbazole derivatives, picene derivatives, chrysene derivatives, for example, fluoranthene derivatives, phthalocyanine derivatives, subphthalocyanine derivatives, subporphyrazine derivatives, metal complexes including a heterocyclic ring chemical compound as a ligand, polythiophene derivatives, polybenzothiadiazole derivatives, and polyfluorene derivatives.

Examples of the n-type semiconductor include fullerenes and derivatives of the fullerenes represented by higher fullerenes including fullerene $C_{60}$, fullerene $C_{70}$, and fullerene $C_{74}$, and doped fullerenes. Examples of a substituent included in a fullerene derivative include halogen atoms, straight chain, branched, and cyclic alkyl groups and phenyl groups, groups including straight chain and ring-condensed aromatic chemical compounds, groups including halide, partially fluorinated alkyl groups, perfluoroalkyl groups, silylalkyl groups, silylalkoxy groups, arylsilyl groups, arylsulfanyl groups, alkylsulfanyl groups, arylsulphonyl groups, alkylsulphonyl groups, arylsulfide groups, alkylsulfide groups, amino groups, alkylamino groups, arylamino groups, hydroxy groups, alkoxy groups, acylamino groups, acyloxy groups, carbonyl groups, carboxy groups, carboxoamide groups, carboalkoxy groups, acyl groups, sulphonyl groups, cyano groups, nitro groups, groups including chalcogenide, phosphine groups, phosphonic groups, and derivatives of such materials. Specific examples of the fullerene derivatives include fullerene fluoride, PCBM fullerene chemical compounds, and fullerene multimers. Other example materials of the n-type semiconductor include organic semiconductor having a greater (deeper) HOMO level and a greater (deeper) LUMO level than the HOMO level and the LUMO level of the p-type semiconductor and inorganic metal oxide having optical transparency.

One example material of the n-type organic semiconductor is a heterocyclic ring chemical compound including nitrogen atoms, oxygen atoms, or sulfur atoms. Specific example materials include organic molecules having a molecular framework partially including derivatives including pyridine derivatives, pyrazine derivatives, pyrimidine derivatives, triazine derivatives, quinoline derivatives, quinoxaline derivatives, isoquinoline derivatives, acridine derivatives, phenazine derivatives, phenanthroline derivatives, tetrazole derivatives, pyrazole derivatives, imidazole derivatives, thiazole derivatives, oxazole derivatives, imidazole derivatives, benzimidazole derivatives, benzotriazole derivatives, benzoxazole derivatives, benzoxazole derivatives, carbazole derivatives, benzofuran derivatives, dibenzofuran derivatives, subporphyrazine derivatives, polyphenylenevinylene derivatives, polybenzothiadiazole derivatives, polyfluorene derivatives, organic metal complexes, subphthalocyanine derivatives, quinacridone derivatives, cyanine derivatives, and merocyanine derivatives.

In addition to the p-type semiconductor and the n-type semiconductor, the photoelectric conversion layer 13 may further include an organic material called a pigment material that absorbs light falling within a predetermined wavelength region and allows light falling within another wavelength region to pass through. In a case where the photoelectric conversion layer 13 is formed by using three types of organic materials of p-type semiconductor, n-type semiconductor, and a pigment material, it is preferable that the p-type semiconductor and the n-type semiconductor be formed by using materials each having optical transparency within the visible light region. Thereby, light falling within the wavelength region, which the pigment material absorbs, selectively undergoes photoelectric conversion in the photoelectric conversion layer 13.

The photoelectric conversion layer 13 has, for example, a thickness ranging from 10 nm to 500 nm inclusive, and preferably has a thickness ranging from 100 nm to 400 nm inclusive.

The electron block layer 14 selectively transports holes to the upper electrode 16 and prevents entry of electrons from the side of the upper electrode 16, among electric charges generated in the photoelectric conversion layer 13. Examples of the material forming the electron block layer 14 include thienoacene based materials represented by, for example, naphthalene derivatives, anthracene derivatives, phenanthrene derivatives, pyrene derivatives, perylene derivatives, tetracene derivatives, quinacridone derivatives, thiophene derivatives, thienothiophene derivatives, benzothiophene derivatives, benzothienobenzothiophene (BTBT) derivatives, dinaphthothienothiophene (DNTT) derivatives, benzobisbenzothiophene (BBBT) derivatives, thienobisbenzothiophene (TBBT) derivatives, dibenzothienobisbenzothiophene (DBTBT) derivatives, dithienobenzodithiophene (DTBDT) derivativea, dibenzothienodithiophene (DBTDT) derivatives, benzodithiophene (BDT) derivatives, naphthodithiophene (NDT) derivatives, and anthracenodithiophene (ADT) derivatives. Other examples of the material forming the p-type semiconductor include fluorene derivatives, triphenylene derivatives, triphenylamine derivatives, carbazole derivatives, picene derivatives, and chrysene derivatives.

The electron block layer 14 has, for example, a thickness ranging from 5 nm to 100 nm inclusive, and preferably has a thickness ranging from 5 nm to 50 nm inclusive. More preferably, the electron block layer 14 has a thickness ranging from 5 nm to 20 nm inclusive.

The work function adjustment layer 15 has greater electron affinity or a greater work function than a work function of the upper electrode 16, electrically improving ease of joining between the electron block layer 14 and the upper electrode 16. One example material forming the work function adjustment layer 15 is dipyrazino [2,3-f:2',3'v-h] quinoxaline-2,3,6,7,10,11-hexacarbonitrile (HAT-CN). Other examples of the material forming the work function adjustment layer 15 include PEDOT/PSS, polyaniline, and metal oxide including $MoO_x$, $RuO_x$, $VO_x$, and $WO_x$.

The upper electrode 16 (a positive electrode) is, similar to the lower electrode 11, for example, formed into an electrically-conductive film having optical transparency. One example of the configuration material of the upper electrode 16 is indium tin oxide (ITO) such as $In_2O_3$ with tin (Sn) added as a dopant. As to the crystallinity of the thin film of ITO, the crystallinity may be higher or lower (the film comes close to be an amorphous film). In addition to the material described above, other examples of the configuration material of the lower electrode 11 include tin oxide ($SnO_2$) based materials with a dopant added, including ATO with Sb added as a dopant and FTO with fluorine added as a dopant. Furthermore, zinc oxide (ZnO) or a zinc oxide based material with a dopant added may be used. Examples of the ZnO based material include aluminum zinc oxide (AZO) with aluminum (Al) added as a dopant, gallium zinc oxide (GZO) with gallium (Ga) added as a dopant, boron zinc oxide with boron (B) added as a dopant, and indium zinc oxide (IZO) with indium (In) added as a dopant. Furthermore, zinc oxide (IGZO, In—$GaZnO_4$) with indium and gallium added as dopants may be used. In addition, as the configuration material of the lower electrode 11, for example, CuI, $InSbO_4$, ZnMgO, $CuInO_2$, $MgIN_2O_4$, CdO, $ZnSnO_3$, or $TiO_2$ may be used, or spinel type oxide or oxide having an $YbFe_2O_4$ structure may be used.

Furthermore, in a case where optical transparency is not necessary for the upper electrode 16, it is possible to use monometal or metal alloy having a higher work function (for example, φ=4.5 eV to 5.5 eV). Specific examples include Au, Ag, Cr, Ni, Pd, Pt, Fe, iridium (Ir), germanium (Ge), osmium (Os), rhenium (Re), telluride (Te), and metal alloy of such a material.

Furthermore, other examples of the material forming the upper electrode 16 include electrically conductive substances including metal including Pt, Au, Pd, Cr, Ni, Al, Ag, Ta, W, Cu, Ti, In, Sn, Fe, Co, and Mo, metal alloy containing such a metallic element, electrically conductive particles of such metal, electrically conductive particles of metal alloy containing such metal, polysilicon containing impurities, carbon based materials, oxide semiconductor, carbon nanotubes, and graphene. Other examples of the material forming the upper electrode 16 include organic materials (electrically conductive high polymer) including PEDOT/PSS. Furthermore, one that such a material as described above and a binder (high polymer) are mixed into the form of paste or ink and then cured may be used as an electrode.

It is possible to form the upper electrode 16 as a single layer film or a laminated film including such a material as described above. A thickness of the upper electrode 16 ranges, for example, from 20 nm to 200 nm inclusive, and preferably ranges from 30 nm to 150 nm inclusive.

Note that another layer may further be provided between the lower electrode 11 and the upper electrode 16 in addition to the hole block layer 12, the photoelectric conversion layer 13, the electron block layer 14, and the work function adjustment layer 15. For example, an under-coating layer may be provided between the lower electrode 11 and the photoelectric conversion layer 13 in addition to the hole block layer 12.

FIG. 2 illustrates an example of energy levels of materials forming the layers (the lower electrode 11, the hole block layer 12, and the photoelectric conversion layer 13) of the photoelectric conversion device 10 illustrated in FIG. 1. Light entered the photoelectric conversion device 10 is absorbed in the photoelectric conversion layer 13. Excitors (electron-hole pairs) generated through this absorption undergo excitor separation, that is, are dissociated into electrons and holes at the interface (the p/n junction surface) between the p-type semiconductor and the n-type semiconductor forming the photoelectric conversion layer 13. Carriers (the electrons and the holes) generated at this time are respectively transported to the electrodes that differ from each other due to diffusion based on a concentration difference in the carriers and an internal electric field based on a difference in work function between the positive electrode and the negative electrode. The carriers are then detected as photoelectric currents. Specifically, the electrons separated at the p/n junction surface are extracted from the lower electrode 11 via the hole block layer 12. The holes separated at the p/n junction surface are extracted from the upper electrode 16 via the electron block layer 14 and the work function adjustment layer 15. Note that it is possible to control directions of transporting electrons and holes by applying an electric potential between the lower electrode 11 and the upper electrode 16.

1-2. Configuration of Imaging Device

FIG. 3 schematically illustrates an example of a cross-sectional configuration of the imaging device (the imaging device 1A) using the photoelectric conversion device 10 described above. FIG. 4 schematically illustrates an example of a plan configuration of the imaging device 1A illustrated in FIG. 3. FIG. 3 illustrates a cross section taken along the line I-I illustrated in FIG. 4. The imaging device 1A serves as one pixel (the unit pixel P) repeatedly disposed into an array in a pixel portion 100A of the imaging machine 100 illustrated in FIG. 21, for example. In the pixel portion 100A, a pixel unit 1*a* including four pixels disposed in two rows×two columns serves as a repetition unit, as illustrated in FIG. 4, for example. The pixel units 1*a* are repeatedly disposed into an array extending in row directions and column directions.

The imaging device 1A is a so-called vertical direction spectroscopy type where one photoelectric converter formed by using an organic material for selectively detecting light falling within wavelength regions that differ from each other to perform photoelectric conversion, for example, and two photoelectric converters (photoelectric conversion regions 32B and 32R) each including an inorganic material, for example, are laminated with each other in vertical directions. It is possible to use the photoelectric conversion device 10 described above as a photoelectric converter forming the imaging device 1A. The photoelectric converter will be described below as one that is similar in configuration to the photoelectric conversion device 10 described above, applied with an identical reference numeral, that is, 10.

In the imaging device 1A, the photoelectric converter 10 is provided on a side of a rear face (a first surface 30S1) of a semiconductor substrate 30. The photoelectric conversion regions 32B and 32R are formed in a buried manner in the semiconductor substrate 30, and are laminated with each other in thickness directions of the semiconductor substrate 30.

The photoelectric converter 10 and the photoelectric conversion regions 32B and 32R selectively detect light falling within wavelength regions that differ from each other to perform photoelectric conversion. In the photoelectric converter 10, a color signal of green (G) is acquired, for example. In the photoelectric conversion regions 32B and 32R, color signals of blue (B) and red (R) are respectively acquired based on a difference in absorption coefficient. In the imaging device 1A, it is thereby possible to acquire a plurality of types of color signals in one pixel without using a color filter.

Note that the described below is a case where, in the imaging device 1A, electrons among electron-hole pairs generated through photoelectric conversion are to be read as signal electric charges. Furthermore, "+(plus)" added to "p" and "n" in the drawings indicates that a concentration of impurities in the p-type or n-type semiconductor is higher.

The semiconductor substrate 30 includes an n-type silicon (Si) substrate, for example, and has a p-well 31 in a predetermined region. On a second surface (a front surface of the semiconductor substrate 30) 30S2 in the p-well 31 is provided with, for example, various types of floating diffusions (floating diffusion layers) FD (for example, FD1, FD2, and FD3) and various types of transistors Tr (for example, a vertical transistor (transfer transistor) Tr2, a transfer transistor Tr3, an amplifier transistor (modulation device) AMP, and a reset transistor RST). The second surface 30S2 of the semiconductor substrate 30 is further provided with a multi-layered wiring layer 40 via a gate insulation layer 33. The multi-layered wiring layer 40 has, for example, a configuration where wiring layers 41, 42, and 43 are laminated with each other in an insulation layer 44. Furthermore, a peripheral circuit (not illustrated) including a logic circuit, for example, is provided in a periphery of the semiconductor substrate 30.

A protective layer 51 is provided on the photoelectric converter 10. In the protective layer 51, for example, wiring lines electrically coupling the upper electrode 16 and a peripheral circuit section with each other are provided around a light shielding film 53 and the pixel portion 100A. Optical members including a flattening layer (not illustrated) and an on-chip lens 52L are further disposed on the protective layer 51.

Note that, in FIG. 3, a side of the first surface 30S1 of the semiconductor substrate 30 is illustrated as a light-incident surface S1, and a side of the second surface 30S2 is illustrated as a wiring layer side S2.

The configuration, materials, and others of the components will now be described herein in detail.

In the photoelectric converter 10, the hole block layer 12 (the first layer 12A and the second layer 12B), the photoelectric conversion layer 13, the electron block layer 14, and the work function adjustment layer 15 are laminated with each other in this order between the lower electrode 11 and the upper electrode 16 disposed to face each other. In the imaging device 1A, the lower electrode 11 includes a plurality of electrodes (for example, two types of electrodes of a reading electrode 11A and accumulation electrodes 11B). Between the lower electrode 11 and the hole block layer 12, for example, an insulation layer 17 and a semiconductor layer 18 are laminated with each other in this order. In the lower electrode 11, the reading electrode 11A is electrically coupled to the semiconductor layer 18 via an opening 17H provided in the insulation layer 17.

The reading electrode 11A transfers electric charges generated in the photoelectric conversion layer 13 to the floating diffusion FD1, and is coupled to the floating diffusion FD1 via an upper second contact 24B, a pad 39B, an upper first contact 29A, a pad 39A, a through electrode 34, a coupler 41A, and a lower second contact 46, for example. The accumulation electrodes 11B accumulate, in the semiconductor layer 18, electrons among the electric charges generated in the photoelectric conversion layer 13 as signal electric charges. The accumulation electrodes 11B are provided to face light receiving surfaces of the photoelectric conversion regions 32B and 32R formed in the semiconductor substrate 30, in a region covering the light receiving surfaces. It is preferable that the accumulation electrodes 11B be each larger than the reading electrode 11A, thereby making it possible to accumulate a large amount of electric charges. The accumulation electrodes 11B are each coupled with a voltage applier 54 via wiring lines coupled to an upper third contact 24C and a pad 39C, as illustrated in FIG. 6, for example.

The insulation layer 17 electrically separates the accumulation electrodes 11B and the semiconductor layer 18 from each other. The insulation layer 17 is provided on an interlayer insulation layer 23 to cover the lower electrode 11, for example. The insulation layer 17 is a single layer film containing one type of or a laminated film containing two or more types of silicon oxide ($SiO_x$), silicon nitride ($SiN_x$), and silicon oxynitride ($SiO_xN_y$), for example. A thickness of the insulation layer 17 ranges from 20 nm to 500 nm inclusive, for example.

The semiconductor layer 18 accumulates signal electric charges generated in the photoelectric conversion layer 13. It is preferable that the semiconductor layer 18 be formed by using a material in which mobility of electric charges is higher and a band gap is greater than those of the photoelectric conversion layer 13. For example, it is preferable that the band gap of the configuration material of the semiconductor layer 18 be 3.0 eV or higher. Examples of such a material include oxide semiconductor including IGZO and organic semiconductor. Examples of the organic semiconductor include transition metal di-chalcogenide, silicon carbide, diamond, graphene, carbon nano-tubes, condensed polycyclic hydrocarbon chemical compounds, and condensed heterocyclic ring chemical compounds. A thickness of the semiconductor layer 18 ranges from 10 nm to 300 nm inclusive, for example. Providing the semiconductor layer 18 including such a material between the lower electrode 11 and the photoelectric conversion layer 13 makes it possible to prevent electric charges from recombining while the electric charges are accumulated, improving the transfer efficiency.

Note that FIG. 3 has illustrated an example where the semiconductor layer 18, the hole block layer 12 (the first layer 12A and the second layer 12B), the photoelectric conversion layer 13, the electron block layer 14, the work function adjustment layer 15, and the upper electrode 16 are provided as a continuous layer common to a plurality of pixels (the unit pixels P, see FIG. 21). However, the present disclosure is not limited to the example. For example, the semiconductor layer 18, the hole block layer 12, the photoelectric conversion layer 13, the electron block layer 14, the work function adjustment layer 15, and the upper electrode 16 may be separately formed per the unit pixel P.

Between the semiconductor substrate 30 and the lower electrode 11, for example, a layer having fixed electric charges (a fixed electric charge layer) 21, a dielectric layer 22 having electrically insulating property, and the interlayer insulation layer 23 are provided in this order from the side of the first surface 30S1 of the semiconductor substrate 30.

The fixed electric charge layer 21 may be a film having positive fixed electric charges or a film having negative fixed electric charges. As to the configuration material of the fixed electric charge layer 21, it is preferable that the fixed electric charge layer 21 be formed by using semiconductor or an electrically conductive material having a band gap wider than the band gap of the semiconductor substrate 30. It is thereby possible to suppress occurrence of a dark current at the interface with the semiconductor substrate 30. Examples of the configuration material of the fixed electric charge layer 21 include hafnium oxide ($HfO_x$), aluminum oxide ($AlO_x$), zirconium oxide ($ZrO_x$), tantalum oxide ($TaO_x$), titanium oxide ($TiO_x$), lanthanum oxide ($LaO_x$), praseodymium oxide ($PrO_x$), cerium oxide ($CeO_x$), neodymium oxide ($NdO_x$), promethium oxide ($PmO_x$), samarium oxide ($SmO_x$), europium oxide ($EuO_x$), gadolinium oxide ($GdO_x$), terbium oxide ($TbO_x$), dysprosium oxide ($DyO_x$), holmium oxide ($HoO_x$), thulium oxide ($TmO_x$), ytterbium oxide ($YbO_x$), lutetium oxide ($LuO_x$), yttrium oxide ($YO_x$), hafnium nitride ($HfN_x$), aluminum nitride ($AlN_x$), hafnium oxinitride ($HfO_xN_y$), and aluminum oxynitride ($AlO_xN_y$).

The dielectric layer 22 prevents light from reflecting, which occurs due to a difference in refraction factor between the semiconductor substrate 30 and the interlayer insulation layer 23. As to the configuration material of the dielectric layer 22, a preferable material is one having an intermediate refraction factor falling within a range between the refraction factor of the semiconductor substrate 30 and the refraction factor of the interlayer insulation layer 23. Examples of the configuration material of the dielectric layer 22 include $SiO_x$, TEOS, $SiN_x$, and $SiO_xN_y$.

The interlayer insulation layer 23 is a single layer film containing one type of or a laminated film containing two or more types of $SiO_x$, $SiN_x$, and $SiO_xN_y$, for example.

A shield electrode 28 is provided on the interlayer insulation layer 23 together with the lower electrode 11. The shield electrode 28 prevents capacitive coupling from occurring between the pixel units 1*a* adjacent to each other. For example, the shield electrode 28 is provided around the pixel unit 1*a* including four pixels disposed in two rows×two columns. The shield electrode 28 is applied with a fixed electric potential. The shield electrode 28 further extends, in the pixel unit 1*a*, between the pixels adjacent to each other in the row directions and the column directions.

The photoelectric conversion regions 32B and 32R include positive-intrinsic-negative (PIN) type photodiodes to each have a p-n junction in a predetermined region in the semiconductor substrate 30, for example. The photoelectric conversion regions 32B and 32R make it possible to utilize such a fact that, in a silicon substrate, wavelength regions in which light is absorbed differ depending on an incident depth of the light to split the light in the vertical directions.

The photoelectric conversion region 32B selectively detects blue light and accumulates signal electric charges corresponding to blue, and is formed to have a depth making it possible to efficiently photoelectrically convert the blue light. The photoelectric conversion region 32R selectively detects red light and accumulates signal electric charges corresponding to red, and is formed to have a depth making it possible to efficiently photoelectrically convert the red light. Note that blue (B) is a color corresponding to a wavelength region ranging from 400 nm or higher to below 495 nm, for example, and red (R) is a color corresponding to a wavelength region ranging from 620 nm or higher to below 750 nm, for example. It is sufficient that the photoelectric conversion regions 32B and 32R be each able to detect light within a partial wavelength region or a whole wavelength region in each of the wavelength regions.

The photoelectric conversion region 32B and the photoelectric conversion region 32R each have a p+ region serving as a hole accumulation layer and an n region serving as an electron accumulation layer (have a p-n-p laminated structure), specifically, as illustrated in FIG. 3, for example. The n region in the photoelectric conversion region 32B is coupled to the vertical transistor Tr2. The p+ region in the photoelectric conversion region 32B bends along the vertical transistor Tr2 and is coupled to the p+ region in the photoelectric conversion region 32R.

The gate insulation layer 33 is a single layer film containing one type of or a laminated film containing two or more types of, $SiO_x$, $SiN_x$, and $SiO_xN_y$, for example.

The through electrode 34 is provided between the first surface 30S1 and the second surface 30S2 of the semiconductor substrate 30. The through electrode 34 functions as a connector between the photoelectric converter 10 and a gate Gamp of the amplifier transistor AMP and the floating diffusion FD1, and serves as a transmission path for electric charges generated in the photoelectric converter 10. A reset gate Grst of the reset transistor RST is disposed next to the floating diffusion FD1 (one of source/drain regions, i.e., a source/drain region 36B, of the reset transistor RST). The reset transistor RST thereby makes it possible to reset electric charges accumulated in the floating diffusion FD1.

An upper end of the through electrode 34 is coupled to the reading electrode 11A via the pad 39A, an upper first contact 24A, a pad electrode 38B, and the upper second contact 24B provided in the interlayer insulation layer 23, for example. A lower end of the through electrode 34 is coupled to the coupler 41A in the wiring layer 41. The coupler 41A and the gate Gamp of the amplifier transistor AMP are coupled to each other via a lower first contact 45. The coupler 41A and the floating diffusion FD1 (the region 36B) are coupled to each other via the lower second contact 46, for example.

It is possible to form the upper first contact 24A, the upper second contact 24B, the upper third contact 24C, the pads 39A, 39B, and 39C, the wiring layers 41, 42, and 43, the lower first contact 45, the lower second contact 46, and a gate wiring layer 47 by using, for example, a doped silicon material such as phosphorus doped amorphous silicon (PDAS) or a metal material such as Al, W, Ti, Co, Hf, or Ta.

The insulation layer 44 is a single layer film containing one type of or a laminated film containing two or more types of $SiO_x$, $SiN_x$, and $SiO_xN_y$, for example.

The protective layer 51 and the on-chip lens 52L each include a material having optical transparency, for example, and are each a single layer film containing one type of or a laminated film containing two or more types of $SiO_x$, $SiN_x$, and $SiO_xN_y$, for example. A thickness of the protective layer 51 ranges from 100 nm to 30000 nm inclusive, for example.

The light shielding film 53 is provided to cover a region of a reading electrode 21A that is in direct contact with the semiconductor layer 18, excluding at least the accumulation electrodes 11B, for example. It is possible to form the light shielding film 53 by using W, Al, or metal alloy of Al and Cu, for example.

FIG. 5 is an equivalent circuit view of the imaging device 1A illustrated in FIG. 3. FIG. 6 schematically illustrates the disposition of the lower electrode 11 and the transistors forming the controller in the imaging device 1A illustrated in FIG. 3.

The reset transistor RST (a reset transistor TR1rst) resets electric charges transferred from the photoelectric converter 10 to the floating diffusion FD1, and includes a MOS transistor, for example. Specifically, the reset transistor TR1rst includes the reset gate Grst, a channel formation region 36A, and the source/drain region 36B and a source/drain region 36C. The reset gate Grst is coupled to a reset line RST1. The one of the source/drain regions, i.e., the source/drain region 36B, of the reset transistor TR1rst also serves as the floating diffusion FD1. The other one of the source/drain regions, i.e., the source/drain region 36C, forming the reset transistor TR1rst is coupled to a power line VDD.

The amplifier transistor AMP is a modulation device that modulates an amount of electric charges generated in the photoelectric converter 10 into a voltage, and includes a MOS transistor, for example. Specifically, the amplifier transistor AMP includes the gate Gamp, a channel formation region 35A, and source/drain regions 35B and 35C. The gate Gamp is coupled to the reading electrode 11A and the one of the source/drain regions, i.e., the source/drain region 36B (the floating diffusion FD1), of the reset transistor TR1rst via the lower first contact 45, the coupler 41A, the lower second contact 46, and the through electrode 34, for example. Furthermore, one of the source/drain regions, i.e., the source/drain region 35B, shares its region with the other one of the source/drain regions, i.e., the source/drain region 36C, forming the reset transistor TR1rst, and is coupled to the power line VDD.

A selection transistor SEL (a selection transistor TR1sel) includes a gate Gsel, a channel formation region 34A, and source/drain regions 34B and 34C. The gate Gsel is coupled to a selection line SEL1. One of the source/drain regions, i.e., the source/drain region 34B, shares its region with the other one of the source/drain regions, i.e., the source/drain region 35C, forming the amplifier transistor AMP. The other one of the source/drain regions, i.e., the source/drain region 34C, is coupled to a signal line (data output line) VSL1.

The transfer transistor TR2 (a transfer transistor TR2trs) transfers signal electric charges corresponding to blue, which are generated and accumulated in the photoelectric conversion region 32B, to the floating diffusion FD2. Since the photoelectric conversion region 32B is formed at a deeper position from the second surface 30S2 in the semiconductor substrate 30, it is preferable that the transfer transistor TR2trs in the photoelectric conversion region 32B include a vertical transistor. The transfer transistor TR2trs is coupled to a transfer gate line TG2. The floating diffusion FD2 is provided in a region 37C near a gate Gtrs2 of the transfer transistor TR2trs. Electric charges accumulated in the photoelectric conversion region 32B are read at the floating diffusion FD2 via a transfer channel formed along the gate Gtrs2.

The transfer transistor TR3 (a transfer transistor TR3trs) transfers signal electric charges corresponding to red, which are generated and accumulated in the photoelectric conversion region 32R, to the floating diffusion FD3, and includes a MOS transistor, for example. The transfer transistor TR3trs is coupled to a transfer gate line TG3. The floating diffusion FD3 is provided in a region 38C near a gate Gtrs3 of the transfer transistor TR3trs. Electric charges accumulated in the photoelectric conversion region 32R are read at the floating diffusion FD3 via a transfer channel formed along the gate Gtrs3.

On the side of the second surface 30S2 of the semiconductor substrate 30, a reset transistor TR2rst, an amplifier transistor TR2amp, and a selection transistor TR2sel forming a controller of the photoelectric conversion region 32B are further provided. Furthermore, a reset transistor TR3rst, an amplifier transistor TR3amp, and a selection transistor TR3sel forming a controller of the photoelectric conversion region 32R are provided.

The reset transistor TR2rst includes a gate, a channel formation region, and source/drain regions. The gate of the reset transistor TR2rst is coupled to a reset line RST2. One of the source/drain regions of the reset transistor TR2rst is coupled to the power line VDD. The other one of the source/drain regions of the reset transistor TR2rst also serves as the floating diffusion FD2.

The amplifier transistor TR2amp includes a gate, a channel formation region, and source/drain regions. The gate is coupled to the other one of the source/drain regions (the floating diffusion FD2) of the reset transistor TR2rst. The one of the source/drain regions forming the amplifier transistor TR2amp shares its region with the one of the source/drain regions forming the reset transistor TR2rst, and is coupled to the power line VDD.

The selection transistor TR2sel includes a gate, a channel formation region, and source/drain regions. The gate is coupled to a selection line SEL2. The one of the source/drain regions forming the selection transistor TR2sel shares its region with the other one of the source/drain regions forming the amplifier transistor TR2amp. The other one of the source/drain regions forming the selection transistor TR2sel is coupled to a signal line (a data output line) VSL2.

The reset transistor TR3rst includes a gate, a channel formation region, and source/drain regions. The gate of the reset transistor TR3rst is coupled to a reset line RST3. One of the source/drain regions forming the reset transistor TR3rst is coupled to the power line VDD. The other one of the source/drain regions forming the reset transistor TR3rst also serves as the floating diffusion FD3.

The amplifier transistor TR3amp includes a gate, a channel formation region, and source/drain regions. The gate is coupled to the other one of the source/drain regions (the floating diffusion FD3) forming the reset transistor TR3rst. One of the source/drain regions forming the amplifier transistor TR3amp shares its region with the one of the source/drain regions forming the reset transistor TR3rst, and is coupled to the power line VDD.

The selection transistor TR3sel includes a gate, a channel formation region, and source/drain regions. The gate is coupled to a selection line SEL3. One of the source/drain regions forming the selection transistor TR3sel shares its region with the other one of the source/drain regions forming the amplifier transistor TR3amp. The other one of the source/drain regions forming the selection transistor TR3sel is coupled to a signal line (data output line) VSL3.

The reset lines RST1, RST2, and RST3, the selection lines SEL1, SEL2, and SEL3, and the transfer gate lines TG2 and TG3 are respectively coupled to a vertical driving circuit forming a driving circuit. The signal lines (data output lines) VSL1, VSL2, and VSL3 are coupled to column signal processing circuits 112 forming the driving circuit.

1-3. Manufacturing Method of Imaging Device

It is possible to manufacture the imaging device 1A according to the present embodiment as described below, for example.

FIGS. 7 to 12 illustrate the manufacturing method of the imaging device 1A in a stepwise manner. As illustrated in FIG. 8, the p-well 31 is first formed in the semiconductor substrate 30, for example. The n-type photoelectric conversion regions 32B and 32R are then formed in the p-well 31, for example. A p+ region is formed near the first surface 30S1 of the semiconductor substrate 30.

After an n+ region serving as the floating diffusions FD1 to FD3 is formed on the second surface 30S2 of the semiconductor substrate 30, as illustrated in FIG. 7, similarly, for example, the gate insulation layer 33 and the gate wiring layer 47 including the gates of the transfer transistor Tr2, the transfer transistor Tr3, the selection transistor SEL, the amplifier transistor AMP, and the reset transistor RST are formed. Thereby, the transfer transistor Tr2, the transfer transistor Tr3, the selection transistor SEL, the amplifier transistor AMP, and the reset transistor RST are formed. Furthermore, the multi-layered wiring layer 40 including the wiring layers 41 to 43 including the lower first contact 45, the lower second contact 46, and the coupler 41A and the insulation layer 44 is formed on the second surface 30S2 of the semiconductor substrate 30.

As a base body of the semiconductor substrate 30, for example, a silicon on insulator (SOI) substrate in which the semiconductor substrate 30, a buried oxide film (not illustrated), and a retaining substrate (not illustrated) are laminated with each other is used. Although not illustrated in FIG. 7, the buried oxide film and the retaining substrate are joined to the first surface 30S1 of the semiconductor substrate 30. After performing ion implantation, annealing is performed.

Next, a support substrate (not illustrated) or another base body such as a semiconductor base body is joined to the multi-layered wiring layer 40 provided on the side of the second surface 30S2 of the semiconductor substrate 30. The joined body is then turned upside down. Next, the semiconductor substrate 30 is separated from the buried oxide film and the retaining substrate of the SOI substrate to allow the first surface 30S1 of the semiconductor substrate 30 to be exposed. It is possible to perform the steps described above with a technique used in a normal CMOS process including ion implantation and a chemical vapor deposition (CVD) method.

Next, as illustrated in FIG. 8, for example, dry-etching is used to process the semiconductor substrate 30 from the side of the first surface 30S1 to form an annular opening 34H, for example. The opening 34H has a depth passing through the semiconductor substrate 30 from the first surface 30S1 to the second surface 30S2 and reaching the coupler 41A, as illustrated in FIG. 9, for example.

Next, the negative fixed electric charge layer 21 and the dielectric layer 22 are formed in order on the first surface 30S1 of the semiconductor substrate 30 and a side surface of the opening 34H, for example. It is possible to form the fixed electric charge layer 21 by forming an $HfO_x$ film using an atomic layer deposition method (ALD method), for example. It is possible to form the dielectric layer 22 by forming a $SiO_x$ film using a plasma CVD method, for example. Next, the pad 39A in which barrier metal in the form of a laminated film of titanium and titanium nitride (a Ti/TiN film) and a W film are laminated with each other is formed at a predetermined position on the dielectric layer 22, for example. After that, the interlayer insulation layer 23 is formed on the dielectric layer 22 and the pad 39A. A chemical mechanical polishing (CMP) method is used to flatten the surface of the interlayer insulation layer 23.

Next, after an opening 23H1 is formed on the pad 39A as illustrated in FIG. 9, an electrically conductive material such as Al is buried into the opening 23H1 to form the upper first contact 24A, for example. Next, after the pads 39B and 39C are formed, similar to the pad 39A, as illustrated in FIG. 9, the interlayer insulation layer 23, the upper second contact 24B, and the upper third contact 24C are formed in order.

Next, after an electrically-conductive film 11X is formed using a sputtering method on the interlayer insulation layer 23, as illustrated in FIG. 10, for example, a photo-lithography technique is used to perform patterning. Specifically, after a photo-resist PR is formed at a predetermined position on the electrically-conductive film 11X, dry-etching or wet-etching is used to process the electrically-conductive film 11X1. After that, by removing the photo-resist PR, the reading electrode 11A and the accumulation electrodes 11B are formed, as illustrated in FIG. 11.

Next, the insulation layer 17, the semiconductor layer 18, the hole block layer 12 (the first layer 12A and the second layer 12B), the photoelectric conversion layer 13, the electron block layer 14, the work function adjustment layer 15, and the upper electrode 16 are formed in order, as illustrated in FIG. 12. As to the insulation layer 17, after the ALD method is used to form a $SiO_x$ film, the CMP method is used to flatten the surface of the insulation layer 17, for example. After that, wet-etching is used to form the opening 17H on the reading electrode 11A, for example. It is possible to form the semiconductor layer 18 by using the sputtering method, for example. The hole block layer 12 (the first layer 12A and the second layer 12B), the photoelectric conversion layer 13, the electron block layer 14, and the work function adjustment layer 15 are formed by using a vacuum deposition method, for example. The upper electrode 16 is formed by using the sputtering method, similar to the lower electrode 11, for example. Finally, the protective layer 51, the light shielding film 53, and the on-chip lens 52L are disposed on the upper electrode 16. As described above, the imaging device 1A illustrated in FIG. 3 is completed.

Note that, for the hole block layer 12 (the first layer 12A and the second layer 12B), the photoelectric conversion layer 13, the electron block layer 14, and the work function adjustment layer 15, it is desirable to continuously form the layers using a vacuum process (a vacuum consistent process). Furthermore, it is possible to form the organic layers including the hole block layer 12 (the first layer 12A and the second layer 12B), the photoelectric conversion layer 13, the electron block layer 14, and the work function adjustment layer 15 and the electrically-conductive films including the lower electrode 11 and the upper electrode 16, for example, by using a dry film forming method or a wet film forming method. Examples of the dry film forming method include, in addition to the vacuum deposition method using resistance heating or high-frequency heating, an electron beam (EB) deposition method, a various types of sputtering methods (a magnetron sputtering method, an RF-DC combined type bias sputtering method, an ECR sputtering method, a facing type target sputtering method, and a high-frequency sputtering method), an ion plating method, a laser ablation method, a molecular beam epitaxy method, and a laser transfer method. Other examples of the dry film forming method include chemical vapor deposition methods including a plasma CVD method, a thermal CVD method, an MOCVD method, and a photo CVD method. Examples of the wet film forming method include a spin coating method, an ink jet method, a spray coating method, a stamping method, a micro-contact printing method, a flexo printing method, an offset printing method, a gravure printing method, and a dipping method.

As to patterning, it is possible to use, in addition to the photo-lithography technique, chemical etching including shadow masking and laser transfer and physical etching using ultraviolet light and laser beam, for example. As the flattening technique, it is possible to use a laser flattening method and a reflow method, for example, in addition to the CMP method.

1-4. Signal Acquisition Operation of Imaging Device)

In the imaging device 1A, after light has entered the photoelectric converter 10 via the on-chip lens 52L, the light passes through the photoelectric converter 10 and the photoelectric conversion regions 32B and 32R in order. The light is meanwhile photoelectrically converted into the colors of green, blue, and red. Signal acquisition operation for each color will now be described herein.

Acquisition of Green Color Signal by Photoelectric Converter 10

Green light (G) included in the light that has entered the imaging device 1A is first selectively detected (absorbed) in the photoelectric converter 10. The detected (absorbed) green light (G) is then photoelectrically converted.

The photoelectric converter 10 is coupled to the gate Gamp of the amplifier transistor AMP and the floating diffusion FD1 via the through electrode 34. Therefore, electrons among excitors generated in the photoelectric converter 10 are extracted from the side of the lower electrode 11. The electrons are transferred to the side of the second surface 30S2 of the semiconductor substrate 30 via the through electrode 34. The electrons are thus accumulated in the floating diffusion FD1. Simultaneously, the amplifier transistor AMP modulates an amount of the electric charges generated in the photoelectric converter 10 into a voltage.

Furthermore, the reset gate Grst of the reset transistor RST is disposed next to the floating diffusion FD1. Thereby, the electric charges accumulated in the floating diffusion FD1 are reset by the reset transistor RST.

Since the photoelectric converter 10 is coupled to not only the amplifier transistor AMP, but also the floating diffusion FD1, via the through electrode 34, it is possible to further easily reset the electric charges accumulated in the floating diffusion FD1 by the reset transistor RST.

In contrast, in a case where the through electrode 34 and the floating diffusion FD1 are not coupled to each other, it is difficult to reset electric charges accumulated in the floating diffusion FD1. In this case, it is necessary to apply a large voltage to extract the electric charges to the side of the upper electrode 16. This may therefore result in a damage to a photoelectric conversion layer 24. Furthermore, such a structure that makes it possible to perform resetting for a short period of time may lead to an increase in noise during dark time, resulting in a trade-off relationship. It is thus difficult to apply such a structure.

FIG. 13 illustrates an operation example of the imaging device 1A. In (A), it is indicated an electric potential in each of the accumulation electrodes 11B. In (B), it is indicated an electric potential in the floating diffusion FD1 (the reading electrode 11A). In (C), it is indicated an electric potential at the gate (Gsel) of the reset transistor TR1rst. In the imaging device 1A, a voltage is individually applied to the reading electrode 11A and the accumulation electrodes 11B respectively.

In the imaging device 1A, an electric potential V1 is applied from the driving circuit to the reading electrode 11A, and an electric potential V2 is applied to the accumulation electrodes 11B during an accumulation period. Note herein that the electric potentials V1 and V2 are set to V2>V1. Thereby, electric charges (signal electric charges; electrons) generated through photoelectric conversion are attracted to the accumulation electrodes 11B, and accumulated in a region on the semiconductor layer 18 facing the accumulation electrodes 11B (accumulation period). Incidentally, a value of an electric potential in the region on the semiconductor layer 18 facing the accumulation electrodes 11B becomes a negative value as time of photoelectric conversion passes by. Note that holes are transferred from the upper electrode 16 to the driving circuit.

In the imaging device 1A, reset operation is performed in a later stage in the accumulation period. Specifically, at a timing t1, a scanner causes a voltage of a reset signal RST to change from a low level to a high level. Thereby, in the unit pixel P, the reset transistor TR1rst is turned into an on state. As a result, a voltage in the floating diffusion FD1 is set to a power supply voltage, resetting the voltage in the floating diffusion FD1 (resetting period).

After the reset operation is completed, electric charges are read. Specifically, at a timing t2, an electric potential V3 is applied from the driving circuit to the reading electrode 11A, and an electric potential V4 is applied to the accumulation electrodes 11B. Note herein that the electric potentials V3 and V4 are set to V3<V4. Thereby, the electric charges accumulated in the regions corresponding to the accumulation electrodes 11B are read from the reading electrode 11A to the floating diffusion FD1. That is, the electric charges accumulated in the semiconductor layer 18 are read by the controller (transferring period).

After the reading operation is completed, the electric potential V1 is again applied from the driving circuit to the reading electrode 11A, and the electric potential V2 is applied to the accumulation electrodes 11B. Thereby, the electric charges generated through photoelectric conversion are attracted to the accumulation electrodes 11B. The electric charges are thus accumulated in a region on the photoelectric conversion layer 24 facing the accumulation electrodes 11B (accumulation period).

Acquisition of Blue Color Signal and Red Color Signal in Photoelectric Conversion Regions 32B and 32R Next, blue light (B) included in the light having passed through the photoelectric converter 10 is absorbed in the photoelectric conversion region 32B, and red light (R) is absorbed in the photoelectric conversion region 32R respectively in order. The absorbed light then undergoes photoelectric conversion. In the photoelectric conversion region 32B, electrons corresponding to the entered blue light (B) are accumulated in the n region in the photoelectric conversion region 32B. The accumulated electrons are transferred by the transfer transistor Tr2 to the floating diffusion FD2. Similarly, in the photoelectric conversion region 32R, electrons corresponding to the entered red light (R) are accumulated in the n region in the photoelectric conversion region 32R. The accumulated electrons are transferred by the transfer transistor Tr3 to the floating diffusion FD3.

(1-5. Workings and Effects)

In the photoelectric conversion device 10 according to the present embodiment, the hole block layer 12 including the first layer 12A including an organic material having the HOMO level that is deeper by 1 eV or higher and the LUMO level ranging from 3.7 eV to 4.8 eV inclusive, with respect to the work function of the lower electrode 11, and the second layer 12B including fullerenes or fullerene derivatives is provided between the lower electrode 11 and the photoelectric conversion layer 13. Thereby, entry of holes from the lower electrode 11 is to be suppressed, and an electron barrier at the interface with the lower electrode 11 is to be reduced. Furthermore, occurrence of a dark current at the interface with the photoelectric conversion layer 13 is suppressed, and occurrence of a trap at the interface with the photoelectric conversion layer 13 is reduced. These workings and effects will now be described herein.

What is demanded is a photoelectric conversion device used, as an imaging device forming each pixel, in a CMOS image sensor or a similar image sensor used in an electronic apparatus such as a digital still camera or a video camera with a preferable S/N ratio between a photoelectric current and a dark current and a higher response speed. In the photoelectric conversion device described above, for example, a hole blocking layer including fullerenes and/or fullerene derivatives and a transparent hole transporting material having an ionization potential equal to or higher than 5.5 eV is provided between a photoelectric conversion layer and an electrode to improve its sensitivity, S/N ratio, and response speed.

However, it is difficult to say that the photoelectric conversion device described above has sufficient characteristics regarding dark current, external quantum efficiency, and after-image characteristics. One presumed reason is that, although there are improvements in the efficiency of extracting electrons and reduction of a trap to be generated at the interface between the photoelectric conversion layer and the hole blocking layer, suppression of entry of holes from the electrode and a barrier at the interface between the electrode and the hole blocking layer have not yet been fully taken into account.

In response to this, in the present embodiment, the hole block layer 12 has a laminated structure of the first layer 12A and the second layer 12B, the first layer 12A including an organic material having the HOMO level that is deeper by 1 eV or higher and the LUMO level ranging from 3.7 eV to 4.8 eV inclusive, with respect to the work function of the lower electrode 11, is disposed on the side of the lower electrode 11, and the second layer 12B including fullerenes or fullerene derivatives is disposed on the side of the photoelectric conversion layer 13. Thereby, entry of holes from the lower electrode 11 is to be suppressed, and an electron barrier at the interface with the lower electrode 11 is to be reduced. Furthermore, occurrence of a dark current at the interface with the photoelectric conversion layer 13 is suppressed, and occurrence of a trap at the interface with the photoelectric conversion layer is reduced.

In the photoelectric conversion device 10 according to the present embodiment, it is possible to improve the device characteristics, as described above.

In the photoelectric conversion device 10 according to the present embodiment, for example, entry of holes from the lower electrode 11 is to be suppressed, and coming out of electric charges from the interface between the hole block layer 12 and the photoelectric conversion layer is to be reduced, making it possible to reduce a dark current. Furthermore, in the photoelectric conversion device 10 according to the present embodiment, electron barriers at the interface between the lower electrode 11 and the hole block layer 12 and the interface between the photoelectric conversion layer 13 and the hole block layer 12 are reduced, making it possible to improve the efficiency of extracting electrons, that is, the external quantum efficiency. Furthermore, in the photoelectric conversion device 10 according to the present embodiment, occurrence of a trap at the interface between the hole block layer 12 and the photoelectric conversion layer 13 is reduced, making it possible to improve the photo-responsiveness.

Next, Modification Examples 1 to 5 of the present disclosure will now be described herein. Note that like reference numerals designate identical or corresponding components to the components of the photoelectric conversion device 10 and the imaging device 1A according to the embodiment described above. The description of the components is thus omitted.

2. Modification Examples

2-1. Modification Example 1

FIG. 14 schematically illustrates a cross-sectional configuration of an imaging device 1B according to Modification Example 1 of the present disclosure. The imaging device 1B is, similar to the imaging device 1A according to the embodiment described above, for example, an imaging device such as a CMOS image sensor used in an electronic apparatus such as a digital still camera or a video camera. The imaging device 1B according to the present modification example differs from one according to the embodiment described above in that the lower electrode 11 is one electrode provided per the unit pixel P.

In the imaging device 1B, similar to the imaging device 1A described above, one photoelectric converter 10 and two photoelectric conversion regions 32B and 32R are laminated with each other in the vertical directions per the unit pixel P. The photoelectric converter 10 corresponds to the photoelectric conversion device 10 described above, and is provided on the side of the rear face (a first surface 30A) of the semiconductor substrate 30. The photoelectric conversion regions 32B and 32R are formed in a buried manner in the semiconductor substrate 30, and are laminated with each other in the thickness directions of the semiconductor substrate 30.

The imaging device 1B according to the present modification example has, as described above, a configuration similar to the configuration of the imaging device 1A described above, excluding that the lower electrode 11 of the photoelectric converter 10 is one electrode, and the insulation layer 17 and the semiconductor layer 18 are not provided between the lower electrode 11 and the hole block layer 12.

As described above, the configuration of the photoelectric converter 10 is not limited to the configuration of the imaging device 1A according to the embodiment described above. Even with the configuration of the photoelectric converter 10 of the imaging device 1B according to the present modification example, it is possible to acquire effects similar to the effects of one according to the embodiment described above.

2-2. Modification Example 2

FIG. 15 schematically illustrates a cross-sectional configuration of an imaging device 1C according to Modification Example 2 of the present disclosure. The imaging device 1C is, similar to the imaging device 1A according to the embodiment described above, for example, an imaging device such as a CMOS image sensor used in an electronic apparatus such as a digital still camera or a video camera. In the imaging device 1C according to the present modification example, two photoelectric converters 10 and 80 and one photoelectric conversion region 32 are laminated with each other in the vertical directions.

The photoelectric converters 10 and 80 and the photoelectric conversion region 32 respectively selectively detect light falling within wavelength regions that differ from each other to perform photoelectric conversion. For example, the photoelectric converter 10 acquires a color signal of green (G). For example, the photoelectric converter 80 acquires a color signal of blue (B). For example, the photoelectric conversion region 32 acquires a color signal of red (R). Thereby, the imaging device 1C makes it possible to acquire a plurality of types of color signals in one pixel without using a color filter.

The photoelectric converters 10 and 80 each have a configuration similar to the configuration of the imaging device 1A according to the embodiment described above. Specifically, in the photoelectric converter 10, similar to the imaging device 1A, the lower electrode 11, the hole block layer 12 (the first layer 12A and the second layer 12B), the photoelectric conversion layer 13, the electron block layer 14, the work function adjustment layer 15, and the upper electrode 16 are laminated with each other in this order. The lower electrode 11 includes a plurality of electrodes (for example, the reading electrode 11A and the accumulation electrodes 11B). Between the lower electrode 11 and the hole block layer 12, the insulation layer 17 and the semiconductor layer 18 are laminated with each other in this order. In the lower electrode 11, the reading electrode 11A is electrically coupled to the semiconductor layer 18 via the opening 17H provided in the insulation layer 17. In the photoelectric converter 80, similar to the photoelectric converter 10, a lower electrode 81, a hole block layer 82 (a first layer 82A and a second layer 82B), a photoelectric conversion layer 83, an electron block layer 84, a work function adjustment layer 85, and an upper electrode 86 are also laminated with each other in this order. The lower electrode 81 includes a plurality of electrodes (for example, a reading electrode 81A and an accumulation electrode 81B). Between the lower electrode 81 and the hole block layer 82 (the first layer 82A and the second layer 82B), an insulation layer 87 and a semiconductor layer 88 are laminated with each other in this order. In the lower electrode 81, the reading electrode 81A is electrically coupled to the semiconductor layer 88 via an opening 87H provided in the insulation layer 87. Note that either the semiconductor layer 18 or the semiconductor layer 88 or both the semiconductor layer 18 and the semiconductor layer 88 may be omitted.

The reading electrode 81A is coupled with a through electrode 91 that is passing through an interlayer insulation layer 89 and the photoelectric converter 10 and that is electrically coupled to the reading electrode 11A of the photoelectric converter 10. Furthermore, the reading electrode 81A is electrically coupled to the floating diffusion FD provided on the semiconductor substrate 30 via the through electrodes 34 and 91 and is able to temporarily accumulate electric charges generated in the photoelectric conversion layer 83. Furthermore, the reading electrode 81A is electrically coupled to the amplifier transistor AMP, for example, provided on the semiconductor substrate 30 via the through electrodes 34 and 91.

2-3. Modification Example 3

FIG. 16A schematically illustrates a cross-sectional configuration of an imaging device 1D according to Modification Example 3 of the present disclosure. FIG. 16B schematically illustrates an example of a plan configuration of the imaging device 1D illustrated in FIG. 16A. FIG. 16A illustrates a cross section taken along the line II-II illustrated in FIG. 16B. The imaging device 1D is, for example, a lamination type imaging device in which the photoelectric conversion region 32 and a photoelectric converter 60 are laminated with each other. In the pixel portion 100A of an imaging machine (for example, the imaging machine 100) equipped with the imaging devices 1D, the pixel unit 1*a* including four pixels disposed in two rows×two columns serves as a repetition unit, as illustrated in FIG. 16B, for example. The pixel units 1*a* are repeatedly disposed into an array extending in the row directions and the column directions.

In the imaging device 1D according to the present modification example, color filters 55 allowing red light (R), green light (G), and blue light (B) to selectively pass through are each provided per the unit pixel P above the photoelectric converter 60 (the light incident side S1). Specifically, in the pixel unit 1*a* including four pixels disposed in two rows×two columns, two color filters allowing green light (G) to selectively pass through are disposed on one diagonal line, and one color filter allowing red light (R) to selectively pass through and one color filter allowing blue light (B) to selectively pass through are disposed on another diagonal line orthogonal to the one diagonal line. In the unit pixels (Pr, Pg, and Pb) provided with the color filters, respectively, the photoelectric converter 60 detects light of corresponding colors, for example. That is, in the pixel portion 100A, the pixels (Pr, Pg, and Pb) respectively detecting red light (R), green light (G), and blue light (B) are disposed in a Bayer form.

The photoelectric converter 60 absorbs light corresponding to all or a part of wavelengths falling within the visible light region ranging from 400 nm or higher to below 750 nm to generate excitors (electron-hole pairs), for example. In the photoelectric converter 60, a lower electrode 61, an insulation layer (an interlayer insulation layer 67), a semiconductor layer 68, a hole block layer 62 (a first layer 62A and a second layer 62B), a photoelectric conversion layer 63, an electron block layer 64, a work function adjustment layer 65, and an upper electrode 66 are laminated with each other in this order. The lower electrode 61, the interlayer insulation layer 67, the semiconductor layer 68, the hole block layer 62 (the first layer 62A and the second layer 62B), the photoelectric conversion layer 63, the electron block layer 64, the work function adjustment layer 65, and the upper electrode 66 are respectively have configurations similar to the configurations of the lower electrode 11, the insulation layer 17, the semiconductor layer 18, the hole block layer 12, the photoelectric conversion layer 13, the electron block layer 14, the work function adjustment layer 15, and the upper electrode 16 of the imaging device 1A according to the embodiment described above. The lower electrode 61 includes a reading electrode 61A and accumulation electrodes 61B that are independent of each other, for example. The reading electrode 61A is shared among the four pixels, for example. Note that the semiconductor layer 68 may be omitted.

The photoelectric conversion region 32 detects an infrared light region ranging from 750 nm to 1300 nm inclusive, for example.

In the imaging device 1D, light falling within the visible light region (red light (R), green light (G), and blue light (B)) included in light that has passed through the color filters 55 are respectively absorbed by the photoelectric converter 60 including the unit pixels (Pr, Pg, and Pb) respectively provided with the color filters. The remaining light such as light (infrared light (IR)) falling within the infrared light region (ranging from 750 nm to 1000 nm inclusive, for example) passes through the photoelectric converter 60. The infrared light (IR) that has passed through the photoelectric converter 60 is detected in the photoelectric conversion regions 32 in the unit pixels Pr, Pg, and Pb. In the unit pixels Pr, Pg, and Pb, signal electric charges corresponding to the infrared light (IR) are generated. That is, in the imaging machine 100 equipped with the imaging devices 1D, it is possible to simultaneously generate both a visible light image and an infrared light image.

Furthermore, in the imaging machine 100 equipped with the imaging devices 1D, it is possible to acquire a visible light image and an infrared light image at an identical position in directions within an XZ plane. Therefore, it is possible to achieve a highly integrated configuration in the directions within the XZ plane.

2-4. Modification Example 4

FIG. 17A schematically illustrates a cross-sectional configuration of an imaging device 1E according to Modification Example 4 of the present disclosure. FIG. 17B schematically illustrates an example of a plan configuration of the imaging device 1E illustrated in FIG. 17A. FIG. 17A illustrates a cross section taken along the line III-III illustrated in FIG. 17B. Modification Example 3 described above has illustrated an example where the color filters 55 are provided above the photoelectric converter 60 (on the light incident side S1). However, the color filters 55 may be provided between the photoelectric conversion region 32 and the photoelectric converter 60, as illustrated in FIG. 17A, for example.

The imaging device 1E has a configuration where, as the color filters 55, a color filter (a color filter 55R) allowing at least red light (R) to selectively pass through and a color filter (a color filter 55B) allowing at least blue light (B) to selectively pass through are disposed on different diagonal lines orthogonal to each other in the pixel unit 1*a*, for example. The photoelectric converter 60 (the photoelectric conversion layer 63) is configured to selectively absorb light having wavelengths corresponding to green light (G), for example. The photoelectric conversion region 32R selectively absorbs light having wavelengths corresponding to red light (R). The photoelectric conversion region 32B selectively absorbs light having wavelengths corresponding to blue light (B). Thereby, in the photoelectric conversion regions 32 (the photoelectric conversion regions 32R and 32B) respectively disposed below the photoelectric converter 60 and the color filters 55R and 55B, it is possible to acquire a signal corresponding to red light (R), green light (G), or blue light (B). In the imaging device 1E according to the present modification example, it is possible to expand an area of each of the photoelectric converters respectively corresponding to RGB larger than the area of that in an ordinary photoelectric conversion device having a Bayer arrangement. It is therefore possible to improve the S/N ratio.

2-5. Modification Example 5

FIG. 18 illustrates another example (an imaging device 1F) of the cross-sectional configuration of the imaging device 1C according to Modification Example 2, according to another modification example of the present disclosure. FIG. 19A schematically illustrates another example (an imaging device 1G) of the cross-sectional configuration of the imaging device 1D according to Modification Example 3, according to still another modification example of the present disclosure. FIG. 19B schematically illustrates an example of a plan configuration of the imaging device 1G illustrated in FIG. 19A. FIG. 20A schematically illustrates another example (an imaging device 1H) of the cross-sectional configuration of the imaging device 1E according to Modification Example 4, according to still another modification example of the present disclosure. FIG. 20B schematically illustrates an example of a plan configuration of the imaging device 1H illustrated in FIG. 20A.

Modification Examples 2 to 4 described above have illustrated examples where the lower electrodes 11, 61, and 81 forming the photoelectric converters 60 and 80 each include a plurality of electrodes (the reading electrodes 11A, 61A, and 81A and the accumulation electrodes 11B, 61B, and 81B). However, the present disclosure is not limited to the examples. It is possible to apply the imaging devices 1C, 1D, and 1E according to Modification Examples 2 to 4 in a case where a lower electrode includes one electrode per the unit pixel P, similar to Modification Example 1 described above, making it possible to acquire effects similar to the effects of Modification Examples 2 to 4 described above.

3. Application Examples

Application Example 1

FIG. 21 illustrates an example of an entire configuration of an imaging machine (the imaging machine 100) equipped with the imaging devices illustrated in FIG. 3 and other drawings (for example, the imaging devices 1A).

The imaging machine 100 is a CMOS image sensor that takes up incident light (image light) from an object via an optical lens system (not illustrated), converts an amount of light of the incident light formed into an image on an imaging surface into an electric signal in pixel unit, and outputs the converted electric signal as a pixel signal, for example. The imaging machine 100 has the pixel portion 100A serving as an imaging area on the semiconductor substrate 30, and further includes, in a peripheral region of the pixel portion 100A, a vertical driving circuit 111, the column signal processing circuits 112, a horizontal driving circuit 113, an output circuit 114, a control circuit 115, and an input-and-output terminal 116, for example.

The pixel portion 100A includes the plurality of unit pixels P disposed in a two-dimensional matrix, for example. In each of the unit pixels P, a pixel drive line Lread (specifically, a row selection line and a reset control line) is wired per pixel row, and a vertical signal line Lsig is wired per pixel column, for example. The pixel drive lines Lread transmit drive signals for reading signals from the pixels. One end of each of the pixel drive lines Lread is coupled to an output end, which corresponds to each row, of the vertical driving circuit 111.

The vertical driving circuit 111 includes a shift register and an address decoder, for example, to serve as a pixel driver driving each of the unit pixels P in the pixel portion 100A in a unit of row, for example. The signals outputted from the unit pixels P in the pixel rows having undergone selective scanning by the vertical driving circuit 111 are respectively supplied to the column signal processing circuits 112 via the vertical signal lines Lsig. The column signal processing circuits 112 each include an amplifier and a horizontal selection switch, for example, provided per each of the vertical signal lines Lsig.

The horizontal driving circuit 113 includes a shift register and an address decoder, for example, to scan and sequentially drive the horizontal selection switches of the column signal processing circuits 112. Through the selective scanning performed by the horizontal driving circuit 113, the signals outputted from the pixels, which are transmitted via the vertical signal lines Lsig, are respectively sequentially outputted to a horizontal signal line 121, and then transmitted to an external device, for example, outside the semiconductor substrate 30 via the horizontal signal line 121.

The output circuit 114 performs signal processing on the signals respectively sequentially supplied from the column signal processing circuits 112 via the horizontal signal line 121 and outputs the signals having undergone the signal processing. The output circuit 114 may perform buffering only or may perform black level adjustment, column variation correction, and various types of digital signal processing, for example.

A circuit section including the vertical driving circuit 111, the column signal processing circuits 112, the horizontal driving circuit 113, the horizontal signal line 121, and the output circuit 114 may be directly formed on the semiconductor substrate 30 or may be disposed in an external control integrated circuit (IC). Furthermore, the circuit section may be formed on another substrate coupled by cables, for example.

The control circuit 115 receives data regarding clocks and data instructing an operation mode from an external device outside the semiconductor substrate 30, for example. The control circuit 115 further outputs data such as internal information of the imaging machine 100. The control circuit 115 further includes a timing generator that generates various types of timing signals to perform drive control on the peripheral circuits including the vertical driving circuit 111, the column signal processing circuits 112, and the horizontal driving circuit 113 on the basis of the various types of timing signals generated in the timing generator.

The input-and-output terminal 116 is used to exchange signals with an external device, for example.

Application Example 2

Furthermore, it is possible to apply the imaging machine 100 described above in various types of electronic apparatuses including, for example, imaging systems including digital still cameras and digital video cameras, mobile phones equipped with an imaging function, and other apparatuses each equipped with an imaging function.

FIG. 22 is a block diagram illustrating an example of a configuration of an electronic apparatus 1000.

As illustrated in FIG. 22, the electronic apparatus 1000 includes an optical system 1001, the imaging machine 100, and a digital signal processor (DSP) 1002. The electronic apparatus 1000 is coupled with, via a bus 1008, the DSP 1002, a memory 1003, a display 1004, a recorder 1005, a maneuver system 1006, and a power supply system 1007. The electronic apparatus 1000 is thus able to capture still images and videos.

The optical system 1001 includes one or a plurality of lenses, takes up incident light (image light) from an object, and forms an image on the imaging surface of the imaging machine 100.

As the imaging machine 100, the imaging machine 100 described above is applied. The imaging machine 100 converts an amount of light of the incident light formed into an image on the imaging surface of the optical system 1001 into an electric signal in pixel unit and supplies the converted electric signal to the DSP 1002 as a pixel signal.

The DSP 1002 performs various types of signal processing on the signal outputted from the imaging machine 100, acquires an image, and causes the memory 1003 to temporarily store data of the image. The data of the image, which is stored in the memory 1003, may be recorded in the recorder 1005 or may be supplied to the display 1004 to allow the image to be displayed. Furthermore, the maneuver system 1006 receives various types of maneuvers by a user and supplies a maneuver signal to blocks of the electronic apparatus 1000. The power supply system 1007 supplies electric power necessary for driving the blocks of the electronic apparatus 1000.

Application Example 3

FIG. 23A schematically illustrates an example of an entire configuration of an optical detection system 2000 equipped with the imaging machine 100. FIG. 23B illustrates an example of a circuit configuration of the optical detection system 2000. The optical detection system 2000 includes a light emitting machine 2001 serving as a light source that emits infrared light L2 and a light detection machine 2002 serving as a light receiver including photoelectric conversion devices. As the light detection machine 2002, it is possible to use the imaging machine 100 described above. The optical detection system 2000 may further include a system controller 2003, a light source driver 2004, a sensor controller 2005, a light source side optical system 2006, and a camera side optical system 2007.

The light detection machine 2002 is able to detect light L1 and the light L2. The light L1 represents reflected light by an object (measurement target) 2100 (FIG. 23A) of ambient light entered from outside. The light L2 represents reflected light by the object 2100 of light emitted by the light emitting machine 2001. The light L1 is visible light, for example. The light L2 is infrared light, for example. It is possible to detect the light L1 in the photoelectric converters in the light detection machine 2002. It is possible to detect the light L2 in the photoelectric conversion regions in the light detection machine 2002. It is possible to acquire image information of the object 2100 from the light L1 and to acquire information of a distance between the object 2100 and the optical detection system 2000 from the light L2. It is possible to mount the optical detection system 2000, for example, in an electronic apparatus such as a smart phone or a movable body such as a vehicle. It is possible to construct the light emitting machine 2001 with a semiconductor laser, a surface emitting semiconductor laser, or a vertical cavity type surface emitting laser (VCSEL), for example. As a method of detecting, by the light detection machine 2002, the light L2 emitted from the light emitting machine 2001, it is possible to adopt, but not limited to, an iTOF method, for example. With the iTOF method, it is possible to measure, using the photoelectric converters, a distance to the object 2100 based on a time-of-flight (TOF), for example. As a method of detecting, by the light detection machine 2002, the light L2 emitted from the light emitting machine 2001, it is possible to adopt a structured light method or a stereo vision method, for example. With the structured light method, for example, it is possible to measure a distance between the optical detection system 2000 and the object 2100 by projecting light having a pattern determined beforehand onto the object 2100 and analyzing how much the pattern is distorted. Furthermore, with the stereo vision method, for example, it is possible to measure a distance between the optical detection system 2000 and the object by using two or more cameras, seeing the object 2100 at two or more different points of view, and acquiring two or more images. Note that the system controller 2003 allows the light emitting machine 2001 and the light detection machine 2002 to be controlled in a synchronization manner.

4. Practical Examples

Practical Example to Endoscopic Surgery System

It is possible to apply the technique according to the present disclosure (the present technique) to various types of products. For example, the technique according to the present disclosure may be applied to an endoscopic surgery system.

FIG. 24 is a view depicting an example of a schematic configuration of an endoscopic surgery system to which the technology according to an embodiment of the present disclosure (present technology) can be applied.

In FIG. 24, a state is illustrated in which a surgeon (medical doctor) 11131 is using an endoscopic surgery system 11000 to perform surgery for a patient 11132 on a patient bed 11133. As depicted, the endoscopic surgery system 11000 includes an endoscope 11100, other surgical tools 11110 such as a pneumoperitoneum tube 11111 and an energy device 11112, a supporting arm apparatus 11120 which supports the endoscope 11100 thereon, and a cart 11200 on which various apparatus for endoscopic surgery are mounted.

The endoscope 11100 includes a lens barrel 11101 having a region of a predetermined length from a distal end thereof to be inserted into a body cavity of the patient 11132, and a camera head 11102 connected to a proximal end of the lens barrel 11101. In the example depicted, the endoscope 11100 is depicted which includes as a rigid endoscope having the lens barrel 11101 of the hard type. However, the endoscope 11100 may otherwise be included as a flexible endoscope having the lens barrel 11101 of the flexible type.

The lens barrel 11101 has, at a distal end thereof, an opening in which an objective lens is fitted. A light source apparatus 11203 is connected to the endoscope 11100 such that light generated by the light source apparatus 11203 is introduced to a distal end of the lens barrel 11101 by a light guide extending in the inside of the lens barrel 11101 and is irradiated toward an observation target in a body cavity of the patient 11132 through the objective lens. It is to be noted that the endoscope 11100 may be a forward-viewing endoscope or may be an oblique-viewing endoscope or a side-viewing endoscope.

An optical system and an image pickup element are provided in the inside of the camera head 11102 such that reflected light (observation light) from the observation target is condensed on the image pickup element by the optical system. The observation light is photo-electrically converted by the image pickup element to generate an electric signal corresponding to the observation light, namely, an image signal corresponding to an observation image. The image signal is transmitted as RAW data to a CCU 11201.

The CCU 11201 includes a central processing unit (CPU), a graphics processing unit (GPU) or the like and integrally controls operation of the endoscope 11100 and a display apparatus 11202. Further, the CCU 11201 receives an image signal from the camera head 11102 and performs, for the image signal, various image processes for displaying an image based on the image signal such as, for example, a development process (demosaic process).

The display apparatus 11202 displays thereon an image based on an image signal, for which the image processes have been performed by the CCU 11201, under the control of the CCU 11201.

The light source apparatus 11203 includes a light source such as, for example, a light emitting diode (LED) and supplies irradiation light upon imaging of a surgical region to the endoscope 11100.

An inputting apparatus 11204 is an input interface for the endoscopic surgery system 11000. A user can perform inputting of various kinds of information or instruction inputting to the endoscopic surgery system 11000 through the inputting apparatus 11204. For example, the user would input an instruction or a like to change an image pickup condition (type of irradiation light, magnification, focal distance or the like) by the endoscope 11100.

A treatment tool controlling apparatus 11205 controls driving of the energy device 11112 for cautery or incision of a tissue, sealing of a blood vessel or the like. A pneumoperitoneum apparatus 11206 feeds gas into a body cavity of the patient 11132 through the pneumoperitoneum tube 11111 to inflate the body cavity in order to secure the field of view of the endoscope 11100 and secure the working space for the surgeon. A recorder 11207 is an apparatus capable of recording various kinds of information relating to surgery. A printer 11208 is an apparatus capable of printing various kinds of information relating to surgery in various forms such as a text, an image or a graph.

It is to be noted that the light source apparatus 11203 which supplies irradiation light when a surgical region is to be imaged to the endoscope 11100 may include a white light source which includes, for example, an LED, a laser light source or a combination of them. Where a white light source includes a combination of red, green, and blue (RGB) laser light sources, since the output intensity and the output timing can be controlled with a high degree of accuracy for each color (each wavelength), adjustment of the white balance of a picked up image can be performed by the light source apparatus 11203. Further, in this case, if laser beams from the respective RGB laser light sources are irradiated time-divisionally on an observation target and driving of the image pickup elements of the camera head 11102 are controlled in synchronism with the irradiation timings. Then images individually corresponding to the R, G and B colors can be also picked up time-divisionally. According to this method, a color image can be obtained even if color filters are not provided for the image pickup element.

Further, the light source apparatus 11203 may be controlled such that the intensity of light to be outputted is changed for each predetermined time. By controlling driving of the image pickup element of the camera head 11102 in synchronism with the timing of the change of the intensity of light to acquire images time-divisionally and synthesizing the images, an image of a high dynamic range free from underexposed blocked up shadows and overexposed highlights can be created.

Further, the light source apparatus 11203 may be configured to supply light of a predetermined wavelength band ready for special light observation. In special light observation, for example, by utilizing the wavelength dependency of absorption of light in a body tissue to irradiate light of a narrow band in comparison with irradiation light upon ordinary observation (namely, white light), narrow band observation (narrow band imaging) of imaging a predetermined tissue such as a blood vessel of a superficial portion of the mucous membrane or the like in a high contrast is performed. Alternatively, in special light observation, fluorescent observation for obtaining an image from fluorescent light generated by irradiation of excitation light may be performed. In fluorescent observation, it is possible to perform observation of fluorescent light from a body tissue by irradiating excitation light on the body tissue (autofluorescence observation) or to obtain a fluorescent light image by locally injecting a reagent such as indocyanine green (ICG) into a body tissue and irradiating excitation light corresponding to a fluorescent light wavelength of the reagent upon the body tissue. The light source apparatus 11203 can be configured to supply such narrow-band light and/or excitation light suitable for special light observation as described above.

FIG. 25 is a block diagram depicting an example of a functional configuration of the camera head 11102 and the CCU 11201 depicted in FIG. 24.

The camera head 11102 includes a lens unit 11401, an image pickup unit 11402, a driving unit 11403, a communication unit 11404 and a camera head controlling unit 11405. The CCU 11201 includes a communication unit 11411, an image processing unit 11412 and a control unit 11413. The camera head 11102 and the CCU 11201 are connected for communication to each other by a transmission cable 11400.

The lens unit 11401 is an optical system, provided at a connecting location to the lens barrel 11101. Observation light taken in from a distal end of the lens barrel 11101 is guided to the camera head 11102 and introduced into the lens unit 11401. The lens unit 11401 includes a combination of a plurality of lenses including a zoom lens and a focusing lens.

The number of image pickup elements which is included by the image pickup unit 11402 may be one (single-plate type) or a plural number (multi-plate type). Where the image pickup unit 11402 is configured as that of the multi-plate type, for example, image signals corresponding to respective R, G and B are generated by the image pickup elements, and the image signals may be synthesized to obtain a color image. The image pickup unit 11402 may also be configured so as to have a pair of image pickup elements for acquiring respective image signals for the right eye and the left eye ready for three dimensional (3D) display. If 3D display is performed, then the depth of a living body tissue in a surgical region can be comprehended more accurately by the surgeon 11131. It is to be noted that, where the image pickup unit 11402 is configured as that of stereoscopic type, a plurality of systems of lens units 11401 are provided corresponding to the individual image pickup elements.

Further, the image pickup unit 11402 may not necessarily be provided on the camera head 11102. For example, the image pickup unit 11402 may be provided immediately behind the objective lens in the inside of the lens barrel 11101.

The driving unit 11403 includes an actuator and moves the zoom lens and the focusing lens of the lens unit 11401 by a predetermined distance along an optical axis under the control of the camera head controlling unit 11405. Consequently, the magnification and the focal point of a picked up image by the image pickup unit 11402 can be adjusted suitably.

The communication unit 11404 includes a communication apparatus for transmitting and receiving various kinds of information to and from the CCU 11201. The communication unit 11404 transmits an image signal acquired from the image pickup unit 11402 as RAW data to the CCU 11201 through the transmission cable 11400.

In addition, the communication unit 11404 receives a control signal for controlling driving of the camera head 11102 from the CCU 11201 and supplies the control signal to the camera head controlling unit 11405. The control signal includes information relating to image pickup conditions such as, for example, information that a frame rate of a picked up image is designated, information that an exposure value upon image picking up is designated and/or information that a magnification and a focal point of a picked up image are designated.

It is to be noted that the image pickup conditions such as the frame rate, exposure value, magnification or focal point may be designated by the user or may be set automatically by the control unit 11413 of the CCU 11201 on the basis of an acquired image signal. In the latter case, an auto exposure (AE) function, an auto focus (AF) function and an auto white balance (AWB) function are incorporated in the endoscope 11100.

The camera head controlling unit 11405 controls driving of the camera head 11102 on the basis of a control signal from the CCU 11201 received through the communication unit 11404.

The communication unit 11411 includes a communication apparatus for transmitting and receiving various kinds of information to and from the camera head 11102. The communication unit 11411 receives an image signal transmitted thereto from the camera head 11102 through the transmission cable 11400.

Further, the communication unit 11411 transmits a control signal for controlling driving of the camera head 11102 to the camera head 11102. The image signal and the control signal can be transmitted by electrical communication, optical communication or the like.

The image processing unit 11412 performs various image processes for an image signal in the form of RAW data transmitted thereto from the camera head 11102.

The control unit 11413 performs various kinds of control relating to image picking up of a surgical region or the like by the endoscope 11100 and display of a picked up image obtained by image picking up of the surgical region or the like. For example, the control unit 11413 creates a control signal for controlling driving of the camera head 11102.

Further, the control unit 11413 controls, on the basis of an image signal for which image processes have been performed by the image processing unit 11412, the display apparatus 11202 to display a picked up image in which the surgical region or the like is imaged. Thereupon, the control unit 11413 may recognize various objects in the picked up image using various image recognition technologies. For example, the control unit 11413 can recognize a surgical tool such as forceps, a particular living body region, bleeding, mist when the energy device 11112 is used and so forth by detecting the shape, color and so forth of edges of objects included in a picked up image. The control unit 11413 may cause, when it controls the display apparatus 11202 to display a picked up image, various kinds of surgery supporting information to be displayed in an overlapping manner with an image of the surgical region using a result of the recognition. Where surgery supporting information is displayed in an overlapping manner and presented to the surgeon 11131, the burden on the surgeon 11131 can be reduced and the surgeon 11131 can proceed with the surgery with certainty.

The transmission cable 11400 which connects the camera head 11102 and the CCU 11201 to each other is an electric signal cable ready for communication of an electric signal, an optical fiber ready for optical communication or a composite cable ready for both of electrical and optical communications.

Here, while, in the example depicted, communication is performed by wired communication using the transmission cable 11400, the communication between the camera head 11102 and the CCU 11201 may be performed by wireless communication.

The example of the endoscopic surgery system to which it is possible to apply the technology according to the present disclosure has been described. The technique according to the present disclosure may be applied to the image pickup unit 11402, among the components described above. With the image pickup unit 11402 applied with the technique according to the present disclosure, detection accuracy is improved.

Note that, although the endoscopic surgery system has been described in here as one example, the technology according to the present disclosure may be applied to other systems such as microscopic surgery systems.

Practical Example to Movable Body

It is possible to apply the technology according to the present disclosure to various types of products. For example, the technology according to the present disclosure may be achieved as a device mounted in any types of movable bodies including vehicles, electric vehicles, hybrid electric vehicles, motorcycles, bicycles, personal mobilities, airplanes, drones, ships and vessels, robots, construction machines, and agricultural machines (tractors).

FIG. 26 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 26, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automated driving, which makes the vehicle to travel automatedly without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 26, an audio speaker 12061, a display section 12062, and an instrument panel 12063 are illustrated as the output device. The display section 12062 may, for example, include at least one of an on-board display and a head-up display.

FIG. 27 is a diagram depicting an example of the installation position of the imaging section 12031.

In FIG. 27, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 27 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automated driving that makes the vehicle travel automatedly without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

The example of the movable body control system to which it is possible to apply the technology according to the present disclosure has been described. The technique according to the present disclosure may be applied to the imaging section 12031, among the components described above. Specifically, it is possible to apply one of the imaging devices according to the embodiment and the modification examples described above (for example, the imaging device 1A) to the imaging section 12031. By applying the technique according to the present disclosure to the imaging section 12031, it is possible to capture finer images with less noise, making it possible to perform highly accurate control in the movable body control system by utilizing the captured images.

5. Implementation Examples

Next, implementation examples of the present disclosure will now be described herein.

Experiment 1

In Experiment 1, the second layer 12B of the hole block layer 12 was formed as a mixed film including fullerenes (fullerenes $C_{60}$), and dark current characteristics, external quantum efficiency, and after-image characteristics were evaluated.

Experiment Example 1-1

A sputtering machine was first used to form an ITO film having a thickness of 100 nm on a silicon substrate. Photolithography and etching were used to process the film to form the lower electrode 11. Next, an insulating film was formed on the silicon substrate and the lower electrode 11. Lithography and etching were used to form a square opening having a side length of 1 mm allowing the lower electrode 11 to be exposed. Next, the silicon substrate was washed using an UV/ozone treatment. The silicon substrate was brought into a vacuum deposition machine. The deposition chamber was decompressed to a pressure equal to or lower than $1\times10^{-5}$ Pa. In this state, the substrate holder was continuously rotated. The hole block layer 12 (the first layer 12A and the second layer 12B), the photoelectric conversion layer 13, the electron block layer 14, and the work function adjustment layer 15 were sequentially formed on the lower electrode 11. Specifically, the naphthalenediimide (NDI) derivative illustrated in Chemical Formula (1-27) described above was formed at a substrate temperature of 40° C. to have a thickness of 10 nm to serve as the first layer 12A. Next, the subphthalocyanine derivative illustrated in Chemical Formula (3-5) described above and fullerenes $C_{60}$ illustrated in Chemical Formula (2) described above were formed at a substrate temperature of 40° C. with film-forming rates of 1.0 Å/sec. and 0.250 Å/sec. respectively to have a thickness of 10 nm to serve as the second layer 12B. Next, the subphthalocyanine derivative illustrated in Chemical Formula (3-5) described above, DPh-BTBT illustrated in Chemical Formula (4) described below, and fullerenes $C_{60}$ illustrated in Chemical Formula (2) described above were formed at a substrate temperature of 40° C. with film-forming rates of 0.50 Å/sec., 0.50 Å/sec., and 0.25 Å/sec. respectively to have a thickness of 230 nm to serve as the photoelectric conversion layer 13. Next, PC-IC illustrated in Chemical Formula (5) described below was formed at a substrate temperature of 0° C. to have a thickness of 10 nm to serve as the electron block layer 14. Next, HAT-CN illustrated in Chemical Formula (6) described below was formed to have a thickness of 10 nm to serve as the work function adjustment layer 15. Finally, the silicon substrate was brought into the sputtering machine. An ITO film having a thickness of 50 nm was formed on the work function adjustment layer 15 to serve as the upper electrode 16. After that, under a nitrogen atmosphere, the silicon substrate was allowed to undergo annealing at a temperature of 150° C. for 210 minutes to serve as a device to be evaluated.

[Chemical Formula 6]

(4)

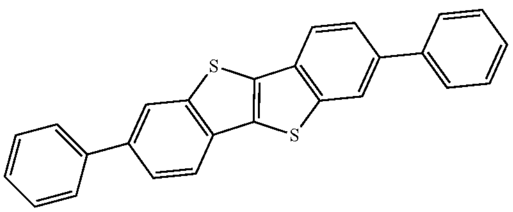

-continued (5)

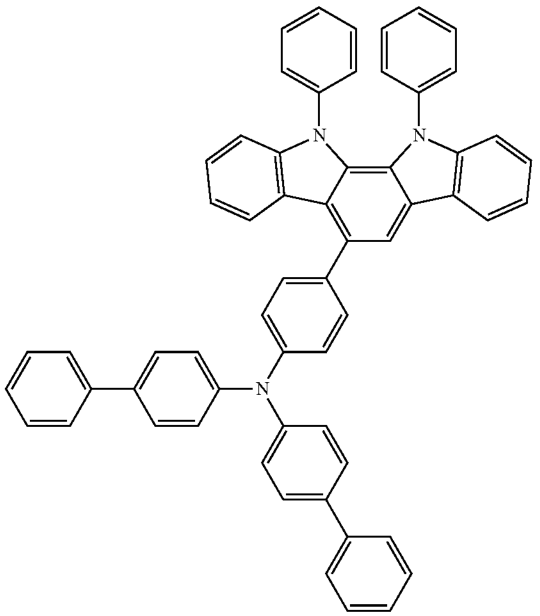

(6)

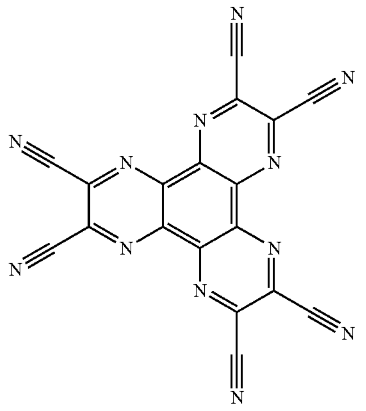

Experiment Example 1-2

A device to be evaluated was produced by using a method similar to the method used in Experiment Example 1-1, excluding that the second layer 12B formed in Experiment Example 1-1 was omitted.

Experiment Example 1-3

A device to be evaluated was produced by using a method similar to the method used in Experiment Example 1-1, excluding that the first layer 12A formed in Experiment Example 1-1 was omitted.

Evaluation of Dark Current and External Quantum Efficiency

A wavelength of light to be emitted from a green light-emitting diode (LED) light source to a device to be evaluated via a bandpass filter was set to 560 nm. An amount of light was set to 1.62 $\mu W/cm^2$. A bias voltage to be applied between the electrodes of the device to be evaluated was controlled by using a semiconductor parameter analyzer. A voltage applied to the lower electrode 11 with respect to the upper electrode 16 was swept. A current-voltage curve was thus acquired. In a reverse bias applied state (a state where a voltage of +2.6V was applied), a dark current value and a light current value were acquired. The dark current value was subtracted from the light current value. The resultant value was divided by the number of incident photons. The external quantum efficiency (EQE) was thus calculated.

Evaluation of After-Image Amount

A wavelength of light to be emitted from the green LED light source to the photoelectric conversion device via the bandpass filter was set to 560 nm. An amount of light was set to 162 $\mu W/cm^2$. A voltage to be applied to an LED driver was controlled with a function generator. Pulsed light having a pulse width of 100 ms was emitted from the side of the upper electrode 16. As to a bias voltage to be applied between the electrodes of the device to be evaluated, a voltage of +2.6V was applied to the lower electrode 11 with respect to the upper electrode 16. In the voltage applied state, pulsed light was emitted. An oscilloscope was used to observe a waveform of how an electric current was attenuated. Meanwhile the current was attenuated after 110 ms from immediately after stopping light pulses being emitted, a coulomb amount was measured. The measured coulomb amount was used as an index for an after-image amount. It means that the smaller the after-image amount, the higher the photo-responsiveness.

TABLE 1

| | Hole block layer 1 | Hole block layer 2 | Dark current ($A/cm^2$) | EQE (%) | After-image amount (a.u.) |
|---|---|---|---|---|---|
| Experiment Example 1-1 | (1-27) | (2), (3-5) | 1.0 | 1.0 | 1.0 |
| Experiment Example 1-2 | (1-27) | — | 7.7 | 1.0 | 1.6 |
| Experiment Example 1-3 | — | (2), (3-5) | 4.5 | 0.96 | 0.94 |

Table 1 summarizes the configurations and the device characteristics (dark current, EQE, and after-image amount) of the hole block layers 12 according to Experiment Examples 1-1 to 1-3. Note that the values of dark current, EQE, and after-image amount summarized in Table 1 represent relative values in a case where the characteristic values in Experiment Example 1-1 were designated as reference values (1.0).

Experiment Example 1-1 has indicated a lower dark current, an equivalent level of EQE, and a smaller after-image amount, compared with Experiment Example 1-2. A conceivable reason of why a higher dark current was observed in Experiment Example 1-2 is that suppression of occurrence of a dark current at the interface between the hole block layer 1 (the first layer 12A) and the photoelectric conversion layer 13 was not sufficient, compared with Experiment Example 1-1. Furthermore, a conceivable reason of why an after-image amount was increased in Experiment Example 1-2 is that suppression of a trap at the interface between the hole block layer 1 and the photoelectric conversion layer 13 was not sufficient, compared with Experiment Example 1-1.

Experiment Example 1-1 has indicated a lower dark current, a superior level of EQE, and an equivalent after-image amount, compared with Experiment Example 1-3. A conceivable reason of why a higher dark current was observed in Experiment Example 1-3 is that the HOMO in the hole block was shallower by 0.9 eV, with respect to the work function of the lower electrode 11, and suppression of entry of holes from the lower electrode 11 was not sufficient, compared with Experiment Example 1-1. Furthermore, a conceivable reason of why EQE was lowered in Experiment Example 1-3 is that there was an electron barrier at the interface between the lower electrode 11 and the hole block, compared with Experiment Example 1-1.

Furthermore, in Experiment Example 1-1, conceivable effects of why entry of holes from the lower electrode 11 was suppressed are that the hole block layer 1 was disposed on the side that is in contact with the lower electrode 11, and conceivable effects of why occurrence of a dark current was suppressed at the interface with the photoelectric conversion layer 13 are that the hole block layer 2 (the second layer 12B) was disposed on the side that is in contact with the photoelectric conversion layer 13. Furthermore, a conceivable reason of why higher EQE was observed is that the hole block layer 1 was disposed on the side that is in contact with the lower electrode 11, reducing an electron barrier at the interface between the lower electrode 11 and the hole block layer 1. Furthermore, a conceivable reason of why a lower after-image amount was observed is that the hole block layer 2 was disposed on the side of the photoelectric conversion layer 13, suppressing a trap at the interface between the hole block layer 2 and the photoelectric conversion layer 13.

Note that a conceivable reason of why an electron barrier at the interface between the lower electrode 11 and the hole block layer 1 was reduced by disposing the hole block layer 1 on the side that is in contact with the lower electrode 11 is that, as the hole block layer 1 is joined to the lower electrode 11, an interface dipole was occurred, the Fermi level, i.e., the vacuum level, of the lower electrode 11 was shifted in a positive potential direction, a potential slope when the voltage was applied became advantageous for extracting electrons, and an apparent electron barrier from the LUMO of the hole block layer 1 to the Fermi level of the lower electrode 11 was reduced.

Experiment 2

In Experiment 2, the second layer 12B of the hole block layer 12 was formed as a single layer film including fullerenes (fullerenes $C_{60}$), and dark current characteristics, external quantum efficiency, and after-image characteristics were evaluated. Note that, from Experiment 1 to Experiment 2, the voltage to be applied was changed. Specifically, the dark current characteristics were acquired in a state where the applied voltage was−2.6V. The external quantum efficiency was acquired in a state where the applied voltage was 0V. The after-image characteristics were acquired in a state where the applied voltage was −2.6V.

Experiment Example 2-1

A sputtering machine was first used to form an ITO film having a thickness of 100 nm on a silicon substrate. Photolithography and etching were used to process the film to form the lower electrode 11. Next, an insulating film was formed on the silicon substrate and the lower electrode 11. Lithography and etching were used to form a square opening having a side length of 1 mm allowing the lower electrode 11 to be exposed. Next, the silicon substrate was washed using an UV/ozone treatment. The silicon substrate was brought into a vacuum deposition machine. The deposition chamber was decompressed to a pressure equal to or lower than $1\times10^{-5}$ Pa. In this state, the substrate holder was continuously rotated. The electron block layer 14, the photoelectric conversion layer 13, and the hole block layer 12 (the first layer 12A and the second layer 12B) were sequentially formed on the lower electrode 11. Specifically, PC-IC illustrated in Chemical Formula (5) described above was formed at a substrate temperature of 0° C. to have a thickness of 10 nm to serve as the electron block layer 14. Next, the subphthalocyanine derivative illustrated in Chemical Formula (3-5) described above, DPh-BTBT illustrated in Chemical Formula (4) described above, and fullerenes $C_{60}$ illustrated in Chemical Formula (2) were formed at a substrate temperature of 40° C. with film-forming rates of 0.50 Å/sec., 0.50 Å/sec., and 0.25 Å/sec. respectively to have a thickness of 230 nm to serve as the photoelectric conversion layer 13. Next, fullerenes $C_{60}$ illustrated in Chemical Formula (2) were formed at a substrate temperature of 0° C. to have a thickness of 10 nm to serve as the second layer 12B. Next, the naphthalenediimide (NDI) derivative illustrated in Chemical Formula (1-23) described above was formed at a substrate temperature of 0° C. to have a thickness of 10 nm to serve as the first layer 12A. Finally, the silicon substrate was brought into the sputtering machine. An ITO film having a thickness of 50 nm was formed on the first layer 12A to serve as the upper electrode 16. After that, under a nitrogen atmosphere, the silicon substrate was allowed to undergo annealing at a temperature of 150° C. for 210 minutes to serve as a device to be evaluated.

Experiment Example 2-2

A device to be evaluated was produced by using a method similar to the method used in Experiment Example 2-1, excluding that the second layer 12B formed in Experiment Example 2-1 was omitted.

Experiment Example 2-3

A device to be evaluated was produced by using a method similar to the method used in Experiment Example 2-1, excluding that DPh-BTBT used in the photoelectric conversion layer 13 formed in Experiment Example 2-1 was changed to BP-rBDT illustrated in Chemical Formula (7) described below.

[Chemical Formula 7]

(7)

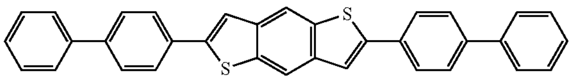

Experiment Example 2-4

A device to be evaluated was produced by using a method similar to the method used in Experiment Example 2-3, excluding that the second layer 12B formed in Experiment Example 2-3 was omitted.

TABLE 2

| | Hole block layer 1 | Hole block layer 2 | Photoelectric conversion layer | Dark current ($A/cm^2$) | EQE (%) | After-image amount (a.u.) |
|---|---|---|---|---|---|---|
| Experiment Example 2-1 | (1-23) | (2) | (4):(3-5):(2) = 40:40:20 | 1.0 | 1.0 | 1.0 |
| Experiment Example 2-2 | (1-23) | — | (4):(3-5):(2) = 40:40:20 | 1.38 | 0.98 | 1.29 |
| Experiment Example 2-3 | (1-23) | (2) | (7):(3-5):(2) = 40:40:20 | 1.0 | 1 | 1.0 |
| Experiment Example 2-4 | (1-23) | — | (7):(3-5):(2) = 40:40:20 | 1.45 | 0.87 | 1.53 |

Table 2 summarizes the configuration and the device characteristics (dark current, EQE, and after-image amount) of the hole block layers 12 according to Experiment Examples 2-1 to 2-4. Note that the values of dark current, EQE, and after-image amount summarized in Table 1 represent relative values in a case where the characteristic values in Experiment Examples 2-1 and 2-3 were designated as reference values (1.0).

Experiment Example 2-1 has indicated a lower dark current, a higher level of EQE, and a smaller after-image amount, compared with Experiment Example 2-2. A conceivable reason of why a higher dark current was observed in Experiment Example 2-2 is that suppression of occurrence of a dark current at the interface between the hole block layer 1 (the first layer 12A) and the photoelectric conversion layer 13 was not sufficient, compared with Experiment Example 2-1. Furthermore, a conceivable reason of why EQE was lowered in Experiment Example 2-2 is that there was an electron barrier at the interface between the hole block layer 1 and the photoelectric conversion layer 13, compared with Experiment Example 2-1. Furthermore, a conceivable reason of why an after-image amount was increased in Experiment Example 2-2 is that suppression of a trap at the interface between the hole block layer 1 and the photoelectric conversion layer 13 was not sufficient, compared with Experiment Example 2-1.

Experiment Example 2-3 has indicated a lower dark current, a higher level of EQE, and a smaller after-image amount, compared with Experiment Example 2-4. A conceivable reason of why a higher dark current was observed in Experiment Example 2-4 is that suppression of occurrence of a dark current at the interface between the hole block layer 1 and the photoelectric conversion layer 13 was not sufficient, compared with Experiment Example 2-3. Furthermore, a conceivable reason of why EQE was lowered in Experiment Example 2-4 is that there was an electron barrier at the interface between the hole block layer 1 and the photoelectric conversion layer 13, compared with Experiment Example 2-3. Furthermore, a conceivable reason of why an after-image amount was increased in Experiment Example 2-4 is that suppression of a trap at the interface between the hole block layer 1 and the photoelectric conversion layer 13 was not sufficient, compared with Experiment Example 2-3.

In Experiment Examples 2-1 and 2-3, conceivable effects of why entry of holes from the upper electrode 16 was suppressed are that the hole block layer 1 was disposed on the side that is in contact with the upper electrode 16, and conceivable effects of why occurrence of a dark current was suppressed at the interface with the photoelectric conversion layer 13 are that the hole block layer 2 (the second layer 12B) was disposed on the side that is in contact with the photoelectric conversion layer 13. Furthermore, a conceivable reason of why a higher level of EQE and a lower after-image amount were observed at a voltage of 0 V is that the hole block layer 2 was disposed on the side of the photoelectric conversion layer 13, suppressing a trap at the interface between the hole block layer 2 and the photoelectric conversion layer 13.

Although the present technique has been described with reference to the embodiment, Modification Examples 1 to 5, the implementation examples, the application examples, and the practical examples, the contents of the present disclosure are not limited to the embodiment and the other examples described above, but may be modified in a wide variety of ways. For example, the embodiment and the other examples described above have illustrated examples where electrons are read from the side of the lower electrode 11 as signal electric charges. However, the present disclosure is not limited to the examples. Holes may be read from the side of the lower electrode 11 as signal electric charges. In such a case, the work function adjustment layer 15 and the electron block layer 14 are laminated with each other in this order from the side of the lower electrode 11 between the lower electrode 11 and the photoelectric conversion layer 13, and the first layer 12A and the second layer 12B forming the hole block layer 12 are formed in this order from the side of the upper electrode 16 between the upper electrode 16 and the photoelectric conversion layer 13. Note that, in this configuration, the work function adjustment layer 15 may be omitted.

Furthermore, in the embodiment described above, the photoelectric converter 10 using an organic material that detects green light (G) and the photoelectric conversion region 32B and the photoelectric conversion region 32R that detect blue light (B) and red light (R) respectively are laminated with each other to serve as the imaging device 1A. However, the contents of the present disclosure are not limited to such a structure as described above. That is, red light (R) or blue light (B) may be detected in a photoelectric converter using an organic material, and green light (G) may be detected in a photoelectric conversion region including an inorganic material.

Furthermore, for such a photoelectric converter using an organic material and a photoelectric conversion region including an inorganic material, there is no limitation in the numbers and the ratio of the photoelectric converters and the photoelectric conversion regions. Furthermore, the present disclosure is not limited to have such a structure that a photoelectric converter using an organic material and a photoelectric conversion region including an inorganic material are laminated with each other in the vertical directions. A photoelectric converter using an organic material and a photoelectric conversion region including an inorganic material may be disposed to be parallel to each other along a substrate surface.

Furthermore, the embodiment and the other examples described above have illustrated the configuration of a rear face irradiation type imaging device. However, it is also possible to apply the contents of the present disclosure to a front surface irradiation type imaging device.

Furthermore, the photoelectric conversion device 10, the imaging device 1A and other imaging devices, and the imaging machine 100 according to the present disclosure may not necessarily include all the components describe above in the embodiment. Contrarily, other components may be included. For example, in the imaging machine 100, a shutter for controlling how much light enters the imaging device 1A may be disposed. An optical cut filter may be provided in accordance with the purpose of the imaging machine 100. Furthermore, instead of the Bayer arrangement, the arrangement of the pixels (Pr, Pg, and Pb) detecting red light (R), green light (G), and blue light (B) respectively may be an interline arrangement, a G stripe RB checker arrangement, a G stripe RB perfect checker arrangement, a checker complementary color arrangement, a stripe arrangement, an inclined stripe arrangement, a fundamental color difference arrangement, a field color difference sequential arrangement, a frame color difference sequential arrangement, a MOS type arrangement, an improved MOS type arrangement, a frame interleave arrangement, or a field interleave arrangement.

Furthermore, the embodiment and the other examples described above have illustrated examples where the photoelectric conversion device 10 is used as an imaging device. However, the photoelectric conversion device 10 according to the present disclosure may be applied to a solar battery. In a case where the present disclosure is applied to a solar battery, it is preferable that the photoelectric conversion layer be designed to absorb light having wavelengths broadly ranging from 400 nm to 800 nm, for example.

Note that the effects described in the specification are mere examples. The effects of the technique are not limited to the effects described in the specification, and may be any other effects than those described herein.

Note that the present technique may have such configurations as described below. According to the present technique having such configurations as described below, the first electric charge block layer including an organic material having the HOMO level that is deeper by 1 eV or higher and the LUMO level ranging from 3.7 eV to 4.8 eV inclusive, with respect to the work function of the first electrode, and the second electric charge block layer including fullerenes or fullerene derivatives are provided between the first electrode and the photoelectric conversion layer in this order from the side of the first electrode. Thereby, entry of electrical charges from the first electrode is to be suppressed, and an electron barrier at an interface with the first electrode is to be reduced. Furthermore, occurrence of a dark current at an interface with the photoelectric conversion layer is suppressed, and occurrence of a trap at the interface with the photoelectric conversion layer is reduced. Therefore, it is possible to improve the device characteristics.

(1)

A photoelectric conversion device including:

a first electrode;

a second electrode disposed to face the first electrode;

a photoelectric conversion layer provided between the first electrode and the second electrode, the photoelectric conversion layer including fullerenes or fullerene derivatives;

a first electric charge block layer provided between the first electrode and the photoelectric conversion layer, the first electric charge block layer including an organic material having an HOMO level that is deeper by 1 eV or higher and an LUMO level ranging from 3.7 eV to 4.8 eV inclusive, with respect to a work function of the first electrode; and a second electric charge block layer provided between the first electric charge block layer and the photoelectric conversion layer, the second electric charge block layer including the fullerenes or the fullerene derivatives.

(2)

The photoelectric conversion device described in (1) above, in which the organic material has a band gap that is equal to or higher than 2.6 eV.

(3)

The photoelectric conversion device described in (1) or (2) above, in which the organic material has the HOMO level that is deeper than 6.3 eV.

(4)

The photoelectric conversion device described in any one of (1) to (3) above, in which the first electric charge block layer has a thickness ranging from 1 nm to 30 nm inclusive.

(5)

The photoelectric conversion device described in any one of (1) to (4) above, in which the second electric charge block layer has a thickness ranging from 1 nm to 30 nm inclusive.

(6)

The photoelectric conversion device described in any one of (1) to (5) above, in which the first electrode has the work function ranging from 4.0 eV to 5.5 eV inclusive, the work function being deeper than the LUMO level of the organic material.

(7)

The photoelectric conversion device described in any one of (1) to (6) above, in which a total state density at or below a level within a gap at an interface between the second electric charge block layer and the photoelectric conversion layer is lower than a total state density at or below a level within a gap in the photoelectric conversion layer.

(8)

The photoelectric conversion device described in any one of (1) to (7) above, in which the second electric charge block layer includes the fullerenes or the fullerene derivatives and the material forming the first electric charge block layer.

(9)

The photoelectric conversion device described in any one of (1) to (8) above, in which the photoelectric conversion layer further includes a pigment material absorbing light falling within a predetermined wavelength region and allowing light falling within another wavelength region to pass through, and the second electric charge block layer includes the fullerenes or the fullerene derivatives and the pigment material.

(10)

The photoelectric conversion device described in any one of (1) to (9) above, in which the first electric charge block layer and the second electric charge block layer are hole block layers.

(11)

The photoelectric conversion device described in any one of (1) to (10) above, in which the first electrode includes a plurality of electrodes that is independent of each other.

(12)

The photoelectric conversion device described in (11) above, in which a voltage is separately applied to each of the plurality of electrodes.

(13)

The photoelectric conversion device described in (11) or (12) above, further including a semiconductor layer including oxide semiconductor between the first electrode and the first electric charge block layer.

(14)

The photoelectric conversion device described in (13), further including an insulation layer between the first electrode and the semiconductor layer, the insulation layer covering the first electrode, the insulation layer having an opening above one electrode among the plurality of electrodes forming the first electrode, the one electrode being electrically coupled to the semiconductor layer via the opening.

(15)

An imaging machine including a plurality of pixels each provided with an imaging device including one or a plurality of photoelectric converters, the one or the plurality of photoelectric converters each including:

a first electrode;

a second electrode disposed to face the first electrode;

a photoelectric conversion layer provided between the first electrode and the second electrode, the photoelectric conversion layer including fullerenes or fullerene derivatives;

a first electric charge block layer provided between the first electrode and the photoelectric conversion layer, the first electric charge block layer including an organic material having an HOMO level that is deeper by 1 eV or higher and an LUMO level ranging from 3.7 eV to 4.8 eV inclusive, with respect to a work function of the first electrode; and a second electric charge block layer provided between the first electric charge block layer and the photoelectric conversion layer, the second electric charge block layer including the fullerenes or the fullerene derivatives.

(16)

The imaging machine described in (15) above, in which the imaging device further includes one or a plurality of photoelectric conversion regions where photoelectric conversion takes place within a wavelength band that differs from a wavelength band of the one or the plurality of photoelectric converters.

(17)

The imaging machine described in (16) above, in which the one or the plurality of photoelectric conversion regions is formed in a buried manner in a semiconductor substrate, and the one or the plurality of photoelectric converters is disposed on a side of a light incident surface of the semiconductor substrate.

(18)

The imaging machine described in (17) above, in which a multi-layered wiring layer is formed on a surface opposite to the light-incident surface of the semiconductor substrate.

The present application claims the benefit of Japanese Priority Patent Application JP 2021-088808 filed with the Japan Patent Office on May 26, 2021, the entire contents of which are incorporated herein by reference.

It should be understood by those skilled in the art that various modifications, combinations, sub-combinations, and alterations may occur depending on design requirements and other factors insofar as they are within the scope of the appended claims or the equivalents thereof.

The invention claimed is:

1. A photoelectric conversion device, comprising:

a first electrode;

a second electrode that faces the first electrode;

a photoelectric conversion layer between the first electrode and the second electrode, wherein the photoelectric conversion layer includes:

fullerenes or fullerene derivatives, and a pigment material that absorbs light that falls within a first wavelength region and allows light that falls within a second wavelength region to pass through;

a first electric charge block layer between the first electrode and the photoelectric conversion layer, wherein the first electric charge block layer includes:

an organic material that has a highest occupied molecular orbital (HOMO) level that is deeper by 1 eV or higher, and a lowest unoccupied molecular orbital (LUMO) level that ranges from 3.7 eV to 4.8 eV inclusive, with respect to a work function of the first electrode; and a second electric charge block layer between the first electric charge block layer and the photoelectric conversion layer, wherein the second electric charge block layer includes the fullerenes or the fullerene derivatives, and the pigment material.

2. The photoelectric conversion device according to claim 1, wherein the organic material has a band gap that is equal to or higher than 2.6 eV.

3. The photoelectric conversion device according to claim 1, wherein the organic material has the HOMO level that is deeper than 6.3 eV.

4. The photoelectric conversion device according to claim 1, wherein the first electric charge block layer has a thickness that ranges from 1 nm to 30 nm inclusive.

5. The photoelectric conversion device according to claim 1, wherein the second electric charge block layer has a thickness that ranges from 1 nm to 30 nm inclusive.

6. The photoelectric conversion device according to claim 1, wherein the first electrode has the work function that ranges from 4.0 eV to 5.5 eV inclusive, and the work function is deeper than the LUMO level of the organic material.

7. The photoelectric conversion device according to claim 1, wherein a first total state density at or below a first level within a first gap at an interface between the second electric charge block layer and the photoelectric conversion layer is lower than a second total state density at or below a second level within a second gap in the photoelectric conversion layer.

8. The photoelectric conversion device according to claim 1, wherein the second electric charge block layer includes the fullerenes or the fullerene derivatives and the organic material of the first electric charge block layer.

9. The photoelectric conversion device according to claim 1, wherein the first electric charge block layer and the second electric charge block layer are hole block layers.

10. The photoelectric conversion device according to claim 1, wherein the first electrode includes a plurality of electrodes that is independent of each other.

11. The photoelectric conversion device according to claim 10, wherein a voltage is separately applied to each of the plurality of electrodes.

12. The photoelectric conversion device according to claim 10, further comprising a semiconductor layer including oxide semiconductor between the first electrode and the first electric charge block layer.

13. The photoelectric conversion device according to claim 12, further comprising an insulation layer between the first electrode and the semiconductor layer, wherein the insulation layer covers the first electrode, the insulation layer includes an opening above one electrode among the plurality of electrodes of the first electrode, and the one electrode is electrically coupled to the semiconductor layer via the opening.

14. An imaging machine, comprising:

a plurality of pixels, wherein each of the plurality of pixels is provided with an imaging device that includes one or a plurality of photoelectric converters, and each of the one or the plurality of photoelectric converters includes:

a first electrode;

a second electrode that faces-disposed to face the first electrode;

a photoelectric conversion layer provided between the first electrode and the second electrode, wherein the photoelectric conversion layer includes:

fullerenes or fullerene derivatives; and a pigment material that absorbs light that falls within a first wavelength region and allows light that falls within a second wavelength region to pass through;

a first electric charge block layer between the first electrode and the photoelectric conversion layer, wherein the first electric charge block layer includes an organic material that has an HOMO level that is deeper by 1 eV or higher and an LUMO level that ranges from 3.7 eV to 4.8 eV inclusive, with respect to a work function of the first electrode; and a second electric charge block layer between the first electric charge block layer and the photoelectric conversion layer, wherein the second electric charge block layer includes the fullerenes or the fullerene derivatives, and the pigment material.

15. The imaging machine according to claim 14, wherein the imaging device further includes one or a plurality of photoelectric conversion regions where photoelectric conversion takes place within a first wavelength band, and the first wavelength band differs from a second wavelength band of the one or the plurality of photoelectric converters.

16. The imaging machine according to claim 15, wherein the one or the plurality of photoelectric conversion regions is in a buried manner in a semiconductor substrate, and the one or the plurality of photoelectric converters is on a side of a light incident surface of the semiconductor substrate.

17. The imaging machine according to claim 16, further comprising a multi-layered wiring layer, wherein the multi-layered wiring layer is on a surface opposite to the light incident surface of the semiconductor substrate.

* * * * *